(12) United States Patent
Kim et al.

(10) Patent No.: US 7,875,963 B1
(45) Date of Patent: Jan. 25, 2011

(54) SEMICONDUCTOR DEVICE INCLUDING LEADFRAME HAVING POWER BARS AND INCREASED I/O

(75) Inventors: Gi Jeong Kim, Guri-si (KR); Yeon Ho Choi, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 226 days.

(21) Appl. No.: 12/276,121

(22) Filed: Nov. 21, 2008

(51) Int. Cl.
*H01L 23/495* (2006.01)

(52) U.S. Cl. ............... 257/670; 257/666; 257/672; 257/674; 257/676; 257/691; 257/E23.031; 257/E23.037; 257/E23.079

(58) Field of Classification Search ......... 257/666–677, 257/691, E23.031–E23.059; 438/111, 112, 438/123, FOR. 366, FOR. 367, FOR. 377, 438/FOR. 380; 361/813
See application file for complete search history.

(56) References Cited

U.S. PATENT DOCUMENTS

| | | | |
|---|---|---|---|
| 2,596,993 A | 5/1952 | Gookin | |
| 3,435,815 A | 4/1969 | Forcier | |
| 3,734,660 A | 5/1973 | Davies et al. | |
| 3,838,984 A | 10/1974 | Crane et al. | |
| 4,054,238 A | 10/1977 | Lloyd et al. | |
| 4,189,342 A | 2/1980 | Kock | |
| 4,221,925 A | 9/1980 | Finley et al. | |
| 4,258,381 A | 3/1981 | Inaba | |
| 4,289,922 A | 9/1981 | Devlin | |
| 4,301,464 A | 11/1981 | Otsuki et al. | |
| 4,332,537 A | 6/1982 | Slepcevic | |
| 4,417,266 A | 11/1983 | Grabbe | |
| 4,451,224 A | 5/1984 | Harding | |
| 4,530,152 A | 7/1985 | Roche et al. | |
| 4,541,003 A | 9/1985 | Otsuka et al. | |

(Continued)

FOREIGN PATENT DOCUMENTS

DE 19734794 A1 8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner*—Jasmine J Clark
(74) *Attorney, Agent, or Firm*—Stetina Brunda Garred & Brucker

(57) ABSTRACT

In accordance with the present invention, there is provided a semiconductor package (e.g., a QFP package) including a uniquely configured leadframe sized and configured to maximize the available number of exposed leads in the semiconductor package. More particularly, the semiconductor package includes a generally planar die pad or die paddle defining multiple peripheral edge segments. In addition, the semiconductor package includes a plurality of leads. Some of these leads include bottom surface portions which, in the completed semiconductor package, are exposed and at least partially circumvent the die pad, with other leads including portions which protrude from respective side surfaces of a package body in the completed semiconductor package. The semiconductor package also includes one or more power bars and/or one or more ground rings which are integral portions of the original leadframe used to fabricate the same.

21 Claims, 44 Drawing Sheets

U.S. PATENT DOCUMENTS

| | | | |
|---|---|---|---|
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson et al. |
| 5,118,298 A | 6/1992 | Murphy |
| 5,122,860 A | 6/1992 | Kichuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,285,352 A | 2/1994 | Pastore et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | LeMaire et al. |
| 5,424,576 A | 6/1995 | Djennas et al. |
| 5,428,248 A | 6/1995 | Cha |
| 5,434,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,467,032 A | 11/1995 | Lee |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,610,437 A * | 3/1997 | Frechette .................. 257/670 |
| 5,625,222 A | 4/1997 | Yoneda et al. |
| 5,633,528 A | 5/1997 | Abbott et al. |
| 5,637,922 A | 6/1997 | Fillion et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasaranthi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,683,943 A | 11/1997 | Yamada |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,767,566 A | 6/1998 | Suda |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,854,511 A | 12/1998 | Shin et al. |
| 5,854,512 A | 12/1998 | Manteghi |
| 5,856,911 A | 1/1999 | Riley |
| 5,859,471 A | 1/1999 | Kuraishi et al. |
| 5,866,939 A | 2/1999 | Shin et al. |
| 5,866,942 A | 2/1999 | Suzuki et al. |
| 5,871,782 A | 2/1999 | Choi |
| 5,874,784 A | 2/1999 | Aoki et al. |
| 5,877,043 A | 3/1999 | Alcoe et al. |

| | | |
|---|---|---|
| 5,886,397 A | 3/1999 | Ewer |
| 5,903,050 A * | 5/1999 | Thurairajaratnam et al. 257/695 |
| 5,973,935 A | 10/1999 | Schoenfeld et al. |
| 5,977,630 A | 11/1999 | Woodworth et al. |
| RE36,773 E | 7/2000 | Nomi et al. |
| 6,107,679 A | 8/2000 | Noguchi |
| 6,143,981 A | 11/2000 | Glenn |
| 6,150,709 A | 11/2000 | Shin et al. |
| 6,157,074 A | 12/2000 | Lee |
| 6,166,430 A | 12/2000 | Yamaguchi |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | McClellan et al. |
| 6,229,205 B1 | 5/2001 | Jeong et al. |
| 6,238,952 B1 | 5/2001 | Lin et al. |
| 6,239,367 B1 | 5/2001 | Hsuan et al. |
| 6,239,384 B1 | 5/2001 | Smith et al. |
| 6,242,281 B1 | 6/2001 | McClellan et al. |
| 6,256,200 B1 | 7/2001 | Lam et al. |
| 6,258,629 B1 | 7/2001 | Niones et al. |
| 6,261,864 B1 | 7/2001 | Jung et al. |
| 6,281,566 B1 | 8/2001 | Magni |
| 6,281,568 B1 | 8/2001 | Glenn et al. |
| 6,282,094 B1 | 8/2001 | Lo et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,306,685 B1 | 10/2001 | Liu et al. |
| 6,307,272 B1 | 10/2001 | Takahashi et al. |
| 6,309,909 B1 | 10/2001 | Ohgiyama |
| 6,316,822 B1 | 11/2001 | Vekateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karmezos et al. |
| 6,335,564 B1 | 1/2002 | Pour |
| 6,337,510 B1 | 1/2002 | Chun-Jen et al. |
| 6,339,252 B1 | 1/2002 | Niones et al. |
| 6,339,255 B1 | 1/2002 | Shin |
| 6,342,730 B1 | 1/2002 | Jung et al. |
| 6,348,726 B1 | 2/2002 | Bayan et al. |
| 6,355,502 B1 | 3/2002 | Kang et al. |
| 6,359,221 B1 | 3/2002 | Yamada et al. |
| 6,362,525 B1 | 3/2002 | Rahim |
| 6,369,447 B2 | 4/2002 | Mori |
| 6,369,454 B1 | 4/2002 | Chung |
| 6,373,127 B1 | 4/2002 | Baudouin et al. |
| 6,377,464 B1 | 4/2002 | Hashemi et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,399,415 B1 | 6/2002 | Bayan et al. |
| 6,400,004 B1 | 6/2002 | Fan et al. |
| 6,410,979 B2 | 6/2002 | Abe |
| 6,414,385 B1 | 7/2002 | Huang et al. |
| 6,420,779 B1 | 7/2002 | Sharma et al. |
| 6,421,013 B1 | 7/2002 | Chung |
| 6,423,643 B1 | 7/2002 | Furuhata et al. |
| 6,429,508 B1 | 8/2002 | Gang |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,459,148 B1 | 10/2002 | Chun-Jen et al. |
| 6,464,121 B2 | 10/2002 | Reijnders |
| 6,465,883 B2 | 10/2002 | Oloffson |
| 6,469,369 B1 * | 10/2002 | Lee .......................... 257/670 |
| 6,472,735 B2 | 10/2002 | Isaak |
| 6,475,646 B2 | 11/2002 | Park et al. |
| 6,476,469 B2 | 11/2002 | Huang et al. |
| 6,476,474 B1 | 11/2002 | Hung |
| 6,482,680 B1 | 11/2002 | Khor et al. |
| 6,483,178 B1 | 11/2002 | Chuang |
| 6,492,718 B2 | 12/2002 | Ohmori |
| 6,495,909 B2 | 12/2002 | Jung et al. |
| 6,498,099 B1 | 12/2002 | McClellan et al. |
| 6,498,392 B2 | 12/2002 | Azuma |
| 6,507,096 B2 | 1/2003 | Gang |
| 6,507,120 B2 | 1/2003 | Lo et al. |
| 6,518,089 B2 | 2/2003 | Coyle |
| 6,525,942 B2 | 2/2003 | Huang et al. |
| 6,528,893 B2 | 3/2003 | Jung et al. |
| 6,534,849 B1 | 3/2003 | Gang |
| 6,545,332 B2 | 4/2003 | Huang |
| 6,545,345 B1 | 4/2003 | Glenn et al. |
| 6,545,348 B1 * | 4/2003 | Takano ...................... 257/691 |
| 6,552,421 B2 | 4/2003 | Kishimoto et al. |
| 6,559,525 B2 | 5/2003 | Huang |
| 6,566,168 B2 | 5/2003 | Gang |
| 6,580,161 B2 | 6/2003 | Kobayakawa |
| 6,583,503 B2 | 6/2003 | Akram et al. |
| 6,585,905 B1 | 7/2003 | Fan et al. |
| 6,603,196 B2 | 8/2003 | Lee et al. |
| 6,624,005 B1 | 9/2003 | DiCaprio et al. |
| 6,627,977 B1 | 9/2003 | Foster |
| 6,630,373 B2 * | 10/2003 | Punzalan et al. ............ 438/123 |
| 6,646,339 B1 | 11/2003 | Ku |
| 6,667,546 B2 | 12/2003 | Huang et al. |
| 6,677,663 B1 | 1/2004 | Ku et al. |
| 6,686,649 B1 | 2/2004 | Mathews et al. |
| 6,696,752 B2 | 2/2004 | Su et al. |
| 6,700,189 B2 | 3/2004 | Shibata |
| 6,713,375 B2 | 3/2004 | Shenoy |
| 6,757,178 B2 | 6/2004 | Okabe et al. |
| 6,800,936 B2 | 10/2004 | Kosemura et al. |
| 6,812,552 B2 | 11/2004 | Islam et al. |
| 6,818,973 B1 | 11/2004 | Foster |
| 6,858,919 B2 | 2/2005 | Seo et al. |
| 6,867,492 B2 | 3/2005 | Auburger et al. |
| 6,876,068 B1 | 4/2005 | Lee et al. |
| 6,878,571 B2 | 4/2005 | Isaak et al. |
| 6,897,552 B2 | 5/2005 | Nakao |
| 6,927,478 B2 | 8/2005 | Paek |
| 6,967,125 B2 | 11/2005 | Fee et al. |
| 6,995,459 B2 | 2/2006 | Lee et al. |
| 7,002,805 B2 | 2/2006 | Lee et al. |
| 7,005,327 B2 | 2/2006 | Kung et al. |
| 7,015,571 B2 | 3/2006 | Chang et al. |
| 7,045,396 B2 | 5/2006 | Crowley et al. |
| 7,053,469 B2 | 5/2006 | Koh et al. |

| | | | | | | |
|---|---|---|---|---|---|---|
| 7,075,816 | B2 | 7/2006 | Fee et al. | JP | 629639 | 1/1987 |
| 7,102,209 | B1 | 9/2006 | Bayan et al. | JP | 6333854 | 2/1988 |
| 7,109,572 | B2 | 9/2006 | Fee et al. | JP | 63067762 | 3/1988 |
| 7,185,426 | B1 | 3/2007 | Hiner et al. | JP | 63188964 | 8/1988 |
| 7,193,298 | B2 | 3/2007 | Hong et al. | JP | 63205935 | 8/1988 |
| 7,211,471 | B1 | 5/2007 | Foster | JP | 63233555 | 9/1988 |
| 7,245,007 | B1 | 7/2007 | Foster | JP | 63249345 | 10/1988 |
| 7,253,503 | B1 | 8/2007 | Fusaro et al. | JP | 63289951 | 11/1988 |
| 7,737,537 | B2 * | 6/2010 | Bemmerl et al. ............ 257/670 | JP | 63316470 | 12/1988 |
| 2001/0008305 | A1 | 7/2001 | McClellan et al. | JP | 64054749 | 3/1989 |
| 2001/0014538 | A1 | 8/2001 | Kwan et al. | JP | 1106456 | 4/1989 |
| 2002/0011654 | A1 | 1/2002 | Kimura | JP | 1175250 | 7/1989 |
| 2002/0024122 | A1 | 2/2002 | Jung et al. | JP | 1205544 | 8/1989 |
| 2002/0027297 | A1 | 3/2002 | Ikenaga et al. | JP | 1251747 | 10/1989 |
| 2002/0038873 | A1 | 4/2002 | Hiyoshi | JP | 2129948 | 5/1990 |
| 2002/0072147 | A1 | 6/2002 | Sayanagi et al. | JP | 369248 | 7/1991 |
| 2002/0111009 | A1 | 8/2002 | Huang et al. | JP | 3177060 | 8/1991 |
| 2002/0140061 | A1 | 10/2002 | Lee | JP | 3289162 | 12/1991 |
| 2002/0140068 | A1 | 10/2002 | Lee et al. | JP | 4098864 | 3/1992 |
| 2002/0140081 | A1 | 10/2002 | Chou et al. | JP | 5129473 | 5/1993 |
| 2002/0158318 | A1 | 10/2002 | Chen | JP | 5166992 | 7/1993 |
| 2002/0163015 | A1 | 11/2002 | Lee et al. | JP | 5283460 | 10/1993 |
| 2002/0167060 | A1 | 11/2002 | Buijsman et al. | JP | 6061401 | 3/1994 |
| 2003/0006055 | A1 | 1/2003 | Chien-Hung et al. | JP | 692076 | 4/1994 |
| 2003/0030131 | A1 | 2/2003 | Lee et al. | JP | 6140563 | 5/1994 |
| 2003/0059644 | A1 | 3/2003 | Datta et al. | JP | 652333 | 9/1994 |
| 2003/0064548 | A1 | 4/2003 | Isaak | JP | 6252333 | 9/1994 |
| 2003/0073265 | A1 | 4/2003 | Hu et al. | JP | 6260532 | 9/1994 |
| 2003/0102537 | A1 | 6/2003 | McLellan et al. | JP | 7297344 | 11/1995 |
| 2003/0164554 | A1 | 9/2003 | Fee et al. | JP | 7312405 | 11/1995 |
| 2003/0168719 | A1 | 9/2003 | Cheng et al. | JP | 8064364 | 3/1996 |
| 2003/0198032 | A1 | 10/2003 | Collander et al. | JP | 8083877 | 3/1996 |
| 2004/0027788 | A1 | 2/2004 | Chiu et al. | JP | 8125066 | 5/1996 |
| 2004/0056277 | A1 | 3/2004 | Karnezos | JP | 964284 | 6/1996 |
| 2004/0061212 | A1 | 4/2004 | Karnezos | JP | 8222682 | 8/1996 |
| 2004/0061213 | A1 | 4/2004 | Karnezos | JP | 8306853 | 11/1996 |
| 2004/0063242 | A1 | 4/2004 | Karnezos | JP | 98205 | 1/1997 |
| 2004/0063246 | A1 | 4/2004 | Karnezos | JP | 98206 | 1/1997 |
| 2004/0065963 | A1 | 4/2004 | Karnezos | JP | 98207 | 1/1997 |
| 2004/0080025 | A1 | 4/2004 | Kasahara et al. | JP | 992775 | 4/1997 |
| 2004/0089926 | A1 | 5/2004 | Hsu et al. | JP | 9260568 | 10/1997 |
| 2004/0097016 | A1 | 5/2004 | Yee et al. | JP | 9293822 | 11/1997 |
| 2004/0164387 | A1 | 8/2004 | Ikenaga et al. | JP | 10022447 | 1/1998 |
| 2004/0253803 | A1 | 12/2004 | Tomono et al. | JP | 10199934 | 7/1998 |
| 2005/0199987 | A1 | 9/2005 | Danno et al. | JP | 10256240 | 9/1998 |
| 2006/0087020 | A1 | 4/2006 | Hirano et al. | JP | 11307675 | 11/1999 |
| 2006/0157843 | A1 | 7/2006 | Hwang | JP | 2000150765 | 5/2000 |
| 2006/0231939 | A1 | 10/2006 | Kawabata et al. | JP | 20010600648 | 3/2001 |
| 2007/0023202 | A1 | 2/2007 | Shibata | JP | 2002519848 | 7/2002 |
| 2008/0230887 | A1 | 9/2008 | Sun et al. | JP | 200203497 | 8/2002 |
| | | | | JP | 2003243595 | 8/2003 |
| | | FOREIGN PATENT DOCUMENTS | | JP | 2004158753 | 6/2004 |
| EP | 0393997 | | 10/1990 | KR | 941979 | 1/1994 |
| EP | 0459493 | | 12/1991 | KR | 19940010938 | 5/1994 |
| EP | 0720225 | | 3/1996 | KR | 19950018924 | 6/1995 |
| EP | 0720234 | | 3/1996 | KR | 19950041844 | 11/1995 |
| EP | 0794572 | A2 | 10/1997 | KR | 19950044554 | 11/1995 |
| EP | 0844665 | | 5/1998 | KR | 19950052621 | 12/1995 |
| EP | 0936671 | | 8/1999 | KR | 1996074111 | 12/1996 |
| EP | 0989608 | | 3/2000 | KR | 9772358 | 11/1997 |
| EP | 1032037 | | 8/2000 | KR | 100220154 | 6/1999 |
| JP | 55163868 | | 12/1980 | KR | 20000072714 | 12/2000 |
| JP | 5745959 | | 3/1982 | KR | 20000086238 | 12/2000 |
| JP | 58160096 | | 8/1983 | KR | 20020049944 | 6/2002 |
| JP | 59208756 | | 11/1984 | WO | 9956316 | 11/1999 |
| JP | 59227143 | | 12/1984 | WO | 9967821 | 12/1999 |
| JP | 60010756 | | 1/1985 | | | |
| JP | 60116239 | | 8/1985 | | | |
| JP | 60195957 | | 10/1985 | | | |
| JP | 60231349 | | 11/1985 | | | |
| JP | 6139555 | | 2/1986 | | | |
| JP | 61248541 | | 11/1986 | | | |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

SEMICONDUCTOR DEVICE INCLUDING LEADFRAME HAVING POWER BARS AND INCREASED I/O

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to integrated circuit package technology and, more particularly, to an increased capacity leadframe and a QFP semiconductor package which includes the same, the QFP package having exposed leads and an exposed die pad on the bottom surface of the package body thereof, additional leads which protrude from side surfaces of the package body, and a power bar and/or ground ring.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe extend externally from the package body or are partially exposed therein for use in electrically connecting the package to another component. In certain semiconductor packages, a portion of the die pad of the leadframe also remains exposed within the package body.

Leadframes for semiconductor packages can be largely classified into copper-based leadframes (copper/iron/phosphorous; 99.8/0.01/0.025), copper alloy-based leadframes (copper/chromium/tin/zinc; 99.0/0.25/0.22), alloy 42-based leadframes (iron/nickel; 58.0/42.0), etc. according to the composition of the elements or materials included in the leadframe. Exemplary semiconductor packages or devices employing leadframes include a through-hole mounting dual type inline package (DIP), a surface mounting type quad flat package (QFP), and a small outline package (SOP).

As indicated above, one type of semiconductor package commonly including a leadframe is a quad flat pack (QFP) package. QFP semiconductor packages or devices are particularly advantageous for their smaller size and superior electrical performance. A typical QFP package comprises a thin, generally square package body defining four peripheral sides of substantially equal length. Protruding from each of the four peripheral sides of the package body are a plurality of leads which each have a generally gull-wing configuration. Portions of the leads are internal to the package body, and are electrically connected to respective ones of the pads or terminals of a semiconductor die also encapsulated within the package body. The semiconductor die is itself mounted to a die pad of the QFP package leadframe. In certain types of QFP packages referred to as QFP exposed pad packages, one surface of the die pad is exposed within the bottom surface of the package body.

In the electronics industry and, in particular, in high frequency applications such hard disk drives, digital television and other consumer electronics, there is an increasing need for QFP exposed pad packages of increased functional capacity, coupled with reduced size. One of the deficiencies of currently known QFP packages is attributable to the length at which the leads protrude from the sides of the package body, such protrusion length resulting in an increase in the overall size of the QFP package and further limiting the number of inputs/outputs (I/O's) which may be included therein. With recent trends toward high integration and high performance semiconductor dies, there is a need for QFP packages to have a larger number of I/O's with excellent thermal and electrical properties. In view of this need, conventional leadframe structures as currently known and integrated into existing QFP packages often prove to be unsatisfactory.

In addition, the semiconductor dies integrated into currently known QFP packages typically require a number of power leads and ground leads, in addition to signal leads. To reduce the number of signal leads, some of these prior art QFP packages are provided with internal power bars or ground rings which extend substantially perpendicularly relative to the signal leads. All the power supply wires are bonded and electrically connected to the power bar with all the ground wires being bonded and electrically connected to the ground rings so as to avoid the unnecessary use of the signal leads for power supply or ground. However, in currently known leadframe designs for QFP packages, the power bars and/or ground rings are often not connected to other support structures of the leadframe and thus "float," thus necessitating that they be fixed to the remainder of the leadframe through the use of, for example, lead lock tape. As will be recognized, this use of lead lock tape renders the power bars and/or ground rings structurally unstable, with such instability often leading to poor flatness relative to the signal leads. Additionally, the power bars and/or ground rings in prior art leadframes are also located in regions thereof which are not adhered to or supported by heat locks during the wire bonding process, thus giving rise to occurrences of lift bonding which results from bouncing which occurs during the wire bonding process.

A further deficiency of the leadframes integrated into currently known QFP packages manifests itself when or more power levels are supplied to the semiconductor die of the QFP package. As is known in the electronic arts, two power levels (e.g., 1.2V and 3.3V) may be simultaneously applied to a single semiconductor die in a QFP package. Since conventional semiconductor dies are not designed to receive various power levels, a plurality of signal leads are often used as power leads, or different power levels are connected to a single power bar. However, as a result, electrical noise is induced in the signal leads adjacent the power bar or reduction in the number of signal leads is needed.

In an attempt to address some of the deficiencies highlighted above in relation to QFP packages, there has been developed in the prior art ball grid array (BGA) and pin grid array (PGA) semiconductor packages or devices which employ the use of laminate, tape, or film circuit boards as opposed to leadframes. These particular types of semiconductor packages provide a relatively large number of I/O's, such I/O's being defined by solder balls or metal pins which are formed on a lower surface of the encapsulant or package body of the package, rather than on the side surfaces of the package body. However, the circuit boards integrated into these types of semiconductor packages are expensive and typically exhibit poor heat sink and electrical performance characteristics in comparison to semiconductor packages employing leadframes. In this regard, semiconductor packages or devices employing leadframes often exhibit good heat sink performance due to the semiconductor die being directly mounted on a metal (e.g., copper) die pad of the leadframe.

The present invention provides a leadframe for QFP exposed pad package which addresses the aforementioned needs by providing increased I/O with a reduced overall size. The leadframe integrated into the QFP package of the present invention includes leads and a die pad which are ultimately exposed on the bottom surface of the package body thereof, and additional leads which ultimately protrude from side surfaces of the package body. In addition, the leadframe integrated into the QFP package of the present invention includes power bars and/or ground rings supported by other portions of the leadframe, thus eliminating the need for lead lock tape or other support structures. The power bar(s) and/or ground ring(s) are integrated into the fully formed QFP package, and effectively avoid the unnecessary use of signal leads of the leadframe for power supply or ground. The leadframe for the QFP package of the present invention is also provided through the use of standard, low-cost leadframe design techniques. These, as well as other features and attributes of the present invention will be discussed in more detail below.

BRIEF SUMMARY OF THE INVENTION

In accordance with the present invention, there is provided a semiconductor package (e.g., a QFP package) including a uniquely configured leadframe sized and configured to maximize the available number of exposed leads in the semiconductor package. More particularly, the semiconductor package including the leadframe of the present invention has a generally planar die pad or die paddle defining multiple peripheral edge segments. In addition, the semiconductor package includes a plurality of leads. Some of these leads include bottom surface portions which, in the completed semiconductor package, are exposed and at least partially circumvent the die pad, with other leads including portions which protrude from respective side surfaces of a package body in the completed semiconductor package. The semiconductor package of the present invention also includes one or more power bars and/or one or more ground rings which are integral portions of the pre-singulated leadframe thereof, and thus not supported by lead lock tape or other external support structures. Connected to the top surface of the die pad of the leadframe is at least one semiconductor die which is electrically connected to at least some of the leads. At least portions of the die pad, the leads, the power bar(s) and/or ground ring(s), and the semiconductor die are encapsulated by the package body, with at least portions of the bottom surfaces of the die pad and some of the leads being exposed in a common exterior surface of the package body. The leadframe of the semiconductor package is fabricated in accordance with standard, low-cost forming techniques. In accordance with the present invention, sawing, punching, etching, or other material removal processes may be completed during the fabrication of the semiconductor package to effectively electrically isolate various features of the leadframe (e.g., leads, power bar, ground ring, etc.) from each other within the semiconductor package. The semiconductor of the present invention may include one or more internal semiconductor dies, depending on functional requirements.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 6A:
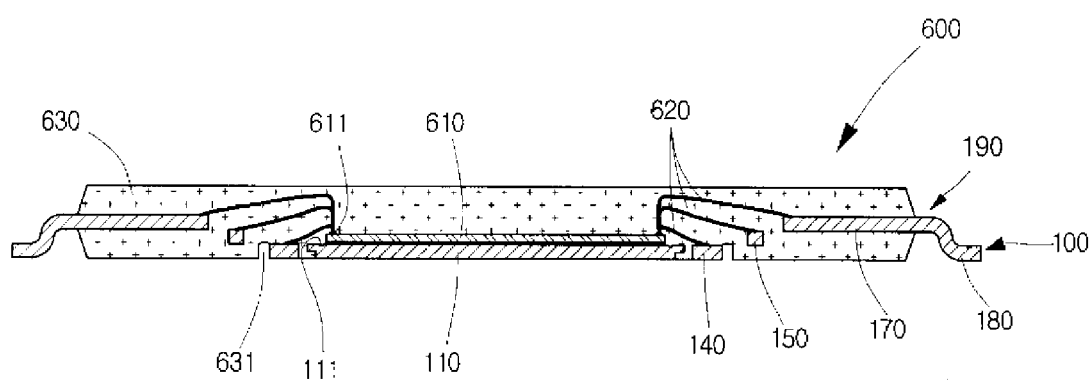
FIG. 6A is a cross-sectional view of a semiconductor package constructed in accordance with the present invention and including the leadframe shown in FIGS. 1A-1D subsequent to the singulation thereof.
Figure 6B:
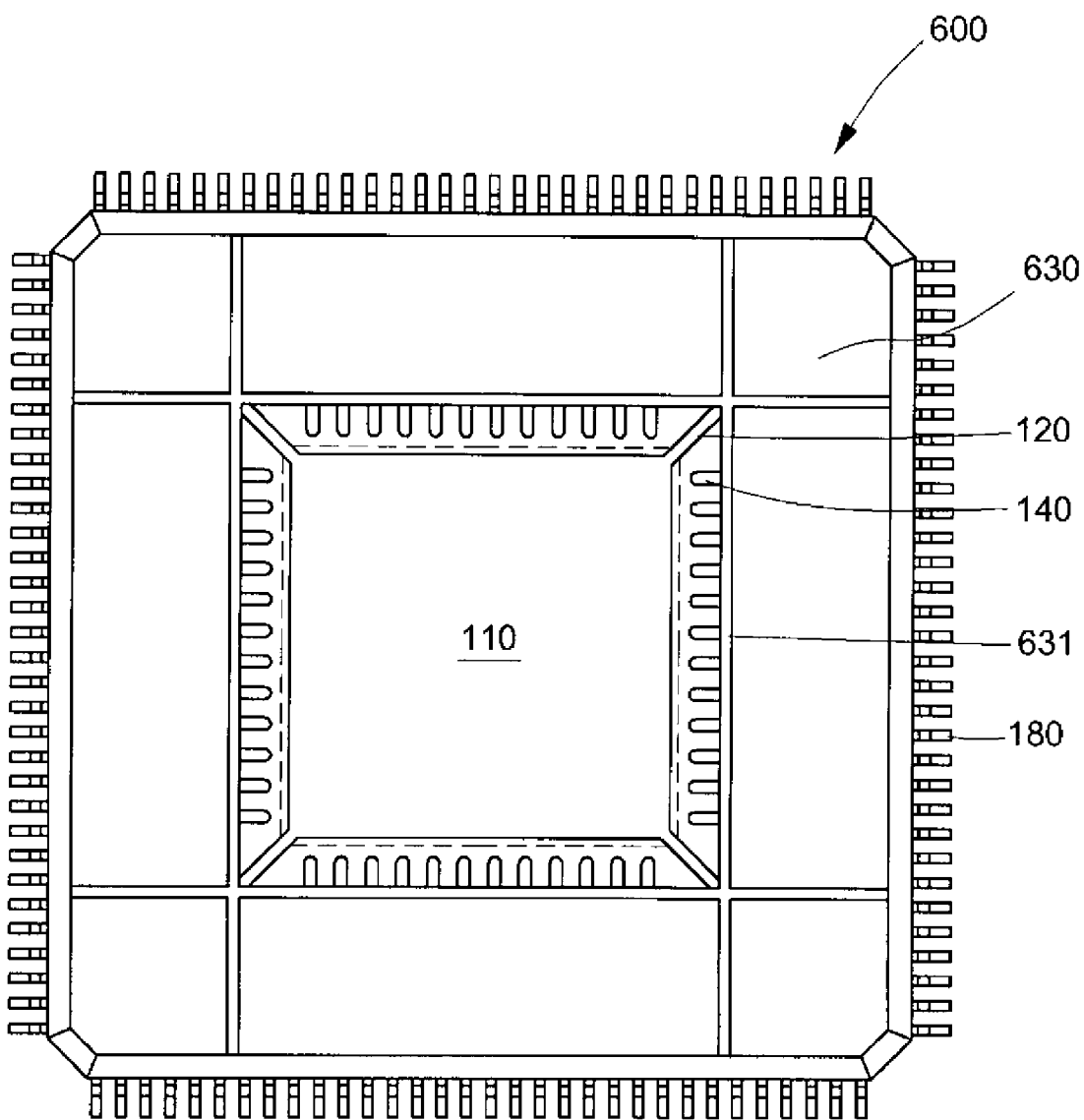
FIG. 6B is a bottom plan view of the semiconductor package shown in FIG. 6A.

Referring now to the drawings wherein the showings are for purposes of illustrating one embodiment of the present invention only, and not for purposes of limiting the same, FIGS. 1A-1D depict a leadframe 100 for integration into a semiconductor package 600 constructed in accordance with the present invention. The semiconductor package 600 is shown in FIGS. 6A and 6B.

Referring now to FIGS. 1A-1D, the leadframe 100 of the present invention comprises a generally quadrangular (e.g., square) die pad 110 which defines opposed, generally planar top and bottom surfaces, and four peripheral edge segments. Integrally connected to the die pad 110 is a plurality of tie bars 120. More particularly, the leadframe 100 includes four tie bars 120 which extend diagonally from respective ones of the four corner regions defined by the die pad 110. In the leadframe 100, each of the tie bars 120 is bent to include a first downset 121 and a second downset 122. The first downset 121 of each tie bar 120 is disposed between the second downset 122 and the die pad 110. Due to the inclusion of the first and second downsets 121, 122 therein, each of the tie bars 120 includes a first segment which is disposed between the die pad 110 and the first downset 121 and extends in generally coplanar relation to the die pad 110, a second segment which extends between the first and second downsets 121, 122 and resides on a plane which is elevated above that of the die pad 110, and a third segment which extends between the second downset 122 and a dambar 160, the third segment and the dambar 160 each residing on a plane which is elevated above that of the second segment. Thus, the first, second and third segments of each tie bar 120 reside on respective ones of three spaced, generally parallel planes, with the plane upon which the second segment resides being disposed between those planes on which respective ones of the first and third segments reside.

Figure 1A:
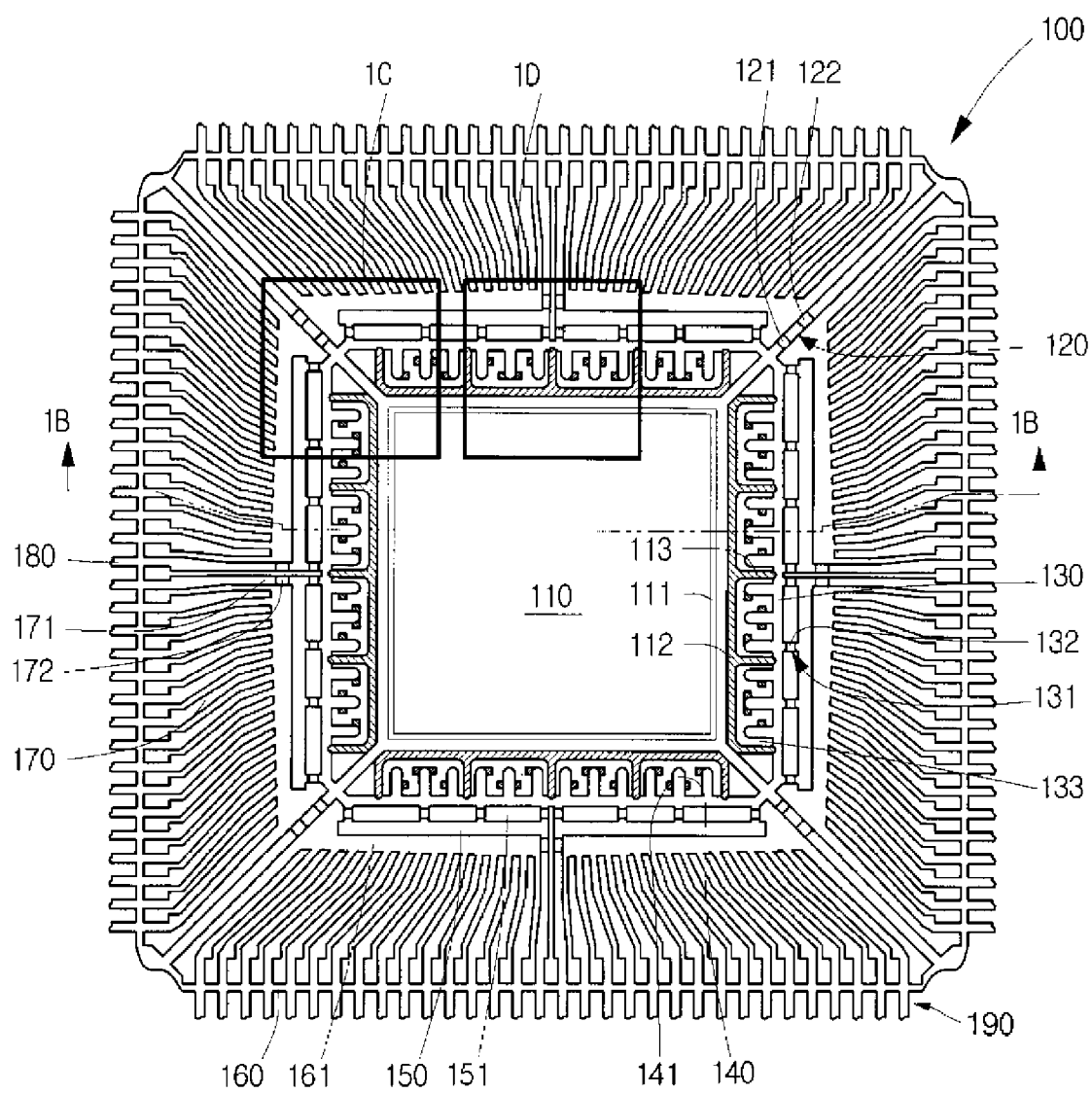
FIG. 1A is a top plan view of an unsingulated leadframe which is integrated into a semiconductor package constructed in accordance with a first embodiment of the present invention.

As indicated above, the tie bars 120 are integrally connected to the dambar 160 which circumvents the die pad 110. In the leadframe 100, the dambar 160 is provided in the form of a substantially quadrangular (e.g., square) ring which interconnects the distal ends of the tie bars 120, thus resulting in the dambar 160 extending in generally co-planar relation to the third segments of the tie bars 120. As best seen in FIG. 1A, the dambar 160 defines four peripheral segments which extend in spaced, generally parallel relation to respective ones of the peripheral edge segments of the die pad 110. In a fabrication process for the semiconductor package 600 which will be described in more detail below, the dambar 160 is singulated or removed from the leadframe 100 to electrically isolate other structural features of the leadframe 100 from each other.

Figure 1B:
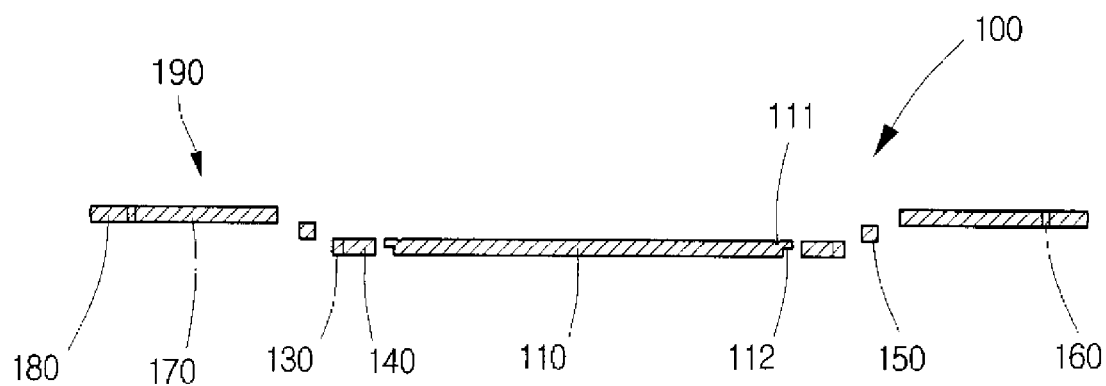
FIG. 1B is a cross-sectional view of the leadframe taken along line 1B-1B of FIG. 1A.

As seen in FIGS. 1A and 1B, the die pad 110 of the leadframe 100 is not of uniform thickness. Rather, formed in a peripheral portion of the bottom surface of the die pad 110 is a half-etched portion 112. More particularly, the half-etched portion 112 is segregated into four segments, with each of these segments extending along a respective one of the peripheral edge segments of the die pad 110 and between a respective pair of the tie bars 120. Though FIG. 1A is a top plan view of the leadframe 100, the half-etched portion 112 of the die pad 110 formed in the bottom surface thereof is indicated by the hatching included in FIG. 1A. As will be discussed in more detail below, in the fabrication process for the semiconductor package 600 including the leadframe 100, a semiconductor die is attached to the top surface of the die pad 110 through the use of an adhesive layer, with an encapsulant material thereafter being applied to the semiconductor die and the leadframe 100 to form the package body of the semiconductor package 600. Advantageously, the half-etched portion 112 formed in the peripheral portion of the bottom surface of the die pad 110 as indicated above effectively increases the distance along which moisture must travel to reach the semiconductor die mounted to the top surface of the die pad 110. As a result, such semiconductor die is safely protected against moisture in the completed semiconductor package 600. Additionally, the flow of encapsulant material over the half-etched portion 112 during the formation of the package body of the semiconductor package 600 facilitates the creation of a mechanical interlock between the package body and the die pad 110. As further seen in FIG. 1A, disposed in the top surface of the die pad 110 is a continuous, generally quadrangular groove 111 of predetermined depth. When an adhesive is used to facilitate the attachment of a semiconductor die to the top surface of the die pad 110 as indicated above, the groove 111 serves to prevent such adhesive from flowing outwardly over the peripheral edge segments of the die pad 110. Along these lines, it is contemplated that such semiconductor die will be smaller than the area circumvented by the groove 111.

As indicated above, each of the tie bars 120 is integrally connected to the dambar 160. In addition, each of the tie bars 120 is integrally connected to a land connecting bar 130 which, like the dambar 160, circumvents the die pad 110. In this regard, the land connecting bar 130 includes four peripheral segments which extend in spaced, generally parallel relation to respective ones of the peripheral edge segments of the die pad 110. In this regard, as seen in FIG. 1A, a space 133 is defined between each peripheral segment of the dambar 130 and the adjacent peripheral edge segment of the die pad 110. Additionally, the land connecting bar 130 is concentrically positioned between the dambar 160 and the die pad 110, and is integrally connected to the tie bars 120 between the die pad 110 and the first downsets 121 of the tie bars 120. The land connecting bar 130 is ultimately removed from the completed semiconductor package 600 to facilitate the electrical isolation of various structural features of the leadframe 100 from each other in a manufacturing step which will be described in more detail below.

Figure 1C:
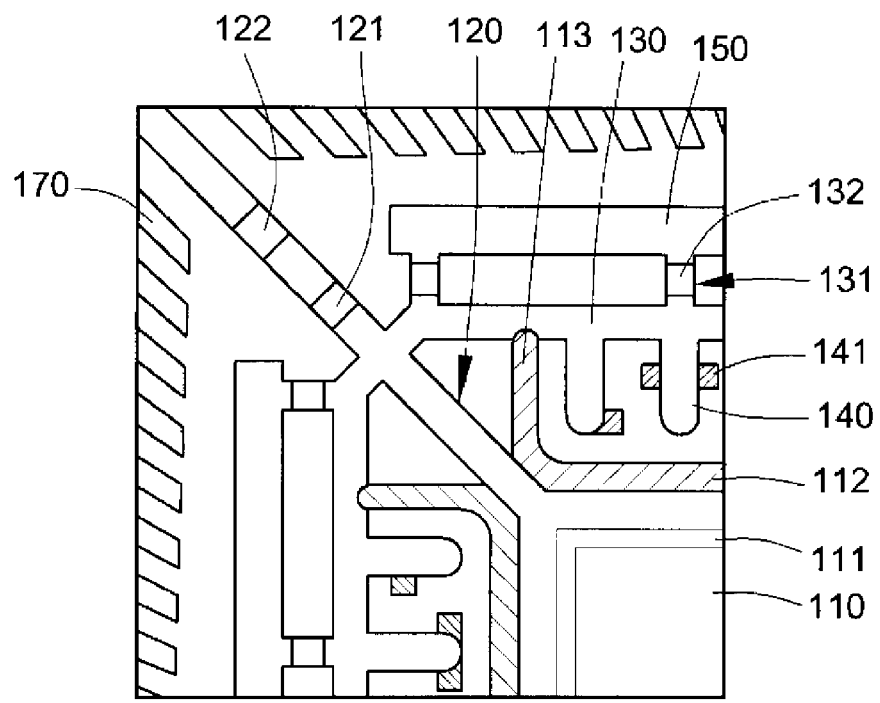
FIG. 1C is an enlargement of the region 1C included in FIG. 1A.

The leadframe 100 further comprises a plurality of support bars 113 which are integrally connected to and extend between the die pad 110 and the land connecting bar 130. In this regard, the support bars 113 function to connect the die pad 110 to and to support the die pad 110 within the interior of the land connecting bar 130. The support bars 113 are segregated into four sets, with each set of the support bars 113 extending generally perpendicularly between a respective one of the peripheral edge segments of the die pad 110 and a corresponding peripheral segment of the land connecting bar 130. Each of the support bars 113 has a generally planar top surface which extends in generally co-planar relation to the top surface of the die pad 110. As is seen in FIGS. 1A and 1C, each of the support bars 140 is also preferably half-etched as indicated by the hatching shown in FIG. 1A so as to define a bottom surface which extends in generally co-planar relation to the half-etched portion 112 of the die pad 110. As a result, in the process of fabricating the semiconductor package 600 as will be described in more detail below, the encapsulant material used to form the package body of the semiconductor package 600 is able to flow over the bottom surfaces of the support bars 113, and thus completely covers or encapsulates each support bar 113. Such encapsulation of the support bars 113 prevents the support bars 113 from affecting the connection of the completed semiconductor package 600 to an external circuit.

The leadframe 100 of the present invention further comprises a plurality of first leads 140 which are each integrally connected to the land connecting bar 130, and protrude inwardly toward the die pad 110. More particularly, as best seen in FIGS. 1A-1D, the first leads 140 are segregated into four sets, with each set of the first leads 140 protruding inwardly from a respective one of the peripheral segments of the land connecting bar 130 toward the die pad 110. The first leads 140 of each set are arrange at a predetermined pitch and protrude perpendicularly inward at a predetermined length from a respective one of the peripheral segments of the land connecting bar 130. Each of the first leads 140 has a generally planar top surface which extends in generally co-planar relation to the top surface of the die pad 110, and a generally planar bottom surface which extends in generally co-planar relation to the bottom surface of the die pad 110 and defines a land as shown in FIG. 6B.

Figure 1D:
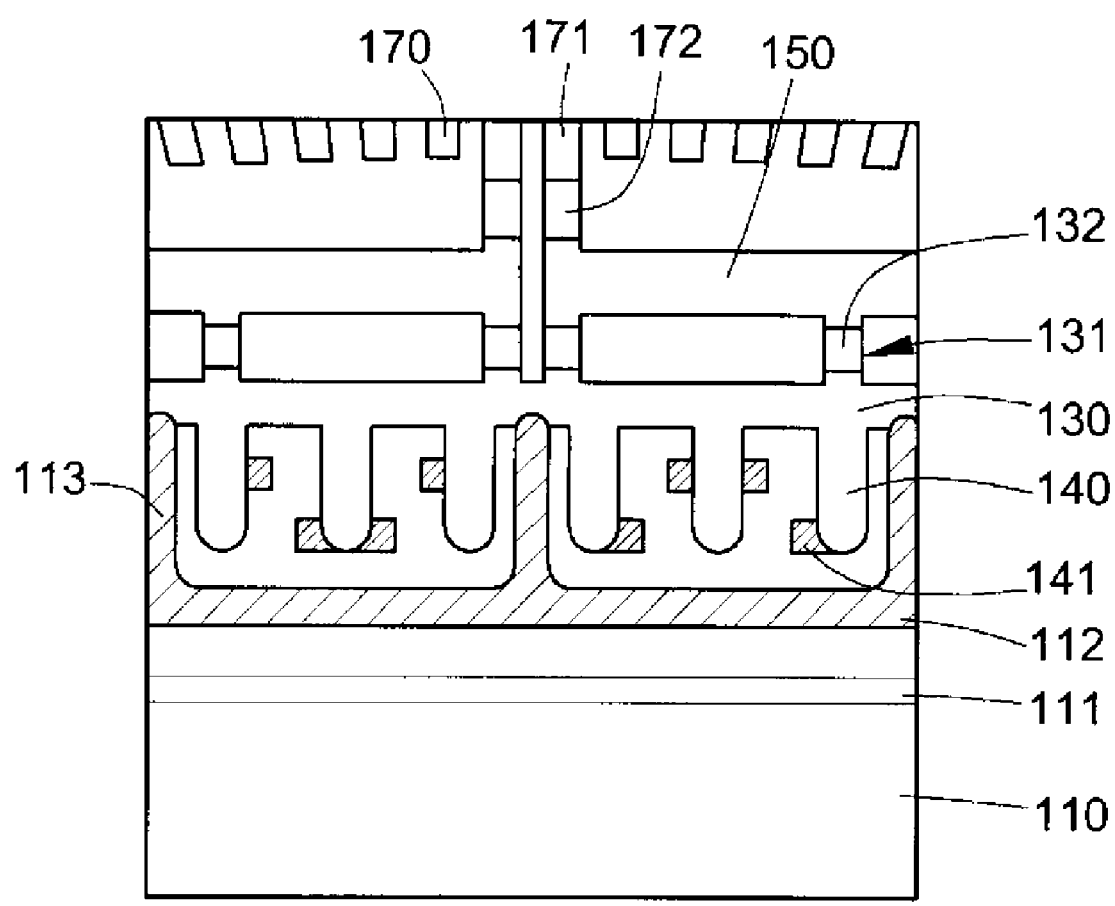
FIG. 1D is an enlargement of the region 1D included in FIG. 1A.

As is further seen in FIGS. 1A, 1C and 1D, each of the first leads 140 may be formed to include one or more integral locking protrusions 141 which protrude from one or both sides thereof. Each of the locking protrusions 141 is preferably half-etched as indicated by the hatching shown in FIGS. 1A, 1C and 1D such that each locking protrusion 141 defines a generally planar top surface which extends in generally co-planar relation to the top surface of the corresponding first lead 140, and a bottom surface which is recessed relative to the bottom surface of the corresponding first lead 140. As a result, in the process of fabricating the semiconductor package 600 as will be described in more detail below, the encapsulant material used to form the package body of the semiconductor package 600 completely covers or encapsulates each locking protrusion 141 to effectively form a mechanical interlock between the first leads 140 and the package body. This mechanical interlock assists in preventing the first leads 140 from being dislodged from the package body during a subsequent sawing process involved in the fabrication of the semiconductor package 600, as will also be described in more detail below.

As seen in FIGS. 1A-1B, the leadframe 100 of the present invention further comprises a plurality (e.g., eight) power bars 150. More particularly, the power bars 150 are provided in four sets of two power bars 150 each, with each set of two power bars 150 extending linearly between an adjacent pair of the tie bars 120. In the leadframe 100, each of the power bars 150 is integrally connected to an adjacent peripheral segment of the land connecting bar 130 by one or more support bars 131. As best seen in FIGS. 1C and 1D, each support bar 131 is bent to include a downset 132 therein. As a result of the inclusion of the downsets 132 in the support bars 131, each of the power bars 150 resides on a plane which is elevated above that of the die pad 110. More particularly, the power bars 150 extend in generally co-planar relation to the second segments of the tie bars 120, and thus reside on a plane which is disposed between those planes on which respective ones of the first and third segments of each tie bar 120 reside. Thus, each power bar 150 defines a generally planar bottom surface which extends in generally co-planar relation to the generally planar top surfaces of the land connecting bar 130, first leads 140 and die pad 110. In FIG. 1A, four support bars 131 are depicted as attaching each of the two power bars 150 of each of the four sets thereof to a corresponding peripheral segment of the land connecting bar 130. However, those of ordinary skill in the art will recognize that greater or fewer than four support bars 131 may be used to facilitate the integral connection of each power bar 150 to a corresponding peripheral segment of the land connecting bar 130 without departing from the spirit and scope of the present invention. Similarly, though a total of eight power bars 150 are depicted in FIG. 1A, those of ordinary skill in the art will recognize that greater or fewer than eight power bars 150 may be included in the leadframe 100, and provided in arrangements differing from those shown in FIG. 1A without departing from the spirit and scope of the present invention. The use of the power bars 150 will be discussed in more detail below. The power bars 150 of each set, in addition to being linearly aligned with each other, also extend between and in spaced, generally parallel relation to a corresponding peripheral segment of the land connecting bar 130 and a corresponding peripheral edge segment of the die pad 110. The land connecting bar 130, power bars 150, and support bars 131 further collectively define a plurality of voids or spaces 151.

The leadframe 100 constructed in accordance with the present invention further comprises a plurality of second leads 190 which are integrally to the dambar 160 and, like the first leads 140, preferably segregated into four sets, with each set of the second leads 190 extending between an adjacent pair of the tie bars 120. The second leads 190 of each set also extend generally perpendicularly relative to a respective one of the peripheral segments of the dambar 160 at predetermined lengths, and are arranged at a predetermined pitch. Each of the second leads 190 defines an inner portion 170 which extends inwardly from a corresponding peripheral segment of the dambar 160 toward the die pad 110 in spaced relation thereto. The inner portions 170 each preferably have an angled configuration so as to be disposed closer to a respective one of the peripheral edge segments of the die pad 110. In addition to the inner portion 170, each of the second leads 190 includes an outer portion 180 which extends outwardly from a corresponding peripheral segment of the dambar 160 away the die pad 110. In the leadframe 100, the second leads 190, the dambar 160, and the third segments of the tie bars 120 all reside on a common plane. In the process of fabricating the semiconductor package 600 as will be described in more detail below, the dambar 160 is ultimately singulated or removed in a manner facilitating the electrical isolation of the second leads 190 from each other. As will also be discussed in more detail below, the outer portions 180 of the second leads 190 protrude from respective side surfaces of the package body in the completed semiconductor package 600.

As best seen in FIGS. 1A and 1D, the inner portions 170 of two second leads 190 of each set thereof each include a tie bar portion 171 which is integrally connected to a respective one of the power bars 150 of the corresponding set thereof extending between the same adjacent pair of tie bars 120. Because the second leads 190 and the power bars 150 reside upon respective ones of a spaced, generally parallel pair of planes, each tie bar portion 171 is bent to include a downset 172 therein as is needed to accommodate such spacing. The inner portions 170 of those second leads 190 of each set not including the tie bar portions 171 are separated from the power bars 150 of the corresponding set thereof by gaps or spaces 161. As indicated above, in FIG. 1A, only two second leads 190 of each set thereof are shown as including a tie bar portion 171 which is integrally connected to a respective one of the power bars 150 of the corresponding pair or set. However, those of ordinary skill in the art will recognize that more than two of the second leads 190 of each set thereof may be provided with a tie bar portion 171 such that each power bar 150 of each set thereof is integrally connected to two or more of the second leads 190 of the corresponding set thereof.

As is apparent from FIG. 1A, each power bar 150 of each set thereof is connected to the adjacent peripheral segment of the land connecting bar 130 through the use of the support bars 131, and further to at least one of the second leads 190 of the corresponding set thereof via a tie bar portion 171. Due to the inclusion of the downsets 132 in the support bars 131 and the downsets 172 in the tie bar portions 171, each power bar 150 resides on a plane disposed between and extending in generally parallel relation to respective ones of the two planes upon which the die pad 110 and the second leads 190 reside. As previously indicated, the support bars 113, the land connecting bar 130, and the first leads 140 reside on the same plane as that of the die pad 110. The power bars 150 are positioned between the land connecting bar 130 and the inner portions 170 of the second leads 190. Because, prior to the singulation of the leadframe 100, the power bars 150 are supported by the die pad 110 (via the support bars 113, 131 and the land connecting bar 130), the tie bars 120 (via the land connecting bar 130), and the dambar 160 (via the second leads 190 including the tie bar portions 171), the flatness of the power bars 150 is maintained during a process of fabricating the semiconductor package 600 including the leadframe 100. The flatness of the land connecting bar 130 in the unsingulated leadframe 100 is also maintained by virtue of its attachment to the die pad 110 via the support bars 113.

As will be discussed in more detail below, electrically conductive wires for power supply may be connected from the semiconductor die of the semiconductor package 600 to the power bars 150 in the process of fabricating the semiconductor package 600. Consequently, the power bars 150 can be used to supply power to the semiconductor die. One or more power bars 150 can also be used for grounding. As will also be discussed in more detail below, the conductive wires, in addition to being extended from the semiconductor die of the semiconductor package 600 to the top surfaces of the power bars 150, are also typically extended between the semiconductor die and the top surfaces of each of the first leads 140, as well as the top surfaces of the inner portions 170 of each of the second leads 190. However, conductive wires are typically not extended to the top surfaces of the inner portions 170 of those second leads 190 including the tie bar portions 171.

As indicated above, in the completed semiconductor package 600, both the land connecting bar 130 and the dambar 160 are ultimately singulated or removed from the leadframe 100. The singulation or removal of the land connecting bar 130 in a fabrication step for the semiconductor package 600 which will described in more detail below facilitates the electrical isolation of the first leads 140 from each other, and from the die pad 110. In addition, each of the first leads 140 is electrically isolated from the power bars 150 by virtue of the removal of the land connecting bar 130. The singulation or removal of the dambar 160 electrically isolates the second leads 190 from each other. Additionally, those second leads 190 not including a tie bar portion 171 are electrically isolated from the power bars 150 by virtue of the removal of the dambar 160. Upon the removal of both the land connecting bar 130 and the dambar 160, eight second leads 190 (i.e., those eight second leads 190 including a tie bar portion 171) are still electrically connected to respective ones of the power bars 150 by virtue of the tie bar portion 171 extending therebetween. As also indicated above, in the completed semiconductor package 600, the outer portions 180 of the second leads 190 protrude from respective side surfaces of the package body of the semiconductor package 600, with the exposed outer portions 180 transmitting signals from the corresponding inner portions 170 (which are electrically connected to the semiconductor die via conductive wires as indicated above).

The outer portions 180 of the those second leads 190 including the tie bar portions 171 may be used to transmit power since they are electrically connected to respective ones of the power bars 150. The electrical isolation of the power bars 150 and the first leads 140 in the completed semiconductor package 600 as described above enables the supply of various power levels to the semiconductor die of the semiconductor package 600, and thus the design of a high-integration and high-performance semiconductor package 600.

The leadframe 100 may be fabricated from a conventional metal material, such as copper, copper alloy, steel plated with copper, or a functional equivalent. However, those of ordinary skill in the art will recognize that the present invention is not limited to any particular material for the leadframe 100. It is contemplated that for ease of wire bonding, gold or silver may be plated on the top surfaces of the first leads 140, the top surfaces of the power bars 150, and the top surfaces of the inner portions 170 of the second leads 190 as well. The leadframe 100 may also be a pre-plated leadframe (PPF) to provide enhanced wire bonding areas. Additionally, the number of first leads 140, second leads 190, and power bars 150 shown in FIG. 1A is for illustrative purposes only, and may be modified according to application field. Along these lines, the first leads 140, second leads 190, and power bars 150 may have designs or configurations varying from those shown in FIG. 1A without departing from the spirit and scope of the present invention. Additionally, though the first leads 140, second leads 190, and power bars 150 are each shown as being segregated into four sets, it will be recognized that fewer sets thereof may be provided, and may be arranged along any combination of two or three of the peripheral sides of the die pad 110. Moreover, less than four tie bars 120 may be included in the leadframe 100, extending to respective corners of the die pad 110 in any combination. It is further contemplated that the leadframe 100 may be fabricated through the implementation of a chemical etching process or alternatively a mechanical stamping process.

Referring now to FIGS. 6A and 6B, the semiconductor package 600 as fabricated to include the leadframe 100 is shown in detail. As will be recognized by those of ordinary skill in the art, in the completed semiconductor package 600 shown in FIGS. 6A and 6B, the dambar 160 and the land connecting bar 130 are each singulated or removed from the leadframe 100 to facilitate the electrical isolation of the various structural features of the leadframe 100 from each other as previously explained. More particularly, as indicated above, the singulation or removal of the land connecting bar 130 facilitates the electrical isolation of the first leads 140 from each other, and from the die pad 110. In addition, each of the first leads 140 is electrically isolated from the power bars 150 by virtue of the removal of the land connecting bar 130. The singulation or removal of the dambar 160 electrically isolates the second leads 190 from each other. Additionally, those second leads 190 not including a tie bar portion 171 are electrically isolated from the power bars 150 by virtue of the removal of the dambar 160.

As seen in FIGS. 6A and 6B, in the semiconductor package 600, a semiconductor die 610 is attached to the top surface of the die pad 110 through the use of, for example, an adhesive layer. The semiconductor die 610 includes a plurality of bond pads 611 which are disposed on the top surface thereof opposite the bottom surface adhered to the top surface of the die pad 110. The bond pads 611 are used to deliver and receive electrical signals or power. The semiconductor package 600 further comprises a plurality of conductive wires 620 which are used to electrically connect the bond pads 611 of the semiconductor die 610 to respective ones of the first and second leads 140, 190. The conductive wires 620 may be fabricated from aluminum, copper, gold, silver, or a functional equivalent. However, those of ordinary skill in the art will recognize that the present invention is not limited to any particular material for the wires 620. One or more conductive wires 620 may also be used to electrically connect one or more bond pads 611 directly to the die pad 110. In this regard, the peripheral edge portion of the top surface or the entire top surface of the die pad 110 may be plated and bonded with conductive wires 611, allowing for the use of the plated die pad 110 as a ground region.

In the semiconductor package 600, in electrically connecting the bond pads 611 to the first leads 140, it is contemplated that the conductive wires 620 will be extended from the bond pads 611 to the top surfaces of respective ones of the first leads 140. In electrically connecting the bond pads 611 to the second leads 190, it is contemplated that the conductive wires 620 will be extended from the bond pads 611 to the top surfaces of respective ones of the inner portions 170 of the second leads 190. In addition, one or more of the bond pads 611 may be electrically connected to one or more of the power bars 150. In electrically connecting the bond pad(s) 611 to the power bar(s) 150, it is contemplated that the conductive wire(s) 620 will be extended from the bond pad(s) 611 to the top surface(s) of the power bar(s) 150. As indicated above, it is contemplated that no conductive wires 620 will be extended from the bond pads 611 to any of those second leads 190 integrally connected to a respective one of the power bars 150 via the tie bar portions 171.

In the semiconductor package 600, the die pad 110, the first and second leads 140, 190, the tie bars 120, the power bars 150, the semiconductor die 610 and the conductive wires 620 are at least partially encapsulated or covered by an encapsulant material which, upon hardening, forms the package body 630 of the semiconductor package 600. More particularly, the package body 630 covers the entirety of the die pad 110 except for the bottom surface thereof which is circumvented by the half-etched portion 112. The package body 630 also covers the entirety of the power bars 150. The package body 630 also covers the entirety of each of the first leads 140 except for the land defined by the bottom surface thereof. The package body 630 also covers the entirety of the inner portion 170 of each of the second leads 190 except for a small portion thereof. The entirety of each of the tie bars 120 is also covered by the package body 630, except for the bottom surface of the first segment of each tie bar 120 which extends in generally co-planar relation to the bottom surface of the die pad 110 and the lands defined by the first leads 140, all of which are exposed in a generally planar bottom surface defined by the package body 630. The outer portions 180 of the second leads 190 are not covered by the package body 630, but rather protrude or extend outwardly from respective lateral side surfaces thereof. The dambar 160 is also not covered by the package body 630 so that it may be removed from the leadframe 100.

Though the land connecting bar 130 is partially covered by the package body 630, the bottom surface of the land connecting bar 130 is exposed in the bottom surface of the package body 630 so that the land connecting bar 130, like the dambar 160, may be removed from the completed semiconductor package 600 as needed to facilitate the electrical isolation of various structural features thereof from each other in the above-described manner. The removal of the land connecting bar 130 is typically accomplished through the completion of a partial sawing process. The implementation of such sawing process facilitates the formation of a plurality of elongate grooves 631 within the bottom surface of the package body 630, such grooves 631 extending in generally perpendicular relation to each other, and generally perpendicularly between an opposed pair of the lateral side surfaces of the package body 630. The package body 630 also completely covers or encapsulates each of the support bars 113, with such encapsulation preventing the support bars 113 from affecting the connection of the completed semiconductor package 600 to an external circuit. With regard to the removal of the dambar 160, it is contemplated that such removal will typically be accomplished through the implementation of a conventionally known debarring process. As indicated above, the removal of the land connecting bar 130 is facilitated by sawing with a blade, the grooves 631 being formed as an artifact of such sawing process.

Due to the structural attributes of the fully formed package body 630, the generally planar bottom surface of the die pad 110 is exposed in and substantially flush with the generally planar bottom surface of the package body 630, as are the generally planar bottom surfaces of the first segments of the tie bars 120. Similarly, the generally planar lands defined by the first leads 140 are exposed in and substantially flush with the bottom surface of the package body 630. The outer portions 180 of the second leads 190 of each set thereof protrude laterally outward from respective side surfaces of the package body 630. As seen in FIG. 6A, the exposed outer portions 180 may be bent to assume a gull-wing configuration to allow the same to be electrically connected to an underlying substrate such as a printed circuit board. In the completed semiconductor package 600, the exposed outer portions 180 and the exposed lands defined by the first leads 140 are capable of being mounted to the surface of an underlying substrate such as a printed circuit board through the use of, for example, a soldering technique. The conductive wires 620 electrically interconnect the bond pads 611 of the semiconductor die 610 to the die pad 110, the power bars 150, the first leads 140 and the second leads 190 in the manner indicated above. In this regard, by way example, one end of each of the conductive wires 620 for ground can be bonded to the die pad 110, with one end of each of the wires 620 for power supply being bonded to a corresponding power bar 150, and one end of each of the conductive wires 620 for signaling being bonded to a corresponding one of the first or second leads 140, 190. Based on the wire bonding pattern, various power levels can be supplied to the semiconductor die 610 through the power bars 150. As indicated above, electrical signals are routed from the semiconductor die 610 to the outer portions 180 of the second leads 190 by the corresponding integrally connected inner portions 170 and conductive wires 620. Since the leadframe 100 of the semiconductor package 600 is configured to provide both the second leads 190 and the first leads 140, the number of I/O's in the leadframe 100 increases in proportion to the number of first and second leads 140, 190.

Figure 10:
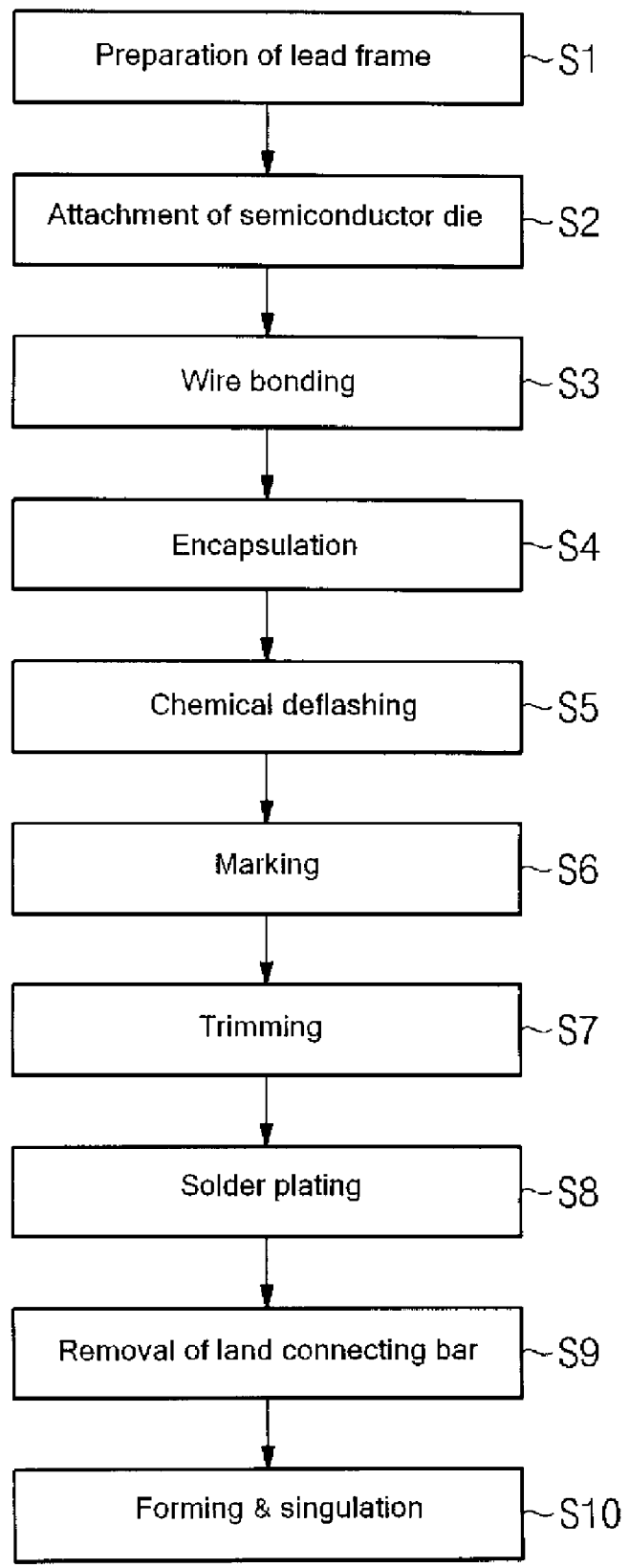
FIG. 10 is a flow chart illustrating an exemplary fabrication method for the semiconductor package shown in FIGS. 6A and 6B.

Referring now to FIG. 10, there is provided a flow chart which sets forth an exemplary method for fabricating the semiconductor package 600 of the present invention. The method comprises the steps of preparing the leadframe (51), semiconductor die attachment (S2), wire bonding (S3), encapsulation (S4), chemical deflashing (S5), marking (S6), trimming (S7), solder plating (S8), land connecting bar removal (S9), and forming and singulation (S10). FIGS. 11A-11L provide illustrations corresponding to these particular steps, as will be discussed in more detail below.

Figure 11A:
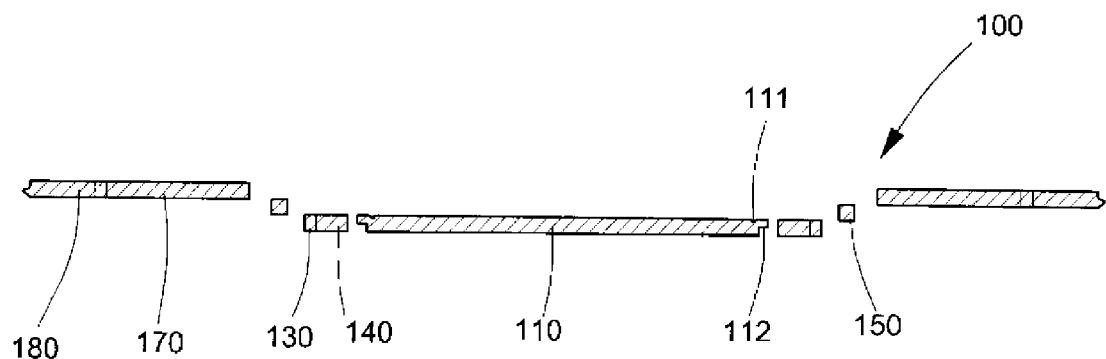
FIGS. 11A-11L are views illustrating an exemplary fabrication method for the semiconductor package shown in FIGS. 6A and 6B.
Figure 11B:
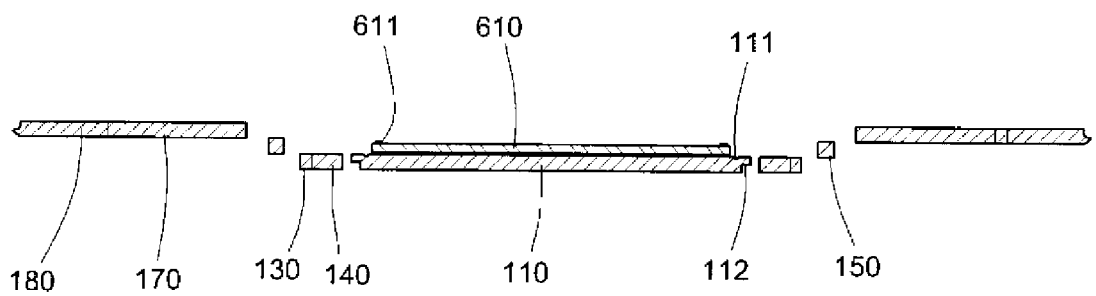

Referring now to FIG. 11A, in the initial step S1 of the fabrication process for the semiconductor package 600, the leadframe 100 having the above-described structural attributes is provided. Thereafter, as illustrated in FIG. 11B, step S2 is completed wherein the semiconductor die 610 having the bond pads 611 is attached to the top surface of the die pad 110 of the leadframe 100 through the use of the adhesive layer. The adhesive layer can be selected from well known liquid epoxy adhesives, adhesive films and adhesive tapes, as well as equivalents thereto.

Figure 11C:
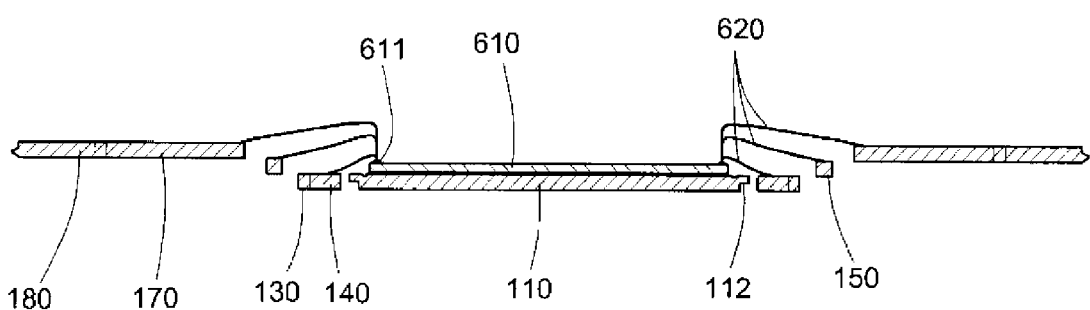
Figure 11D:
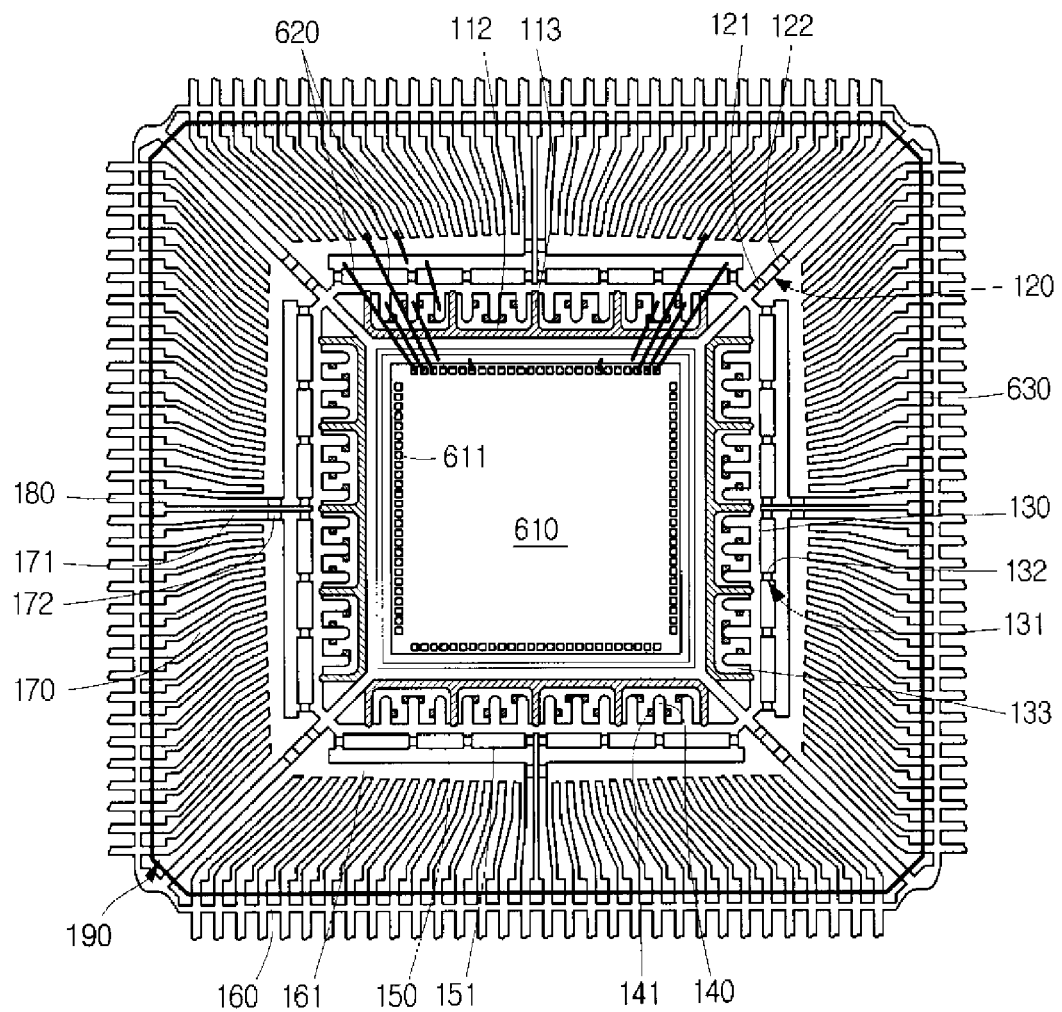

Referring now to FIGS. 11C and 11D, in the next step S3 of the fabrication process, the conductive wires 620 are used to electrically interconnect the semiconductor die 610 to the leadframe 100 in the aforementioned manner. Specifically, the bond pads 611 of the semiconductor die 610 are electrically connected to the first and second leads 140, 190, and at least one of the power bars 150. Though not shown, as indicated above, one or more conductive wires 620 may also be used to electrically connect one or more bond pads 611 of the semiconductor die 610 directly to the die pad 110, allowing for the use of the die pad 110 as a ground region. In this regard, as also indicated above, a wire bonding area (not shown) may be formed on an outer peripheral portion of the top surface of the die pad 110, with the U-shaped or V-shaped groove 112 being formed between such wire bonding area and the semiconductor die 610 so that the adhesive used to facilitate the attachment of the semiconductor die 610 to the die pad 110 does not flow into the peripheral wire bonding area.

Figure 11E:
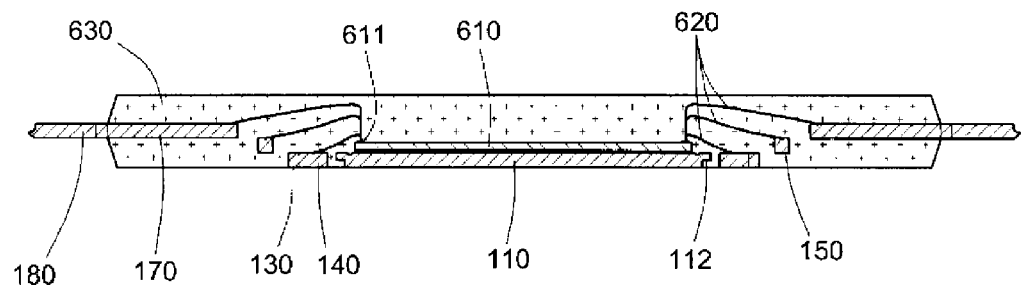

Referring now to FIG. 11E, in the next step S4 of the fabrication process for the semiconductor package 600, portions of the leadframe 100, the semiconductor die 610 and the conductive wires 620 are encapsulated with an encapsulant material which, upon hardening, forms the package body 630 of the semiconductor package 600. More particularly, the package body 630 covers the entirety of the die pad 110 except for the bottom surface thereof which is circumvented by the half-etched portion 112. The package body 630 also covers the entirety of each of the first leads 140 except for the land defined by the bottom surface thereof, as well as the entirety of the inner portion 170 of each of the second leads 190 except for a small portion thereof. The entirety of each of the tie bars 120 is also covered by the package body 630, except for the bottom surface of the first segment of each tie bar 120 which extends in generally co-planar relation to the bottom surface of the die pad 110 and the lands defined by the first leads 140. The outer portions 180 of the second leads 190 of the leadframe 100 are not covered by the package body 630. The dambar 160 is also not covered by the package body 630 so that it may be removed from the leadframe 100. Though the land connecting bar 130 is partially covered by the package body 630, the bottom surface of the land connecting bar 130 is exposed in the bottom surface of the package body 630 so that the land connecting bar 130, like the dambar 160, may be removed from the completed semiconductor package 600.

Figure 11F:
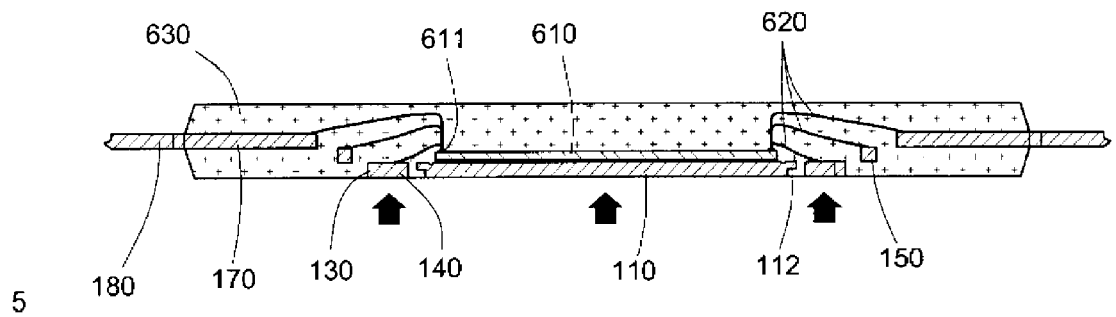

Referring now to FIG. 11F, subsequent to the formation of the package body 630 in step S4, chemical deflashing (step S5) may be performed if films of flash (a resin component of the encapsulant material) are formed on the bottom surface of the die pad 110 and upon the lands defined by the exposed bottom surfaces of the first leads 140. If such thin films of flash are present as could impede the ability to mount the semiconductor package 600 to an underlying substrate, the removal of such flash films by a chemical etching method is required. Subsequent to the completion of the chemical deflashing step (step S5), a marking step (step S6) may be performed upon the semiconductor package 600. More particularly, ink or a laser may be used to mark the product name, the manufacturer of the semiconductor package 600, etc. on a prescribed surface of the package body 630.

Figure 11G:
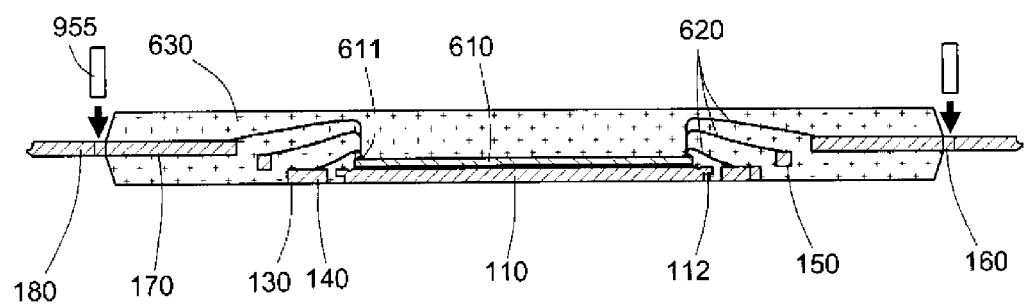
Figure 11H:
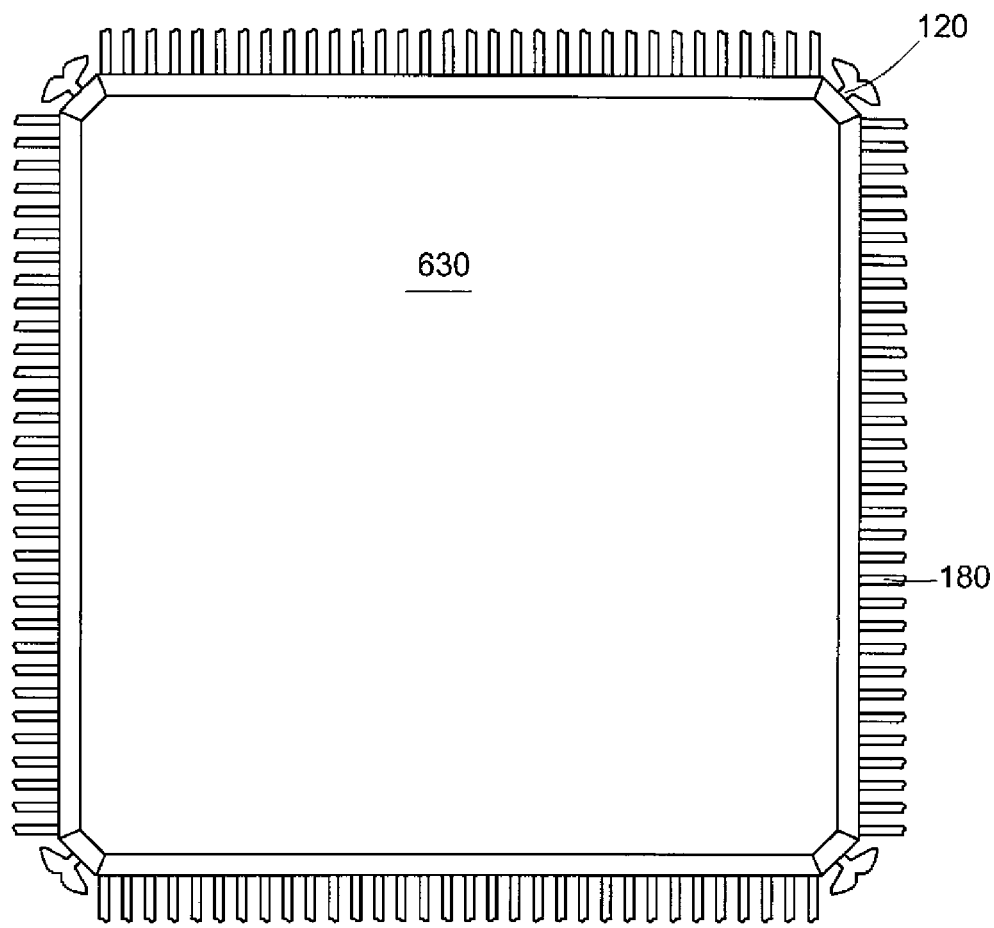

Referring now to FIGS. 11G and 11H, in the next step S7 of the fabrication process for the semiconductor package 600, the dambar 160 is trimmed or removed by cutting with a cutting tool 955 so that the second leads 190 are electrically isolated from each other and from the power bars 150 (for those second leads 190 not including the tie bar portions 171) in the above described manner. As previously explained, the dambar 160 is positioned outside of the package body 630 to allow for the removal thereof from the leadframe 100, and is removed by cutting the same with the dambar cutting tool 955. In addition, portions of the tie bars 120 protruding from the side surfaces of the package body 630 are also completely removed during the trimming process.

Upon the completion of step S7, a solder plating step (step S8) may also be performed in the fabrication process for the semiconductor package 600. More particularly, after the dambar 160 has been removed using the dambar cutting tool 955, some metal areas of the leadframe 100 susceptible to oxidation are exposed to air (e.g., the outer portions 180 of the second leads 190 and the lands of the first leads 140). Since the leadframe 100 is typically made of copper, the same is susceptible to oxidation. In order to prevent the oxidation of the exposed metal areas of the leadframe 100, all elements of the leadframe 100 exposed outside of the package body 630 may be plated by soldering.

Figure 11I:
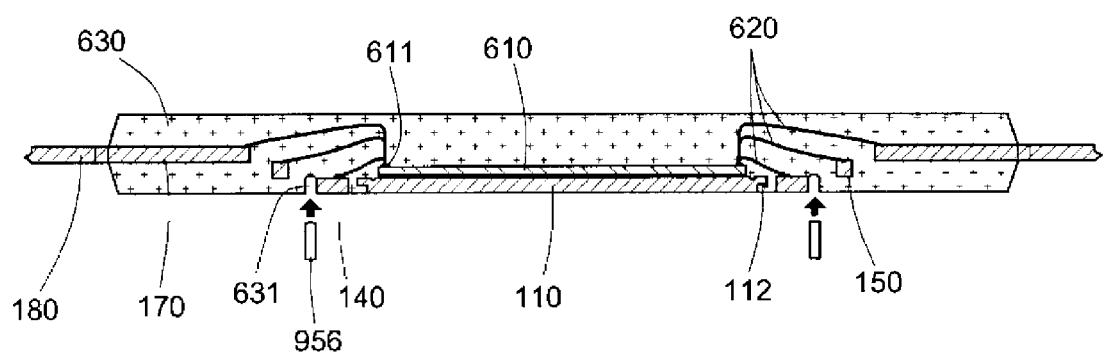
Figure 11J:
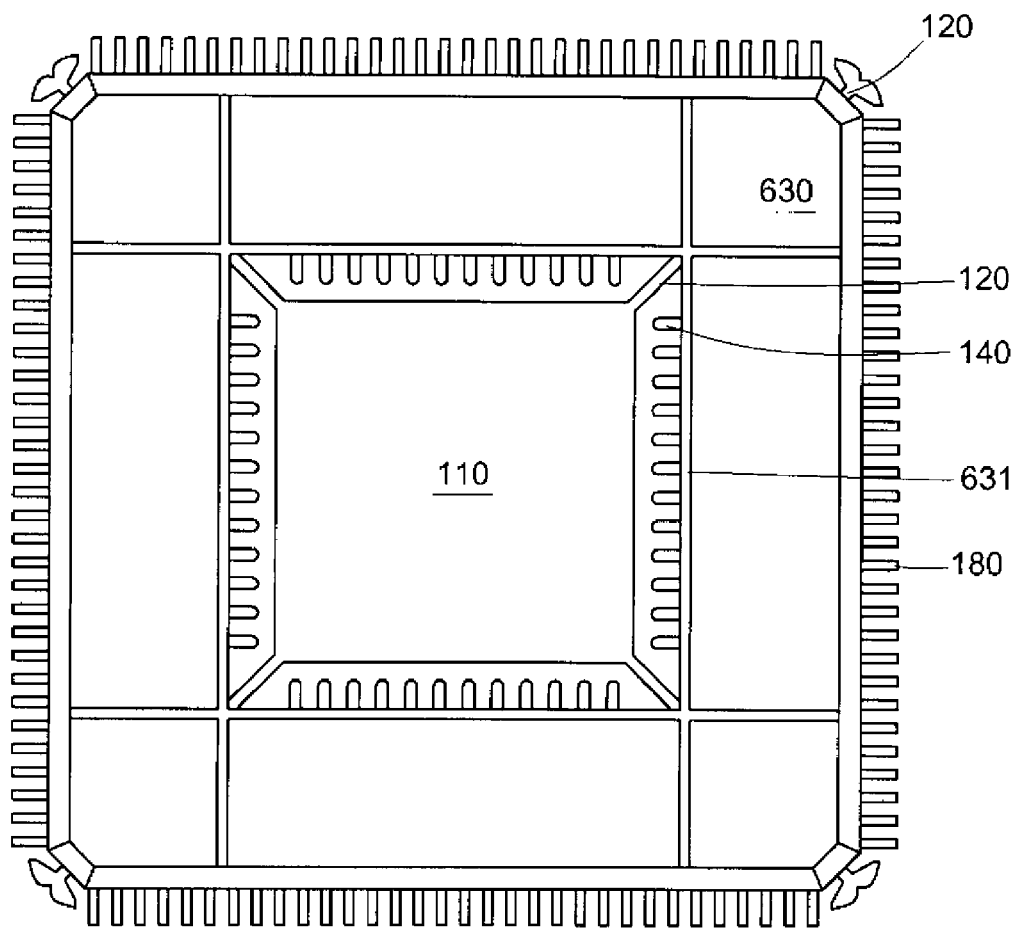

Referring now to FIGS. 11I and 11J, in the next step S9 of the fabrication process for the semiconductor package 600, the removal of the land connecting bar 130 is facilitated by sawing with a suitable tool 956, the grooves 631 being formed as an artifact of such sawing process. The removal of the land connecting bar 130 is needed to facilitate the electrical isolation of the first leads 140 from each other and from the power bars 150 as described above. The tool 956 can comprise a saw (diamond wheel), or a laser, though an etching process may also be used to remove the land connecting bar 130. The depth of the grooves 631 slightly exceeds the thickness of the land connecting bar 130.

Figure 11K:
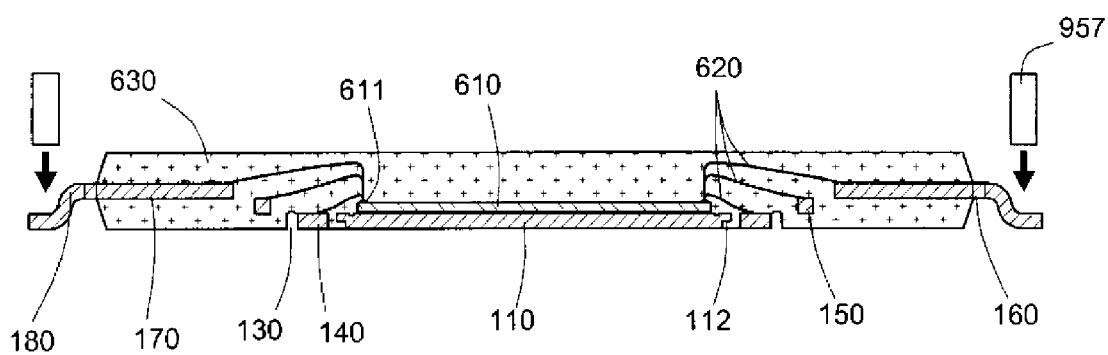
Figure 11L:
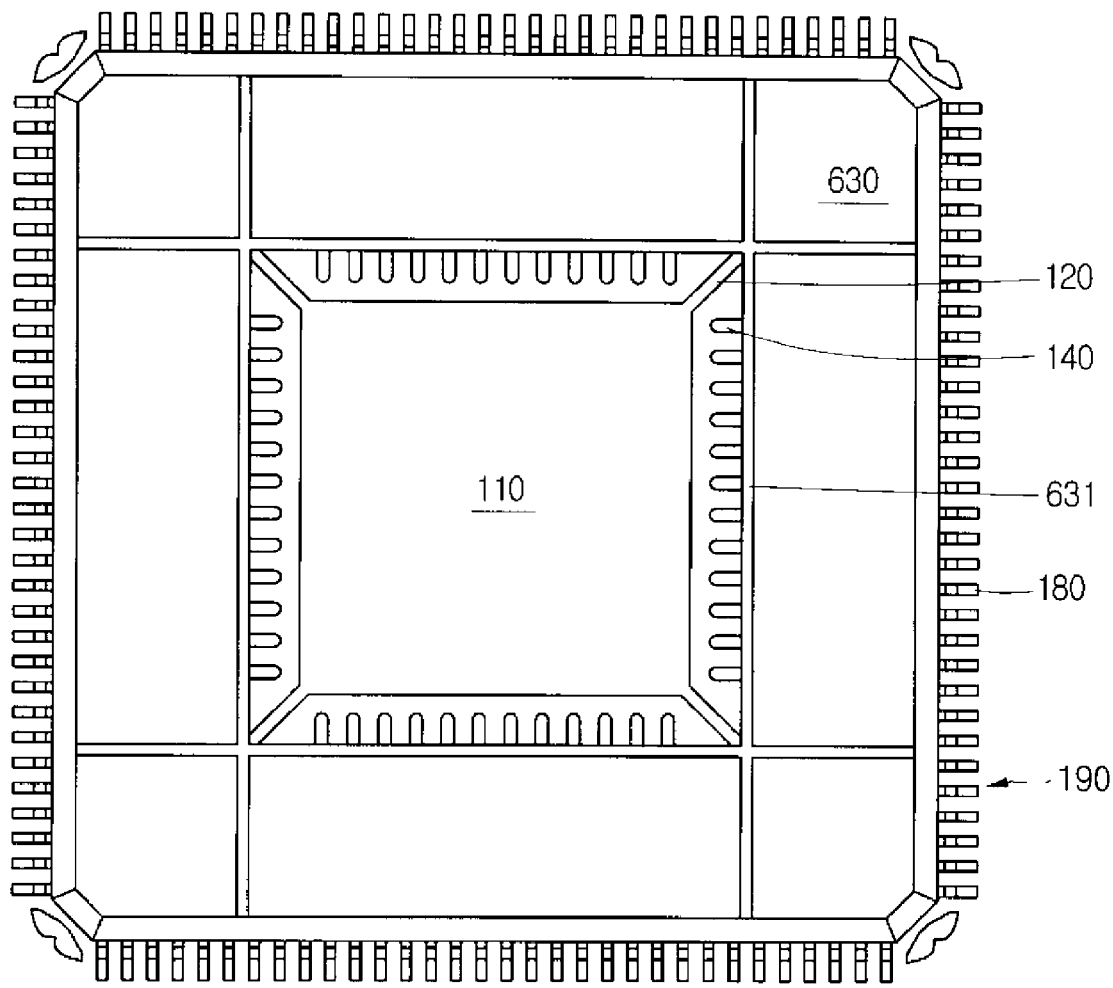

Referring now to FIGS. 11K and 11L, in the next step S10 of the fabrication process for the semiconductor package 600, the outer portions 180 of the second leads 190 protruding from the package body 630 are formed in appropriate shapes. Specifically, the exposed outer portions 180 may be formed into predetermined shapes using a lead forming tool 957 to allow the semiconductor package 600 to have a shape suitable for mounting to an external unit or an underlying substrate. Although the outer portions 180 are depicted as being formed outwardly relative to the package body 630 in FIG. 11K, those of ordinary skill in the art will recognize that the outer portions 180 can alternatively be formed downwardly and inwardly relative to the package body 630. Thereafter, portions of the tie bars 120 protruding outwardly from the package body 630 are cut to separate the semiconductor package 600 from the leadframe 100.

Figure 7A:
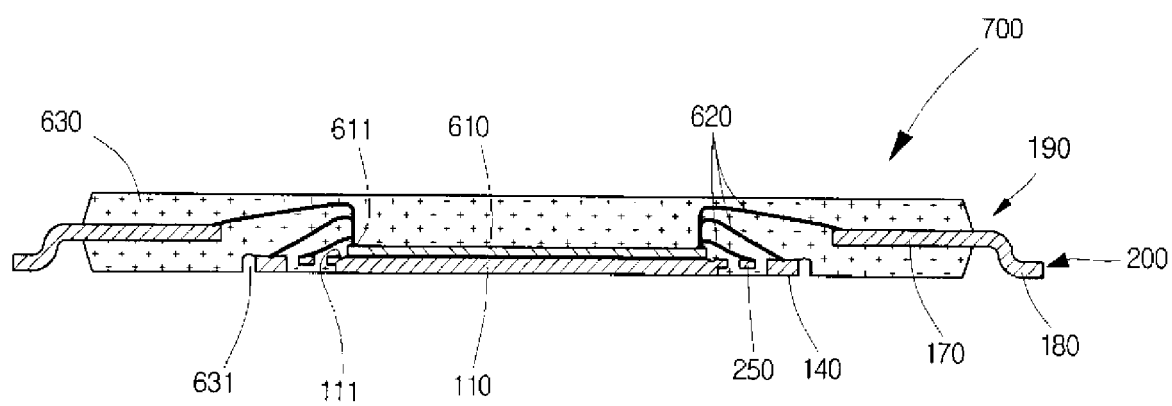
FIG. 7A is a cross-sectional view of a semiconductor package constructed in accordance with the present invention and including the leadframe shown in FIGS. 2A-2D subsequent to the singulation thereof.
Figure 7B:
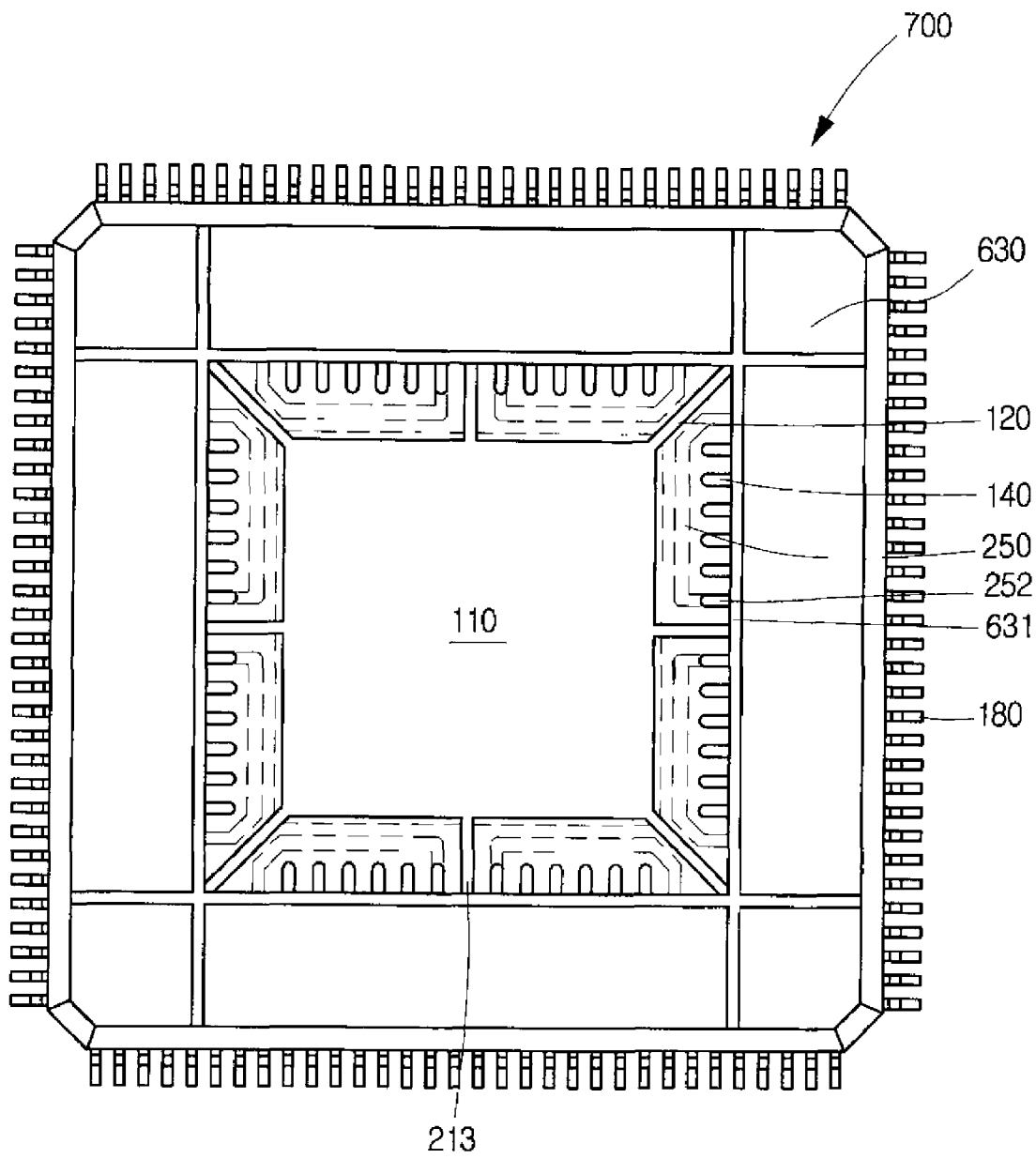
FIG. 7B is a bottom plan view of the semiconductor package shown in FIG. 7A.

Referring now to FIGS. 2A-2D, there is depicted a leadframe 200 for integration into a semiconductor package 700 constructed in accordance with a second embodiment of the present invention. The semiconductor package 700 is shown in FIGS. 7A and 7B. The leadframe 200 is substantially similar in structure to the leadframe 100, with only the differences between the leadframes 200, 100 being described below.

Figure 2A:
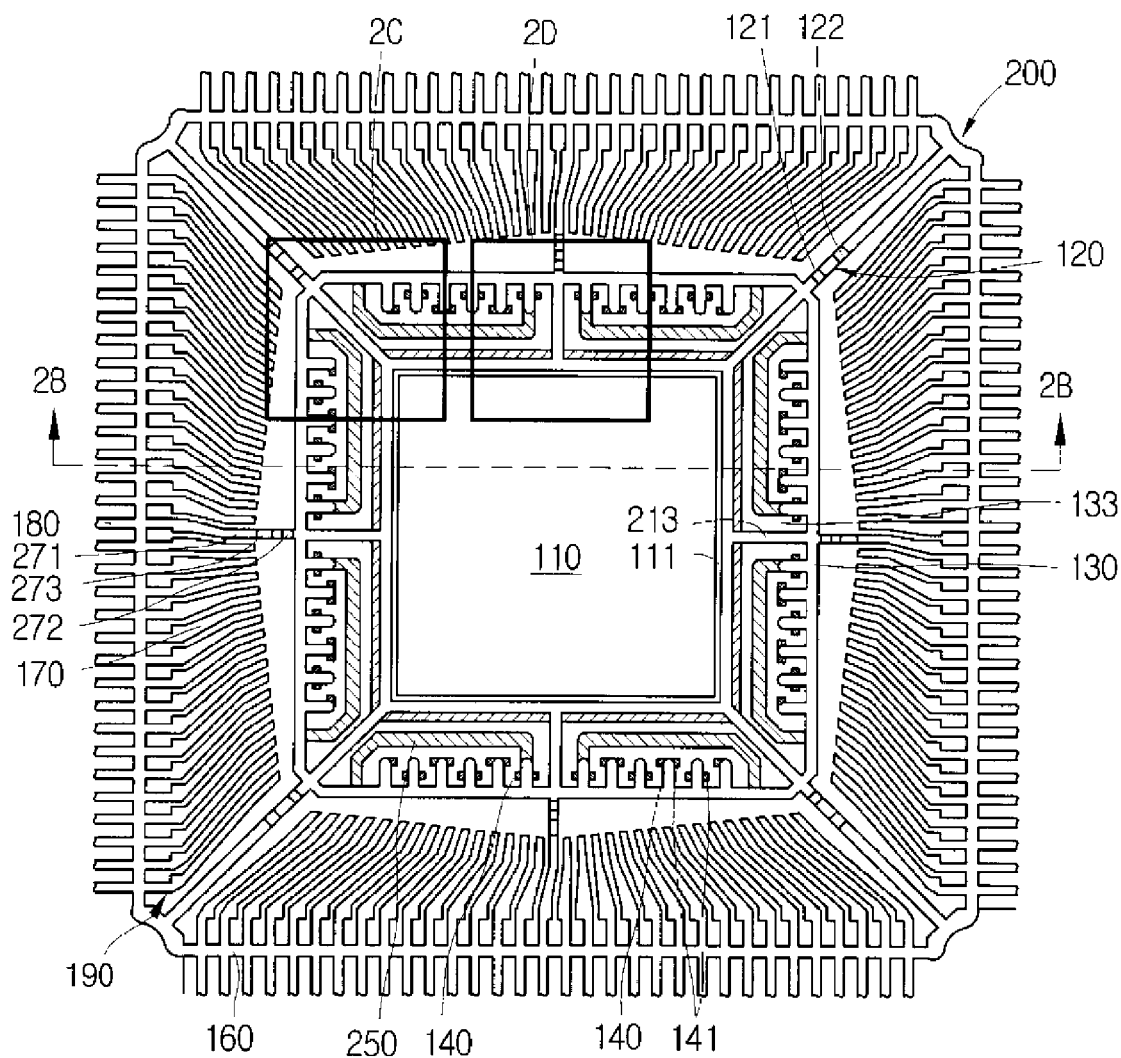
FIG. 2A is a top plan view of an unsingulated leadframe which is integrated into a semiconductor package constructed in accordance with a second embodiment of the present invention.
Figure 2B:
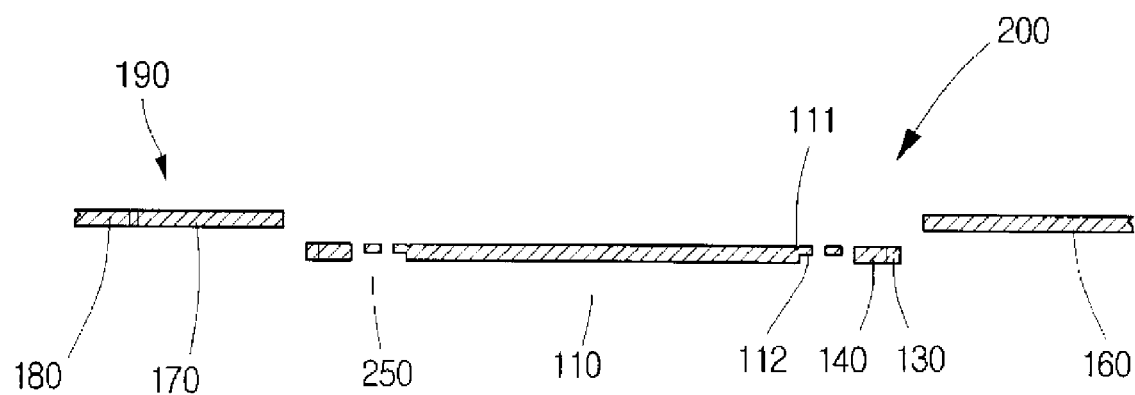
FIG. 2B is a cross-sectional view of the leadframe taken along line 2B-2B of FIG. 2A.
Figure 2C:
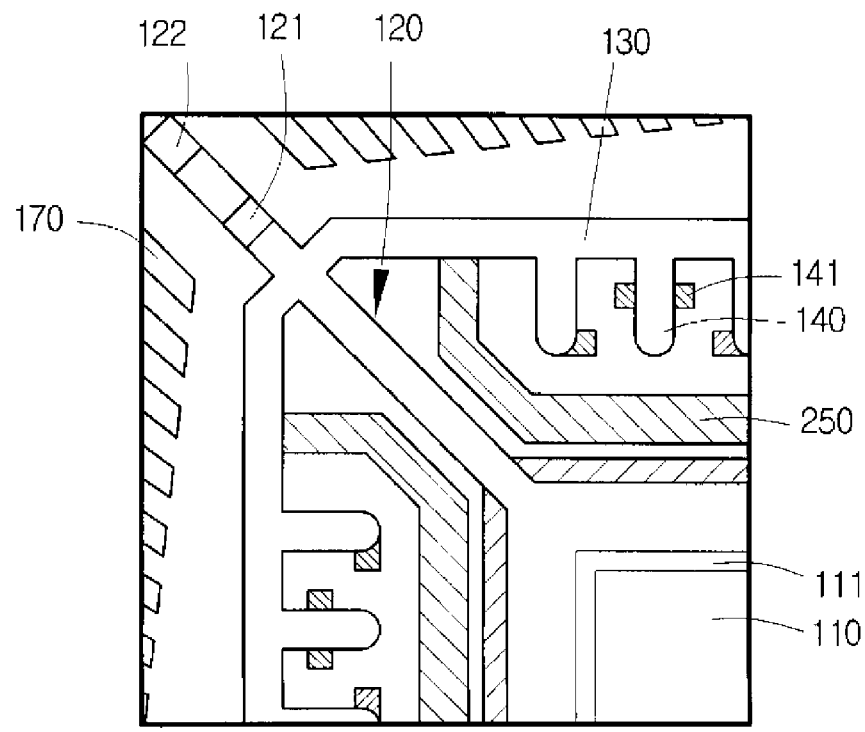
FIG. 2C is an enlargement of the region 2C included in FIG. 2A.
Figure 2D:
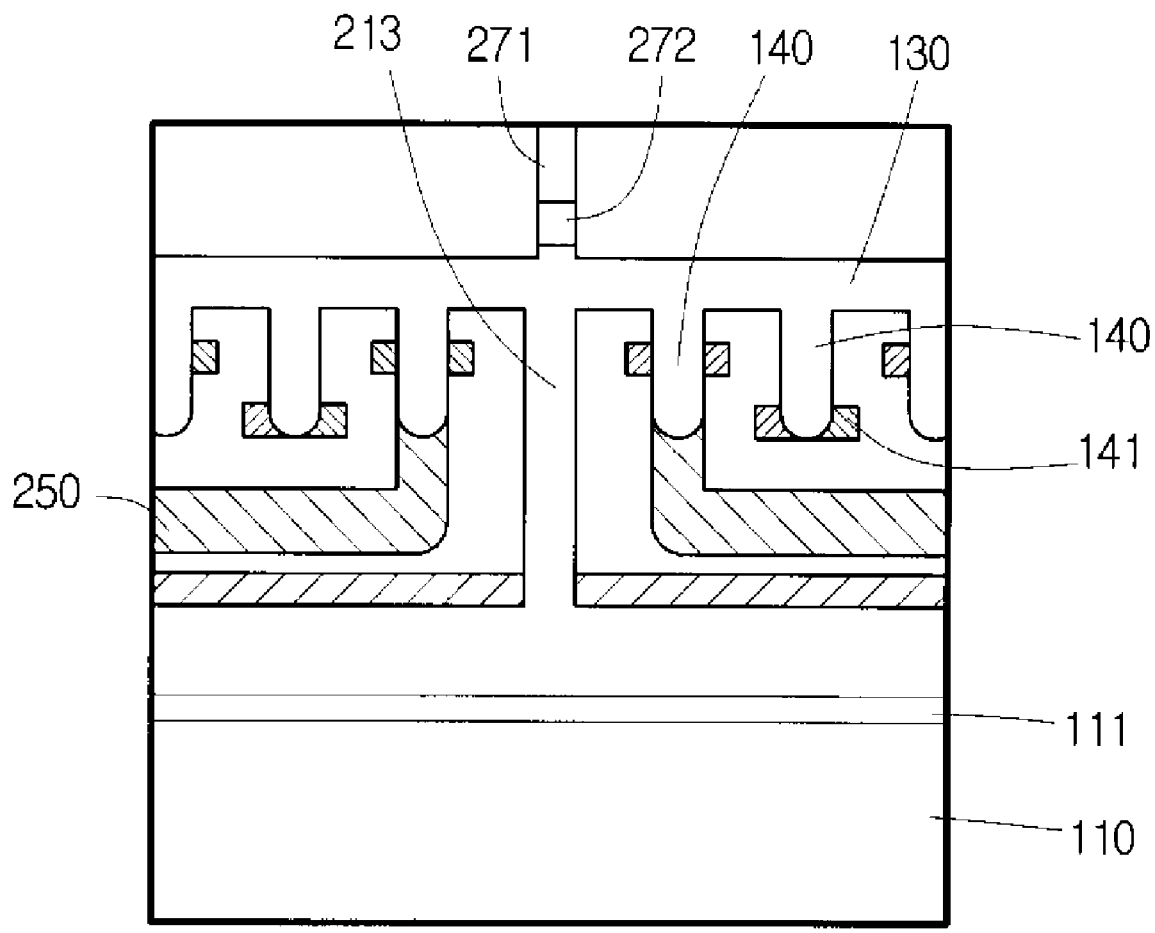
FIG. 2D is an enlargement of the region 2D included in FIG. 2A.

The primary distinction between the leadframes 200, 100 lies in the substitution of the power bars 150 described above in relation to the leadframe 100 with the power bars 250 included in the leadframe 200. More particularly, the leadframe 200, like the leadframe 100, includes eight power bars 250 which are also segregated into four sets of two power bars 250 each, the power bars 250 of each set extending between an adjacent pair of the tie bars 120. However, in contrast to the power bars 150 which are disposed between the land connecting bar 130 and second leads 190 and integrally connected to the land connecting bar 130 by the support bars 131, the power bars 250 in the leadframe 200 are each predominantly disposed between one set of the first leads 140 and a corresponding peripheral edge segment of the die pad 110. Additionally, the power bars 250 are each formed such that one end thereof is integrally connected to a corresponding peripheral segment of the land connecting bar 130, with the opposite end of the same power bar 250 being integrally connected to the distal end of one of the first leads 140 of the corresponding set thereof, as best shown in FIGS. 2A, 2C and 2E. In the leadframe 200, each of the power bars 250 is half-etched as indicated by the hatching included in FIGS. 2A, 2C and 2D. Thus, each of the power bars 250 defines a generally planar top surface which extends in generally co-planar relation to the top surfaces of the die pad 110 and leads 140, and a generally planar bottom surface which extends in generally co-planar relation to the half-etched portion 112 of the die pad 110.

A further distinction between the leadframes 200, 100 lies in the substitution of the support bars 113 of the leadframe 100 with the support bars 213 in the leadframe 200. In this regard, whereas the leadframe 100 included a multiplicity of support bars 113 segregated into four sets, the leadframe 200 includes only four support bars 213, each of which is integrally connected to and extends between the die pad 110 and the land connecting bar 130 between an adjacent pair of the tie bars 120. Additionally, whereas the support bars 113 of the leadframe 100 were each half-etched, the support bars 213 of the leadframe 200 are not half-etched. As is apparent from FIG. 2A, in the unsingulated leadframe 200, each of the eight power bars 250 included therein is disposed between one of the tie bars 120 and one of the support bars 213. Additionally, one end of each power bar 250 is integrally connected to the distal end of that first lead 140 of the corresponding set thereof which is disposed closest to a corresponding one of the support bars 213.

A further distinction between the leadframes 200, 100 lies in the structural attributes of certain ones of the second leads 190 of the leadframe 200, in comparison to the second leads 190 of the leadframe 100. More particularly, as indicated above, in the leadframe 100 the inner portions 170 of two of the second leads 190 of each of the four sets thereof include tie bar portions 171 which are integrally connected to respective ones of the power bars 151 of the corresponding set thereof. Since, in the leadframe 200, the power bars 250 of each set are not located between the land connecting bar 130 and the second leads 190, the inner portions 170 of the second leads 190 are not integrally connected to the power bars 250. Rather, in the leadframe 200, the inner portion 170 of only one of the second leads 190 of each set thereof is provided with a tie bar portion 271, such tie bar portion 271 being integrally connected to a corresponding peripheral segment of the land connecting bar 130 and substantially linearly aligned with a corresponding one of the support bars 213. Additionally, as seen in FIG. 2A, the tie bar portion 271 of each of the four second leads 190 including the same is bent to include a first downset 272 and a second downset 273. The first downset 272 of each tie bar portion 271 is disposed between the second downset 273 and the land connecting bar 130, with the second downset 273 being disposed between the first downset 272 and the inner portion 170 of that second lead 190 to which the tie bar portion 271 is integrally connected. Due to the inclusion of the first and second downsets 272, 273 therein, each of the tie bar portions 271 includes a first segment which is disposed between the land connecting bar 130 and the first downset 272 and extends in generally co-planar relation to the die pad 110 and the first leads 140, a second segment which extends between the first and second downsets 272, 273 and extends in generally co-planar relation to the second segments of the tie bars 120, and a third segment which extends between the second downset 273 and the inner portion 170 and extends in generally co-planar relation to the third segments of the tie bars 120. Thus, like the first, second and third segments of each tie bar 120, the first, second and third segments of each tie bar portion 271 reside on respective ones of three spaced, generally parallel planes, the plane upon which the second segment resides being disposed between those planes on which respective ones of the first and third segments reside.

As indicated above, the semiconductor package 700 as fabricated to include the leadframe 200 is shown in FIGS. 7A and 7B. The semiconductor package 700 is substantially similar to the above-described semiconductor package 600, with only the distinctions between the semiconductor packages 700, 600 being described below.

In the semiconductor package 700, the power bars 250 are completely covered by the package body 630. Thus, the power bars 250 are not exposed to the outside through the package body 630, thus preventing shorting between the tie bars 120 and the power bars 250 as could otherwise occur by the solder paste during mounting of the semiconductor package 700 to an underlying substrate such as a printed circuit board. The conductive wires 620 for power supply are connected to the semiconductor die 610 and are bonded to the top surfaces of the power bars 250. The bottom surface of the die pad 110, the bottom surfaces of the first segments of the tie bars 120, and the lands defined by the first leads 140 extend in generally co-planar relation to each other, and to the generally planar bottom surface of the package body 630 as shown in FIG. 7B, thus being exposed in the semiconductor package 700. Also exposed in the bottom surface of the package body 630 are the generally planar bottom surfaces of the support bars 213 which, as indicated above, are not half-etched. This is in contrast to the support bars 113 of the leadframe 100 which, due to their half-etching, are completely covered by the package body 630 in the semiconductor package 600. Since the generally planar bottom surfaces of the support bars 213 are exposed in the bottom surface of the package body 630 in the semiconductor package 700, the support bars 213 may also serve as grounds like the die pad 110. Those first leads 140 integrally connected to respective ones of the power bars 250 serve as power leads in the semiconductor package 700. As will be recognized by those of ordinary skill in the art, the fabrication methodology employed for the semiconductor package 700 of the second embodiment is substantially similar to that previously described in relation to the semiconductor package 600 of the first embodiment.

Figure 3A:
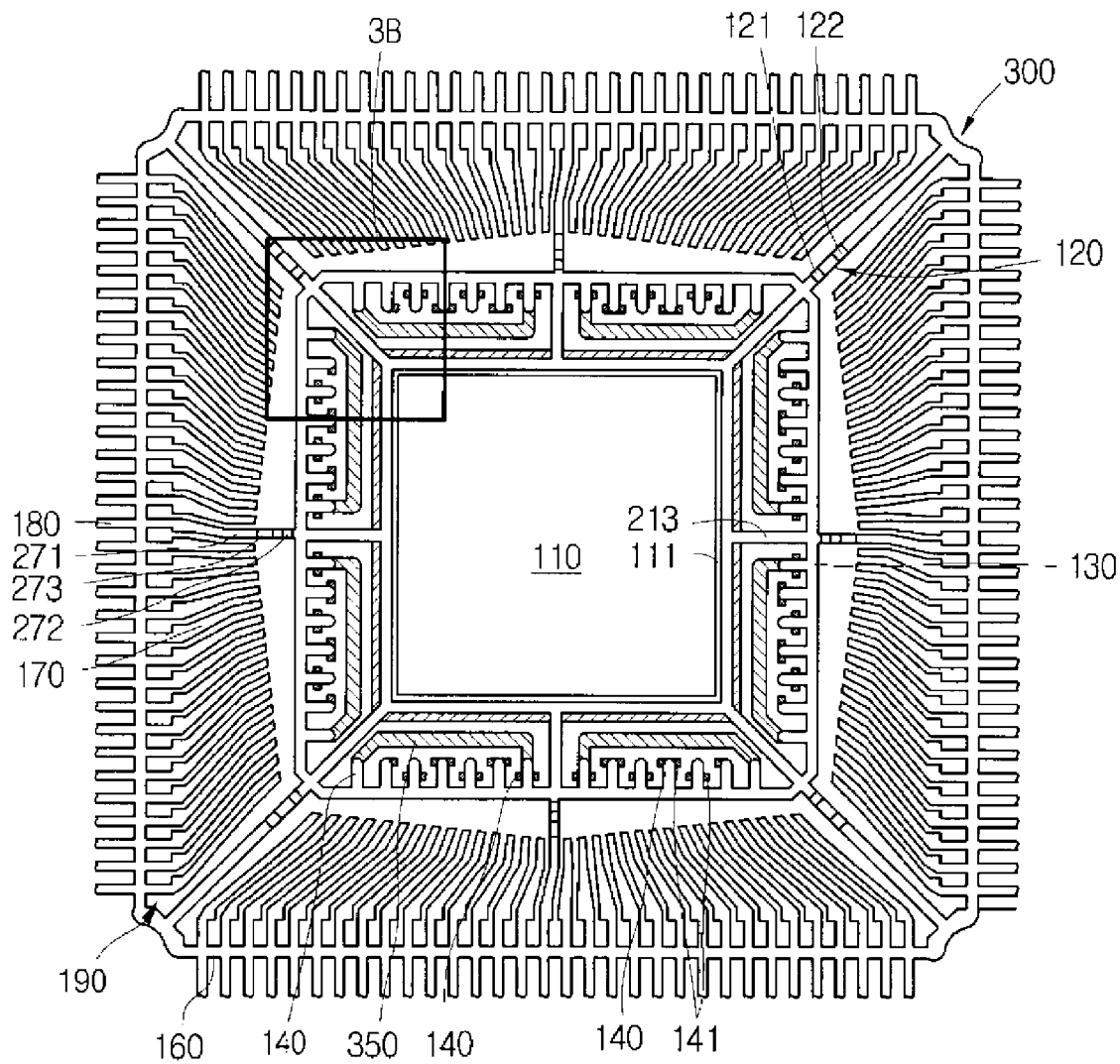
FIG. 3A is a top plan view of an unsingulated leadframe which is integrated into a semiconductor package constructed in accordance with a third embodiment of the present invention.
Figure 3B:
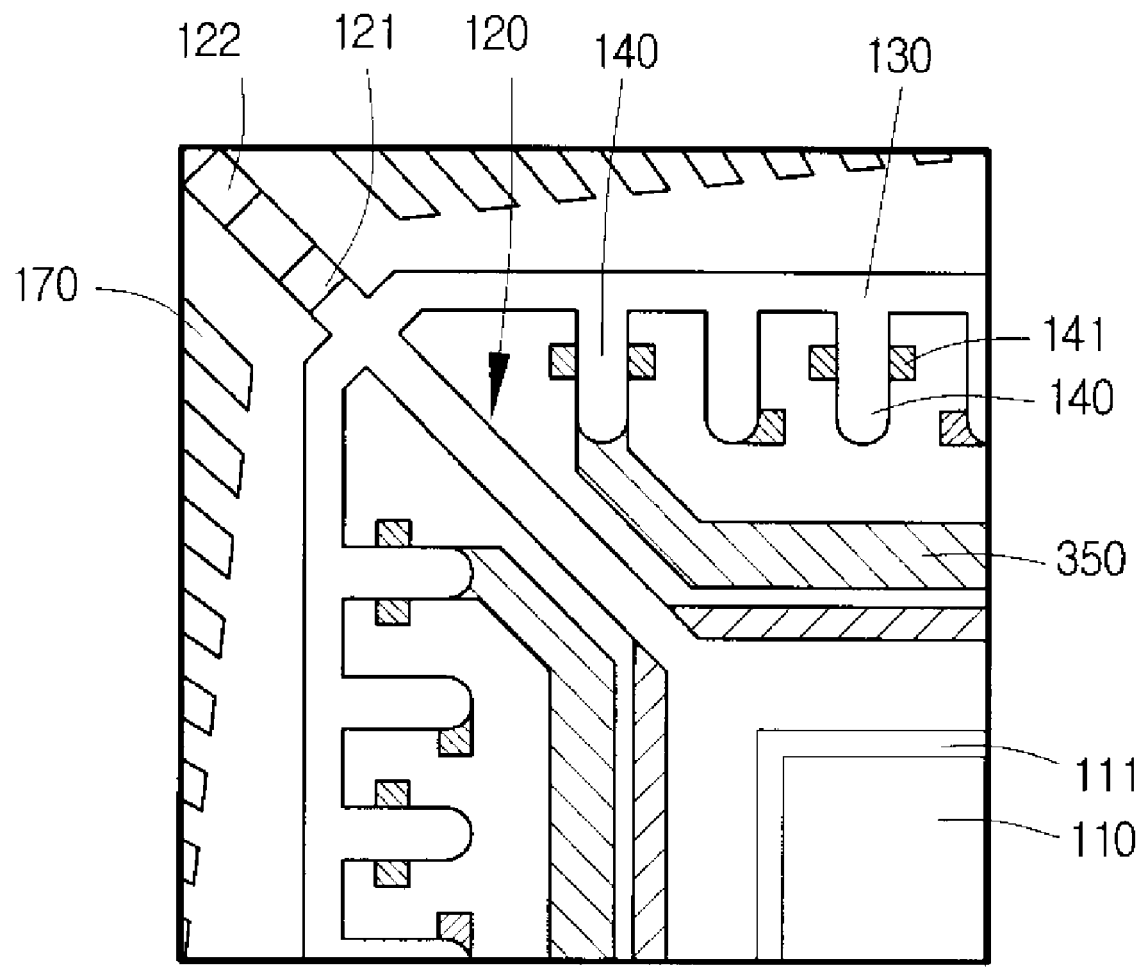
FIG. 3B is an enlargement of the region 3B included in FIG. 3A.
Figure 8:
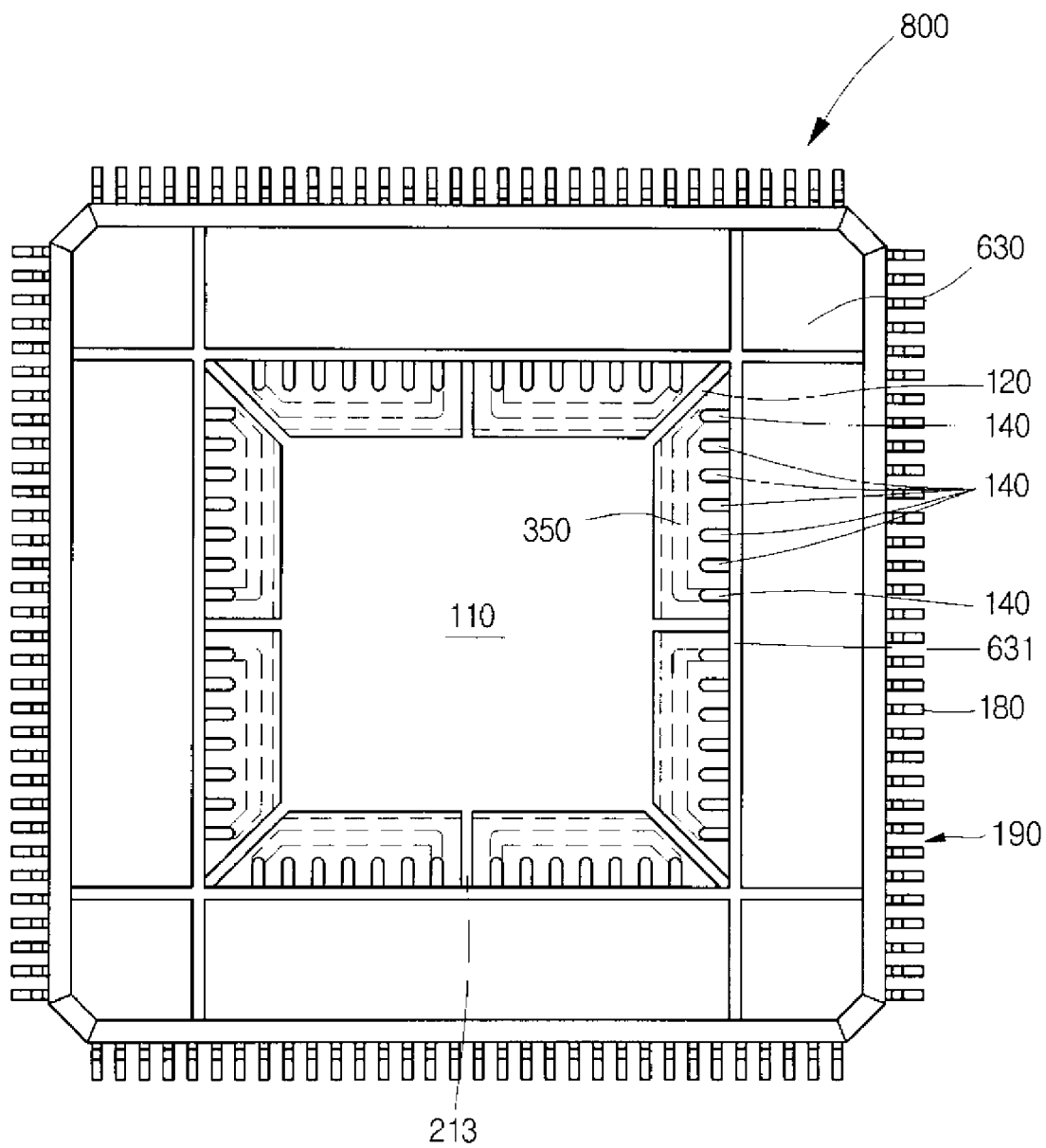
FIG. 8 is a bottom plan view of a semiconductor package constructed in accordance with the present invention and including the leadframe shown in FIGS. 3A-3B subsequent to the singulation thereof.

Referring now to FIGS. 3A and 3B, there is depicted a leadframe 300 for integration into a semiconductor package 800 constructed in accordance with a third embodiment of the present invention. The semiconductor package 800 is shown in FIG. 8. The leadframe 300 is substantially similar in structure to the leadframe 200, with only the differences between the leadframes 300, 200 being described below.

The sole distinction between the leadframes 300, 200 lies in the opposed ends of each of the power bars 350 of the leadframe 300 being integrally connected to the distal ends of respective ones of a spaced pair of the first leads 140 of the corresponding set thereof. This is in contrast to the leadframe 200 wherein, as indicated above, one end of each of the power bars 250 is integrally connected to the distal end of one of the first leads 140 of the corresponding set thereof, with the opposed end of the same power bar 250 being integrally connected to a corresponding peripheral segment of the land connecting bar 130. In the leadframe 300, each of the opposed ends of each power bar 350 is integrally connected to the distal end of a respective one of two first leads 140 of the corresponding set thereof. Thus, none of the power bars 350 in the leadframe 300 has a direct integral connection to the land connecting bar 130.

The semiconductor package 800 shown in FIG. 8 is virtually identical to the semiconductor package 700 described above in relation to FIGS. 7A and 7B. In the semiconductor package 800, those first leads 140 integrally connected to respective ones of the power bars 350 serve as power leads in the semiconductor package 800. Thus, whereas the semiconductor package 700 is shown in FIGS. 7A and 7B includes four power leads 140, the semiconductor package 800 includes eight power leads. As will be recognized by those of ordinary skill in the art, the fabrication methodology employed for the semiconductor package 800 of the third embodiment is substantially similar to that previously described in relation to the semiconductor package 600 of the first embodiment.

Figure 9:
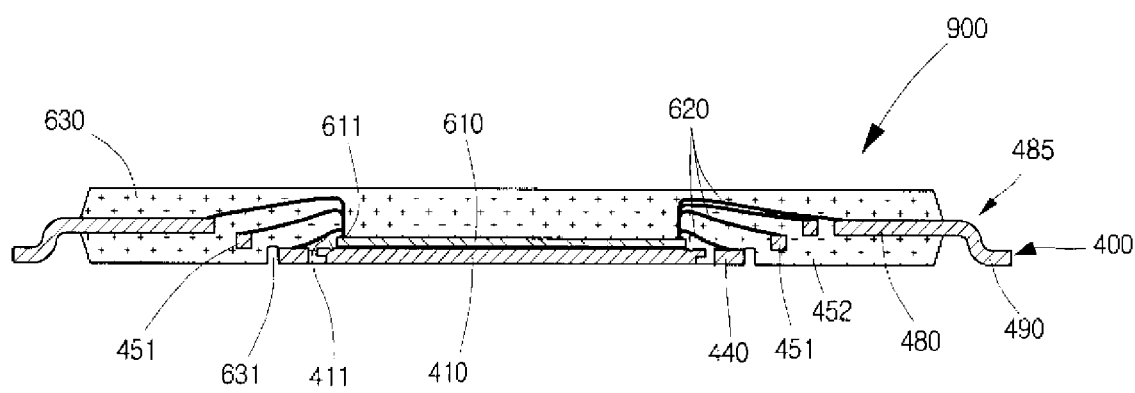
FIG. 9 is a cross-sectional view of a semiconductor package constructed in accordance with the present invention and including the leadframe shown in FIGS. 4A-4D subsequent to the singulation thereof.

Referring now to FIGS. 4A-4D, there is depicted a leadframe 400 for integration into a semiconductor package 900 constructed in accordance with a fourth embodiment of the present invention. The semiconductor package 900 is shown in FIG. 9.

Referring now to FIGS. 4A-4D, the leadframe 400 comprises a generally quadrangular (e.g., square) die pad 410 which defines opposed, generally planar top and bottom surfaces, and four peripheral edge segments. The die pad 410 is not of uniform thickness, but rather includes a half-etched portion 412 formed in a peripheral portion of the bottom surface thereof. The half-etched portion 412 of the die pad 410 mirrors the structural and functional attributes of the half-etched portion 112 of the die pad 110 described above in relation to the leadframe 100. In addition, disposed in the top surface of the die pad 410 is a continuous, generally quadrangular groove 411 which itself mirrors the structural and functional attributes of the groove 111 described above in relation to the die pad 110 of the leadframe 100.

Integrally connected to the die pad 410 is a plurality of support bars 420. The support bars 420 include four generally Y-shaped first support bars 420a which are integrally connected to and protrude diagonally from respective ones of the four corner regions defined by the die pad 410. In addition to the first support bars 420a, the support bars 420 include four generally straight or linear support bars 420b which are each integrally connected to and protrude generally perpendicularly from the approximate center of a respective one of the four peripheral edge segments defined by the die pad 410. As is apparent from FIG. 4A, none of the support bars 420 is half-etched. All of the support bars 420 also extend in generally co-planar relation to each other. The support bars 420 each have a generally planar top surface which extends in generally co-planar relation to the top surface of the die pad 410, and a generally planar bottom surface which extends in generally co-planar relation to the bottom surface of the die pad 410. As is further apparent from FIG. 4A, the first support bars 420a and the second support bars 420b are sized and configured relative to each other such that the distal ends of each support bar 420a are substantially aligned with the distal ends of respective ones of the adjacent pair of the support bars 420b.

Figure 4A:
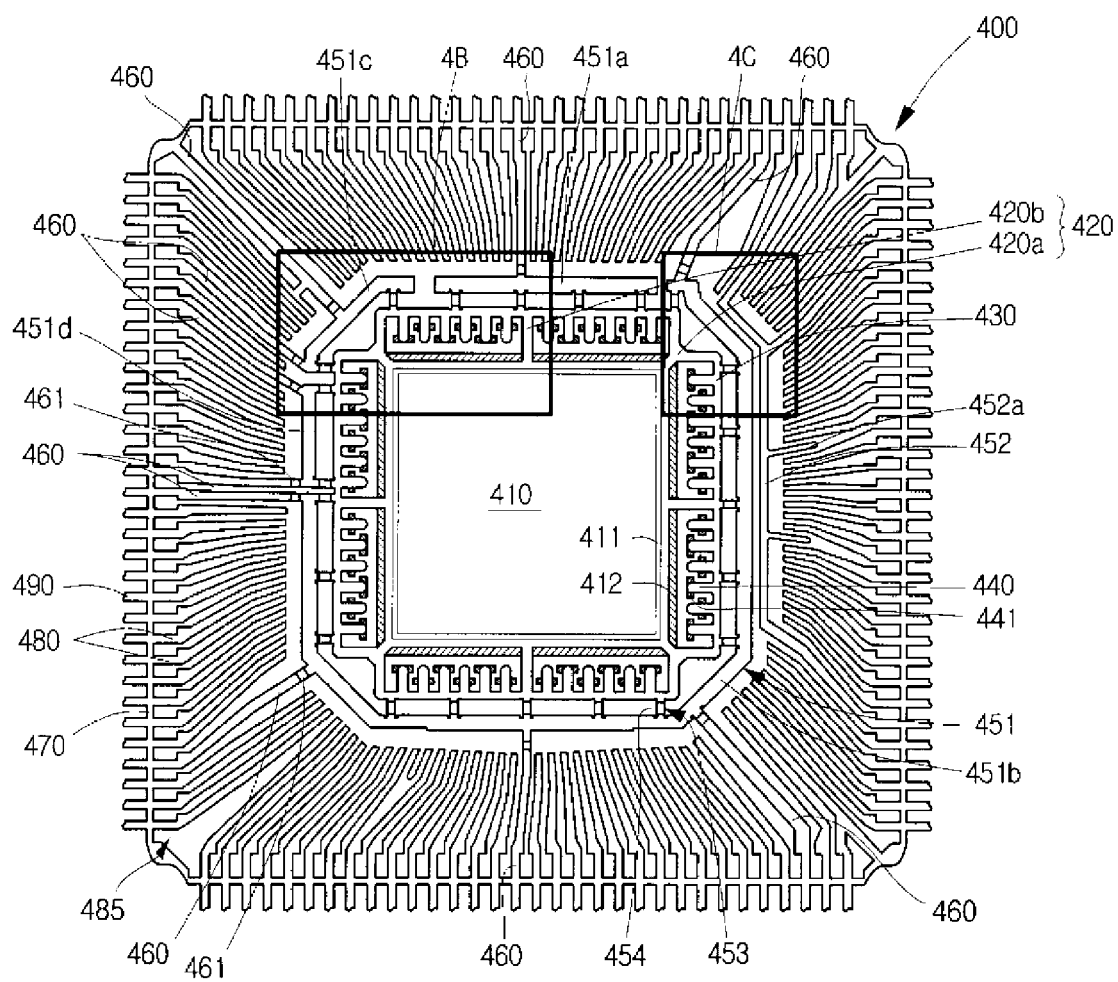
FIG. 4A is a top plan view of an unsingulated leadframe which is integrated into a semiconductor package constructed in accordance with a fourth embodiment of the present invention.

The leadframe 400 further comprises a plurality (e.g., four) land connecting bars 430. As seen in FIG. 4A, each of the land connecting bars 430 is integrally connected to an adjacent pair of the support bars 420a and the intervening one of the support bars 420b. Thus, each of the connecting bars 430 extends in spaced, generally parallel relation to a respective one of the peripheral edge segments defined by the die pad 410. By virtue of their attachment to the die pad 410 via the support bars 420, the flatness of the land connecting bars 430 is maintained in the leadframe 400. The land connecting bars 430 are ultimately removed from the completed semiconductor package 900 to facilitate the electrical isolation of various structural features of the leadframe 400 from each other in the fabrication process for the semiconductor package 900.

The leadframe 400 further comprises a plurality of first leads 440 which are each integrally connected to a respective one of the land connecting bars 430, and protrude inwardly toward the die pad 410. More particularly, the first leads 440 are segregated into four sets, with each set of the first leads 440 protruding inwardly from a respective one of the land connecting bars 430 toward the adjacent peripheral edge segment of the die pad 110. The first leads 440 of each set are arranged at a predetermined pitch and protrude perpendicularly inward at a predetermined length from a respective one of the land connecting bars 430. Each of the first leads 440 has a generally planar top surface which extends in generally co-planar relation to the top surface of the die pad 410, and a generally planar bottom surface which extends in generally co-planar relation to the bottom surface of the die pad 410 and defines a land. Additionally, each of the first leads 440 may be formed to include one or more integral locking protrusions 441. The locking protrusions 441 mirror the structural and functional attributes described above in relation to the locking protrusions 141 of the first leads 140 included in the leadframe 100.

Figure 4B:
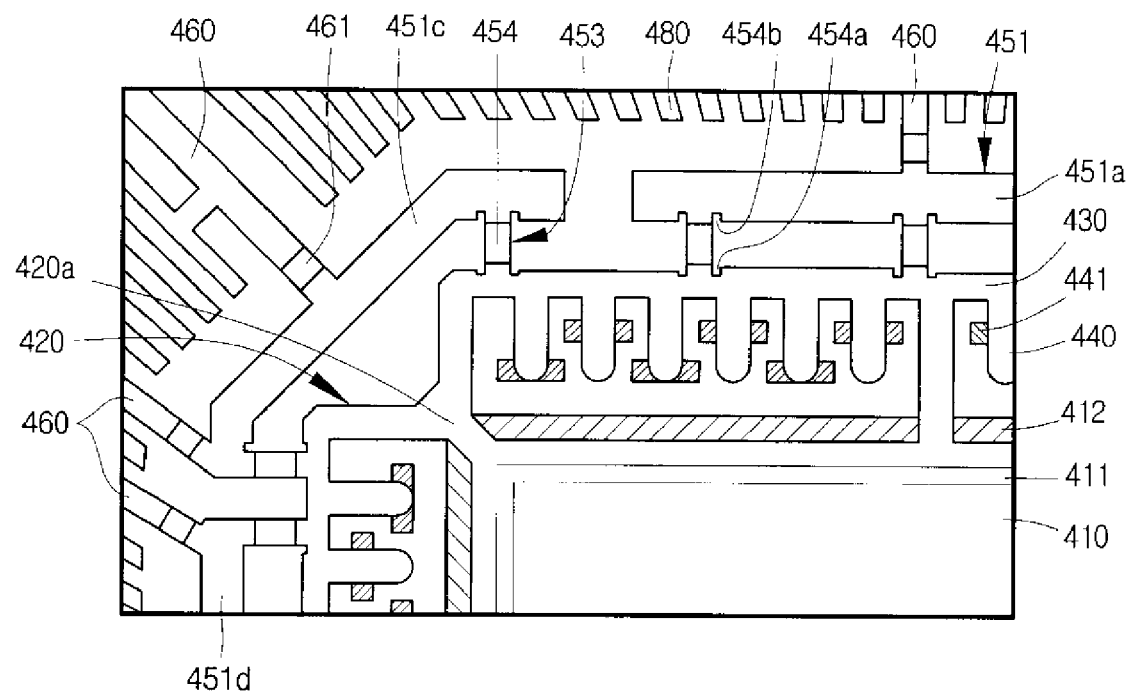
FIG. 4B is an enlargement of the region 4B included in FIG. 4A.
Figure 4C:
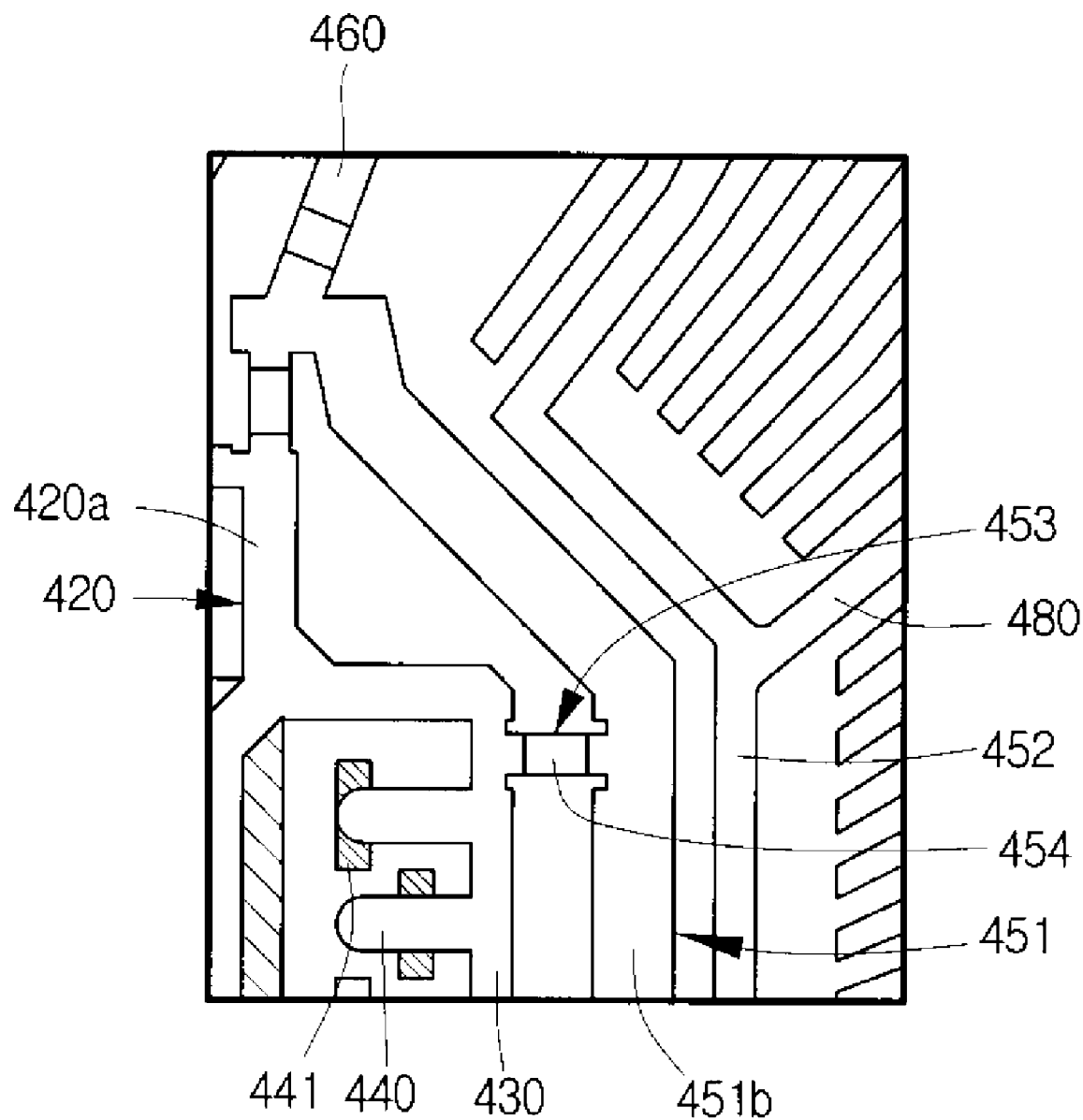
FIG. 4C is an enlargement of the region 4C included in FIG. 4A.

As seen in FIGS. 4A-4C, the leadframe 400 further comprises a plurality (e.g., four) primary power bars 451. The primary power bars 451 include a first power bar 451a, a second power bar 451b, a third power bar 451c, and a fourth power bar 451d. In the leadframe 400, the first power bar 452a has a generally linear configuration, and is integrally connected to an adjacent one of the land connecting bars 430 by one or more support bars 453. In this regard, the first power bar 451a and the adjacent land connecting bar 430 to which it is integrally connected extend in spaced, generally parallel relation to each other. In FIG. 4A, four support bars 453 are depicted as attaching the first power bar 451a to the adjacent land connecting bar 430. However, those of ordinary skill in the art will recognize that greater or fewer than four support bars 453 may be used to facilitate such integral connection without departing from the spirit and scope of the present invention.

As is further seen in FIG. 4A, the second power bar 451b of the primary power bars 451 is integrally connected to all four of the land connecting bars 430 by a plurality of the support bars 453. In this regard, the second power bar 451b defines three peripheral segments which extend in spaced, generally parallel relation to respective ones of three of the four land connecting bars 430 to which the second power bar 451b is integrally connected. In FIG. 4A, fourteen support bars 453 are depicted as attaching the second power bar 451b to each of the four land connecting bars 430. However, those of ordinary skill in the art will recognize that greater or fewer than fourteen support bars 453 may be used to facilitate such integral connection without departing from the spirit and scope of the present invention.

As is further seen in FIG. 4A, the third power bar 451c is integrally connected to two of the land connecting bars 430 by respective ones of a pair of the support bars 453. Additionally, the third power bar 451c is oriented so as to extend diagonally along one of the four corner regions of the die pad 410 in spaced relation thereto. Though two support bars 453 are depicted as attaching the third power bar 451c to respective ones of two of the land connecting bars 430, it will be recognized that the power bar 451c may alternatively be integrally connected to only one land connecting bar 430 by one support bar 453 without departing from the spirit and scope of the present invention.

As is also seen in FIG. 4A, the fourth power bar 451d has a generally linear configuration, and is integrally connected to an adjacent one of the land connecting bars 430 by one or more support bars 453. In this regard, the fourth power bar 451d and the adjacent land connecting bar 430 to which it is integrally connected extend in spaced, generally parallel relation to each other. In FIG. 4A, two support bars 453 are depicted as attaching the fourth power bar 451d to the adjacent land connecting bar 430. However, those of ordinary skill in the art will recognize that greater or fewer than four support bars 453 may be used to facilitate such integral connection without departing from the spirit and scope of the present invention.

In the leadframe 400, each support bar 453 is bent to include a downset 454 therein. As a result of the inclusion of the downsets 454 in the support bars 453, each of the primary power bars 451 resides on a plane which is elevated above a common plane upon which the die pad 410, the first leads 440, and the land connecting bars 430 reside. Thus, as seen in FIG. 9, each of the primary power bars 451 defines a generally planar bottom surface which extends in generally co-planar relation to the generally planar top surfaces of the first leads 440, and the die pad 410. As best seen in FIGS. 4B and 4C, stress-relieving grooves or notches 454a are provided at the point of intersection between each support bar 453 and a respective one of the land connecting bars 430. Similarly, stress-relieving grooves or notches 454b are provided at the point of intersection between each support bar 453 and a respective one of the primary power bars 451. The notches 454a, 454b absorb stress arising from the formation of the downsets 454 within the support bars 453, thus assisting in maintaining the flatness and uniformity of both the primary power bars 451 and the land connecting bars 430 (and hence the first leads 440).

The leadframe 400 further comprises a dambar 470 which circumvents the die pad 410, the land connecting bars 430, and the primary power bars 451. The dambar 470 is provided in the form of a substantially quadrangular (e.g., square) ring. The dambar 470 defines four peripheral segments which extend in spaced, generally parallel relation to respective ones of the peripheral edge segments of the die pad 410. Additionally, the dambar 470 is integrally connected to each of the primary power bars 451 by a plurality of tie bars 460. As seen in FIG. 4A, each of the tie bars 460 is bent to include a downset 461 therein. As a result of the inclusion of the downsets 461 in the tie bars 460, the dambar 470 resides on a plane which is elevated above the plane upon which the primary power bars 451 reside. Thus, in the leadframe 400, the primary power bars 451 reside on a second plane which is disposed between and in generally parallel relation to a first plane upon which the die pad 410, first leads 440 and land connecting bars 430 reside, and a third plane upon which the dambar 470 resides. In the fabrication process for the semiconductor package 900, the dambar 470 is singulated or removed from the leadframe 400 to electrically isolate other structural features of the leadframe 400 from each other as will be described in more detail below. In FIG. 4A, ten tie bars 460 are shown as integrally connecting the primary power bars 451 to the dambar 470. However, those of ordinary skill in the art will recognize that such integral connection may be facilitated by greater or fewer than ten tie bars 460 extending between the dambar 470 and the primary power bars 451 in patterns or arrangements differing from that shown in FIG. 4A without departing from the spirit and scope of the present invention. The tie bars 460 work in conjunction with the support bars 453 to maintain the flatness of the primary power bars 451. In the leadframe 400, the Y-shaped configurations of the support bars 420a help reduce stress in the leadframe 400 arising from the bending of the tie bars 460 as occurs during the formation of the downsets 461 therein. This stress reduction assists in preventing any undesirable shifting or dislocation of the land connecting bars 430, and hence the first leads 440.

The leadframe 400 further comprises a plurality of second leads 485 which are integrally connected to the dambar 470 and, like the first leads 440, preferably segregated into four sets. In this regard, the second leads 485 of each set extend generally perpendicularly relative to a respective one of the peripheral edge segments of the dambar 470 at predetermined lengths, and are arranged at a predetermined pitch. Each of the second leads 485 define an inner portion 480 which extends inwardly from a corresponding peripheral segment of the dambar 470 toward the die pad 410. The inner portions 480 each preferably have an angled configuration so as to be disposed closer to a respective one of the peripheral edge segments of the die pad 410. In addition to the inner portion 480, each of the second leads 485 includes an outer portion 490 which extends outwardly from a corresponding peripheral segment of the dambar 470 away from the die pad 410. In the leadframe 400, the second leads 485 and the dambar 470 reside on the common third plane described above, and thus extend in generally co-planar relation to each other. As a result, as seen in FIG. 9, the inner portions 480 of the second leads 485 are elevated above the primary power bars 451. The singulation or removal of the dambar 470 in the process of fabricating the semiconductor package 900 facilitates the electrical isolation of the second leads 485 from each other. Additionally, as seen in FIG. 9, the outer portions 490 of the second leads 485 ultimately protrude from respective side surfaces of the package body in the completed semiconductor package 900, and are each bent to assume a gull-wing configuration.

As is apparent from FIG. 4A, the primary power bars 451 of the leadframe 400 are each disposed between one or more of the land connecting bars 430, and the inner portions 480 of at least some of the second leads 485. Additionally, in the leadframe 400, the tie bars 460 are extended or interleaved between adjacent pairs of the second leads 485, and more particularly the inner portions 480 thereof. Those of ordinary skill in the art will recognize that the number, shape and arrangement of the second leads 485 as shown in FIG. 4A is exemplary only, and may be varied without departing from the spirit and scope of the present invention. Along these lines, though the primary power bars 451 are shown in FIG. 4A and described above as comprising the first, second, third and fourth power bars 451a-d, those of ordinary skill in the art will recognize that greater or fewer than four primary power bars 451 may be included in the leadframe 400, and provided in shapes and/or arrangements differing from that shown in FIG. 4A without departing from the spirit and scope of the present invention. The primary power bars 451 are used to provide the same functionality described above in relation to the power bars 150 of the leadframe 100.

Figure 4D:
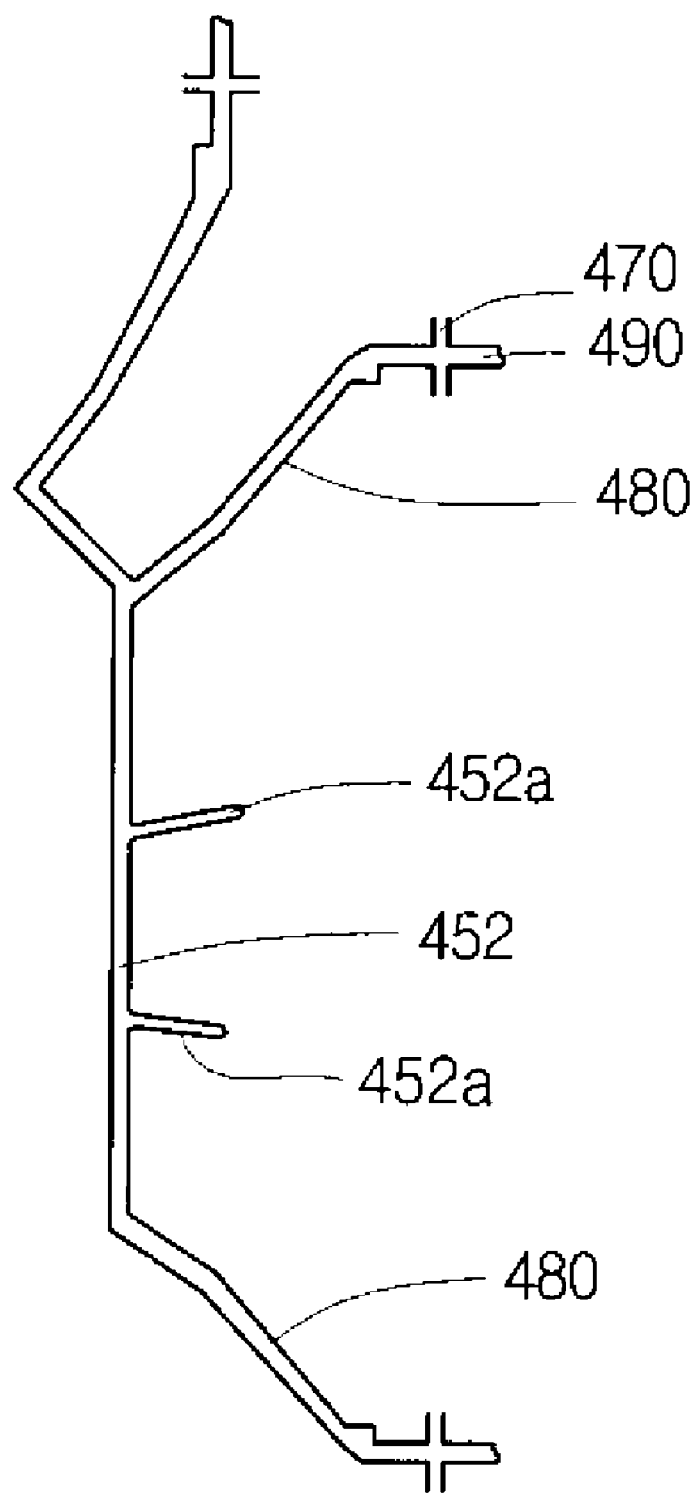
FIG. 4D is a top plan view of an exemplary power bar which is integrated into the leadframe shown in FIG. 4A.

As best seen in FIGS. 4A and 4D, the leadframe 400 further comprises a secondary power bar 452 which is integrally connected to the inner portions 480 of a plurality of the second leads 485. As shown in FIG. 4A, the secondary power bar 452 is integrally connected to three second leads 485, though those of ordinary skill in the art will recognize that the secondary power bar 452 may be integrally connected to greater or less than three second leads 485 without departing from the spirit and scope of the present invention. The secondary power bar 452 also extends in generally co-planar relation to the inner portions 480 of the second leads 485, and thus resides on the above-described third plane which includes the dambar 470. As a result, the secondary power bar is elevated above the primary power bars 451.

As shown in FIG. 4A, the secondary power bar 452 extends between at least one of the primary power bars 451, and the inner portions 480 of at least some of the second leads 485. As best seen in FIGS. 4A and 4D, it is contemplated that the secondary power bar 452 may be provided with one, two or more integral extension lead portions 452a which each extend between and in spaced relation to an adjacent pair of the inner portions 480 of the second leads 485. These extension leads 452a are adapted to interact with a tape layer (not shown) which may be attached over the extension leads 452a and at least some of the inner portions 480 of the second leads 485 maintain the flatness of the secondary power bar 452. In the leadframe 400, different power levels can be supplied to a semiconductor die in the semiconductor package 900 through the primary power bars 451 and the secondary power bar 452. The leadframe 400 may be fabricated from the same materials described above in relation to the leadframe 100.

As indicated above, the semiconductor package 900 as fabricated to include the leadframe 400 is shown in FIG. 9. The semiconductor package 900 is substantially similar to the above-described semiconductor package 600, with only the distinctions between the semiconductor packages 900, 600 being described below.

In the semiconductor package 900, the primary power bars 451 and the secondary power bar 452 are completely covered by the package body 630. Thus, the primary power bars 451 and secondary power bar 452 are not exposed to the outside through the package body 630. The conductive wires 620 for power supply are connected to the semiconductor die 610 and are bonded to the top surfaces of the primary and secondary power bars 451, 452. The bottom surface of the die pad 410, the bottom surfaces of the support bars 420, and the lands defined by the first leads 440 extend in generally co-planar relation to each other, and to the generally planar bottom surface of the package body 630 as shown in FIG. 9, thus being exposed in the semiconductor package 900. As indicated above, the outer portions 490 of the second leads 485 protrude from respective side surfaces of the package body 630, and are each bent to assume a gull-wing configuration. It is also contemplated that the removal of the dambar 470 will electrically isolate the second leads 485 from the tie bars 460, and that the tie bars 460 will include outer portions which, like the outer portions 490 of the second leads 485, protrude from respective side surfaces of the package body 630. Since the tie bars 460 are integrally connected to one or more of the primary power bars 451, the exposed outer portions thereof may be used for power transmission or grounding, and will be bent to assume the same configurations as the outer portions 490 of the second leads 485 between which they are positioned. As will be recognized by those of ordinary skill in the art, the fabrication methodology employed for the semiconductor package 900 is substantially similar to that previously described in relation to the semiconductor package 600.

Figure 5A:
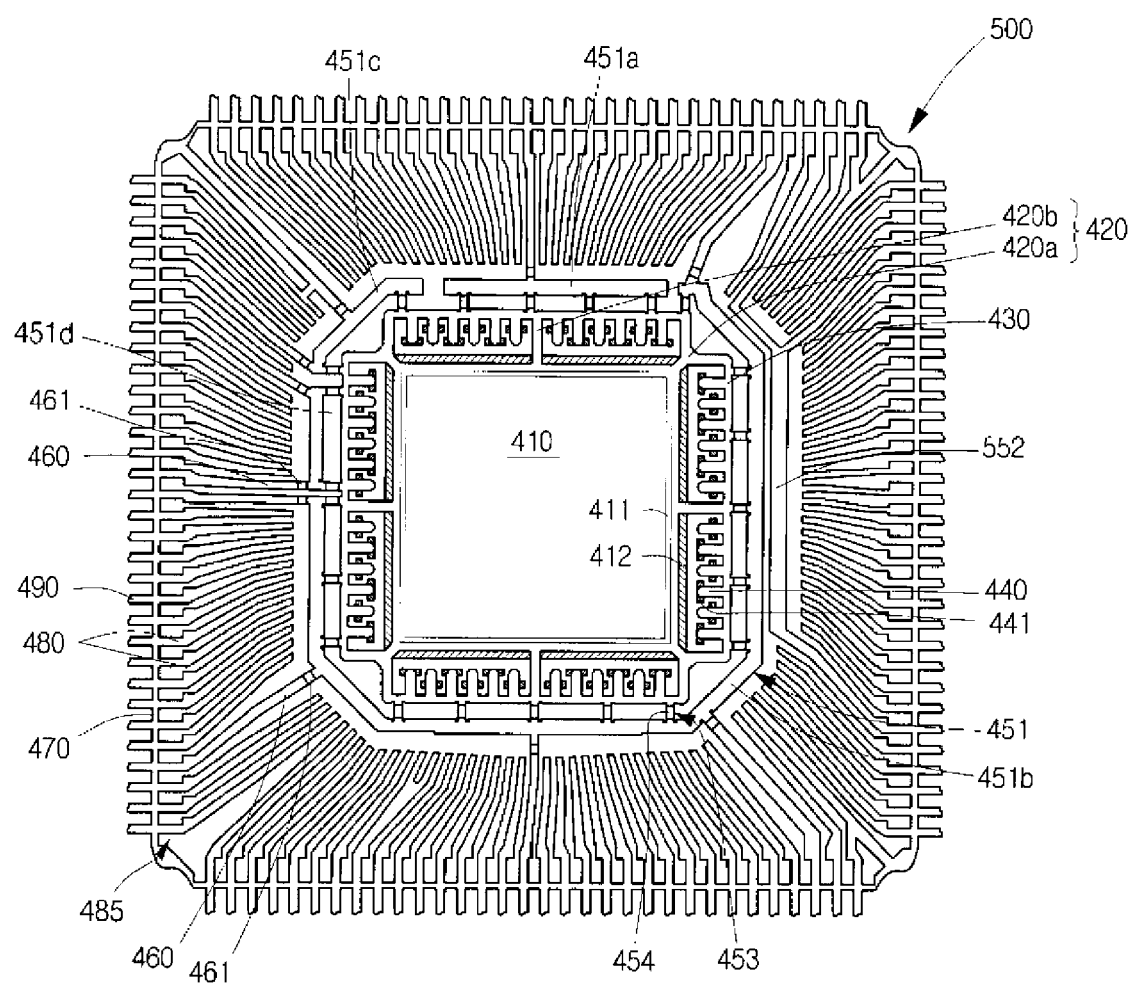
FIG. 5A is a top plan view of an unsingulated leadframe which is integrated into a semiconductor package constructed in accordance with a fifth embodiment of the present invention.
Figure 5B:
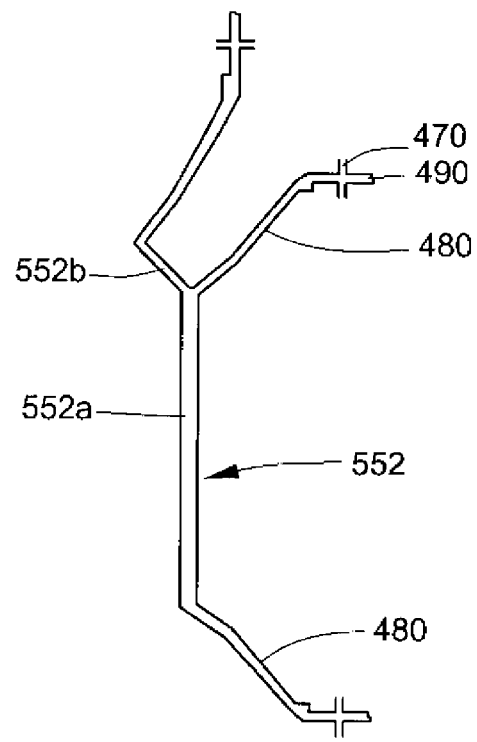
FIG. 5B is a top plan view of an exemplary power bar which is integrated into the leadframe shown in FIG. 5A.

Referring now to FIGS. 5A and 5B, there is depicted a leadframe 500 for integration into a semiconductor package 800 constructed in accordance with a fifth embodiment of the present invention. The leadframe 500 is substantially identical in structure to the leadframe 400, with only the differences between the leadframes 500, 400 being described below.

The sole distinction between the leadframes 500, 400 lies in the structural features of the secondary power bar 552 in the leadframe 500, in comparison to the secondary power bar 452 in the leadframe 400. More particularly, the secondary power bar 552 does not include structures analogous to the extension lead portions 452a of the secondary power bar 452 described above. Additionally, the secondary power bar 552 is provided with a first region 552a which is of a first width, and a second region 552b which is of a second width less than the first width. The presence of the first region 552a can contribute to a reduction in the resistance of the secondary power bar 552. Additionally, the absence of structures similar to the aforementioned extension lead portions 452a in the secondary power bar 552 reduces unnecessary loss of signals and prevents the inner portions 480 of the second leads 485 in the leadframe 500 from being narrowed in width.

Figure 12A:
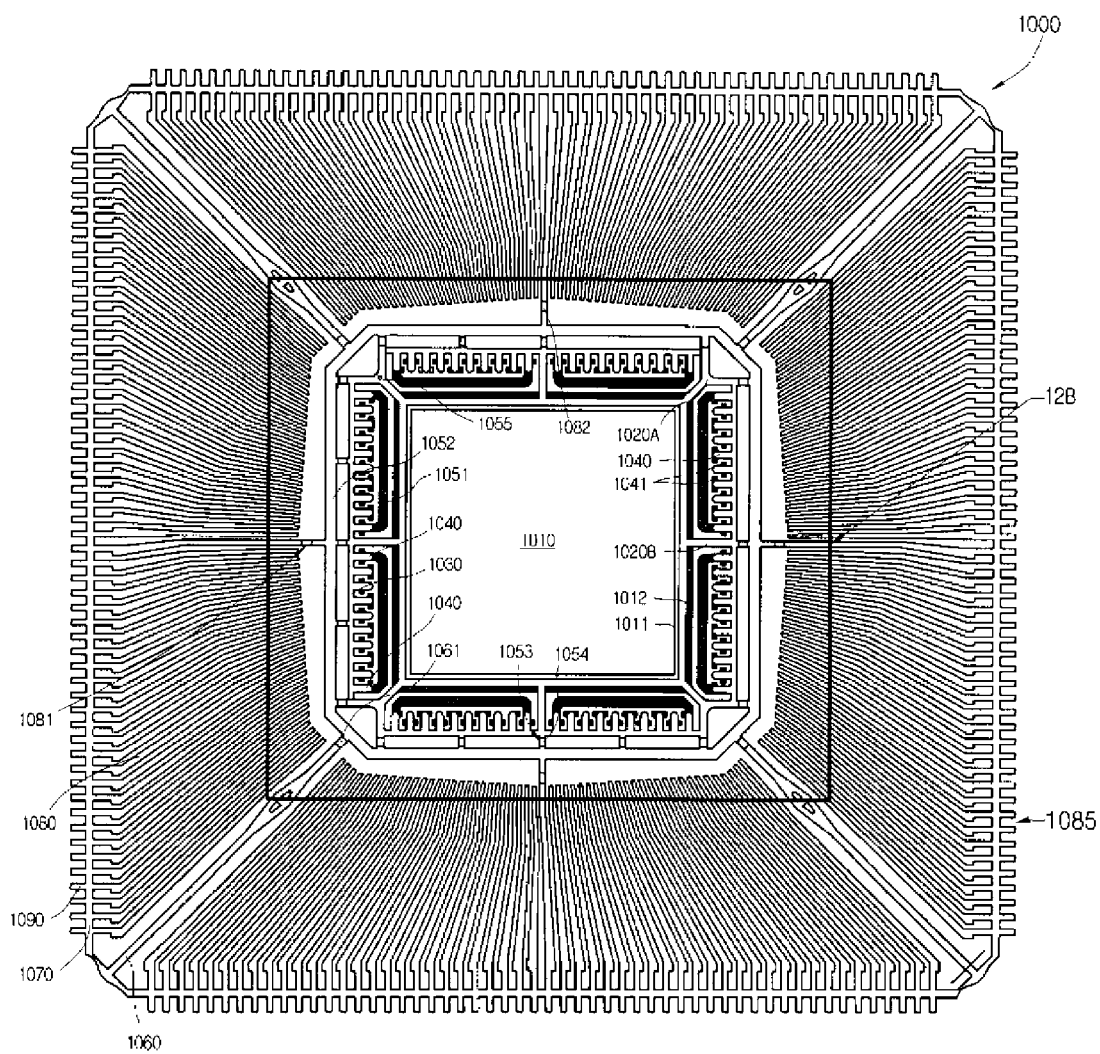
FIG. 12A is a top plan view of an unsingulated leadframe which is integrated into a semiconductor package constructed in accordance with a sixth embodiment of the present invention.
Figure 12B:
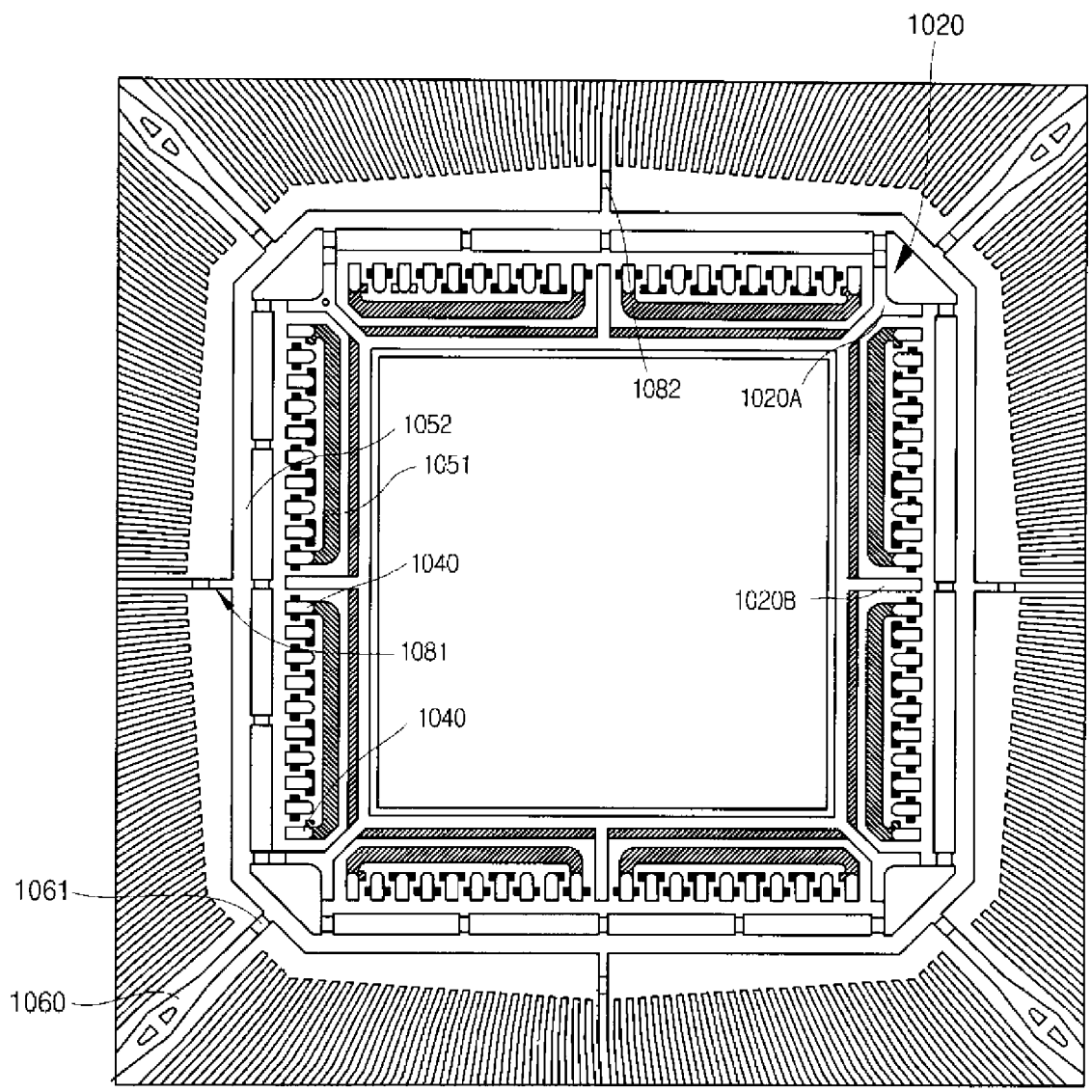
FIG. 12B is an enlargement of the region 12B included in FIG. 12A.
Figure 13:
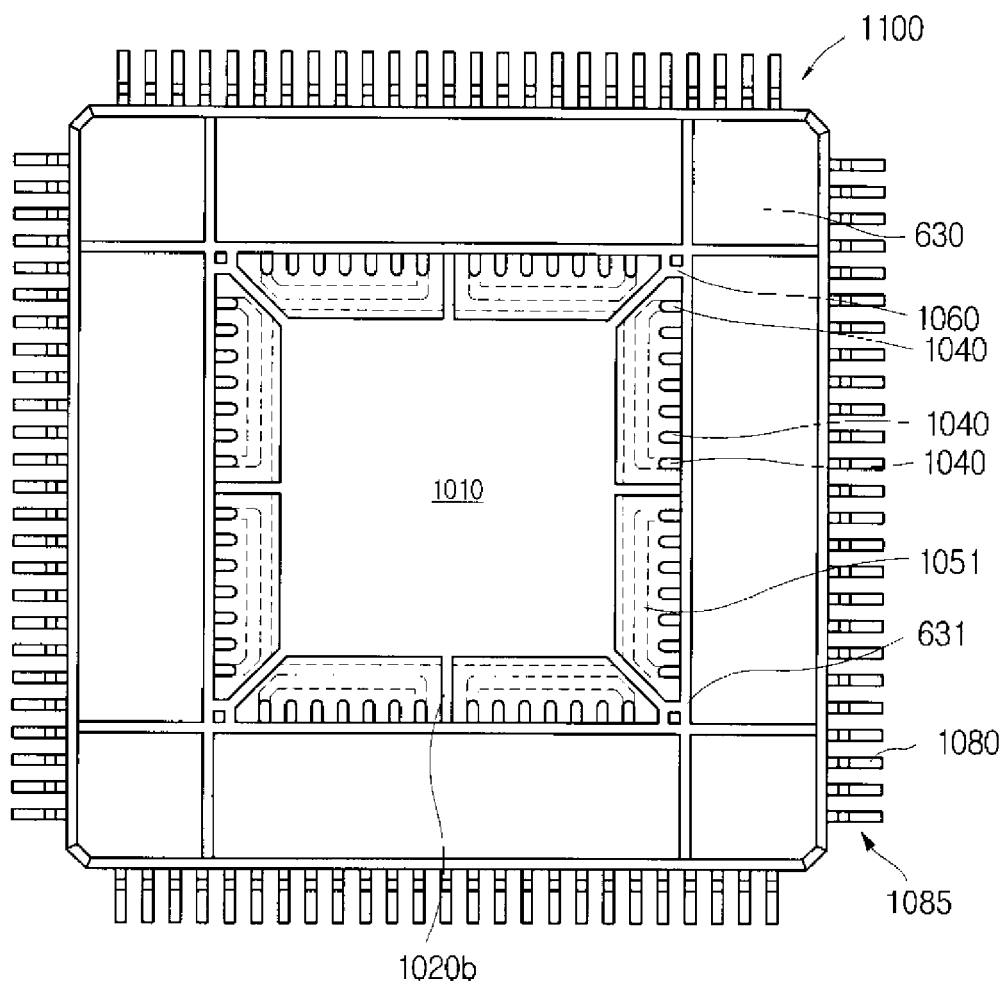
FIG. 13 is a bottom plan view of a semiconductor package constructed in accordance with the present invention and including the leadframe shown in FIGS. 12A-12B subsequent to the singulation thereof.
Figure 14:
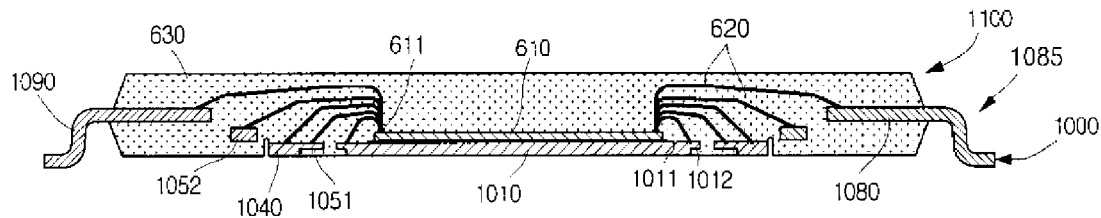
FIG. 14 is a cross-sectional view of a semiconductor package shown in FIG. 13.

Referring now to FIGS. 12A and 12B, there is depicted a leadframe 1000 for integration into a semiconductor package 1100 constructed in accordance with a sixth embodiment of the present invention. The semiconductor package 1100 is shown in FIGS. 13 and 14.

Referring now to FIGS. 12A-12B, the leadframe 1000 comprises a generally quadrangular (e.g., square) die pad 1010 which defines opposed, generally planar top and bottom surfaces, and four peripheral edge segments. The die pad 1010 is not of uniform thickness, but rather includes a half-etched portion 1012 formed in a peripheral portion of the bottom surface thereof. The half-etched portion 1012 of the die pad 1010 mirrors the structural and functional attributes of the half-etched portion 112 of the die pad 110 described above in relation to the leadframe 100. In addition, disposed in the top surface of the die pad 1010 is a continuous, generally quadrangular groove 1011 which itself mirrors the structural and functional attributes of the groove 111 described above in relation to the die pad 110 of the leadframe 100.

Integrally connected to the die pad 1010 is a plurality of support bars 1020. The support bars 1020 include four generally Y-shaped first support bars 1020a which are integrally connected to and protrude diagonally from respective ones of the four corner regions defined by the die pad 1010. In addition to the first support bars 1020a, the support bars 1020 include four generally straight or linear support bars 1020b which are each integrally connected to and protrude generally perpendicularly from the approximate center of a respective one of the four peripheral edge segments defined by the die pad 1010. As is apparent from FIG. 12B, none of the support bars 1020 is half-etched. All of the support bars 1020 also extend in generally co-planar relation to each other. The support bars 1020 each have a generally planar top surface which extends in generally co-planar relation to the top surface of the die pad 1010, and a generally planar bottom surface which extends in generally co-planar relation to the bottom surface of the die pad 1010. As is further apparent from FIG. 12B, the first support bars 1020a and the second support bars 1020b are sized and configured relative to each other such that the distal ends of each support bar 1020a are substantially aligned with the distal ends of respective ones of the adjacent pair of the support bars 1020b.

The leadframe 400 further comprises a plurality (e.g., four) land connecting bars 1030. As seen in FIG. 12A, each of the land connecting bars 1030 is integrally connected to an adjacent pair of the support bars 1020a and the intervening one of the support bars 1020b. Thus, each of the connecting bars 1030 extends in spaced, generally parallel relation to a respective one of the peripheral edge segments defined by the die pad 1010. By virtue of their attachment to the die pad 1010 via the support bars 1020, the flatness of the land connecting bars 1030 is maintained in the leadframe 1000. The land connecting bars 1030 are ultimately removed from the completed semiconductor package 1100 to facilitate the electrical isolation of various structural features of the leadframe 1000 from each other in the fabrication process for the semiconductor package 1100.

The leadframe 1000 further comprises a plurality of first leads 1040 which are each integrally connected to a respective one of the land connecting bars 1030, and protrude inwardly toward the die pad 1010. More particularly, the first leads 1040 are segregated into four sets, with each set of the first leads 1040 protruding inwardly from a respective one of the land connecting bars 1030 toward the adjacent peripheral edge segment of the die pad 1010. The first leads 1040 of each set are arranged at a predetermined pitch and protrude perpendicularly inward at a predetermined length from a respective one of the land connecting bars 1030. Each of the first leads 1040 has a generally planar top surface which extends in generally co-planar relation to the top surface of the die pad 1010, and a generally planar bottom surface which extends in generally co-planar relation to the bottom surface of the die pad 1010 and defines a land. Additionally, each of the first leads 1040 may be formed to include one or more integral locking protrusions 1041. The locking protrusions 1041 mirror the structural and functional attributes described above in relation to the locking protrusions 141 of the first leads 140 included in the leadframe 100.

As seen in FIGS. 12A-12B, the leadframe 1000 further comprises a primary power bar 1052 which has a generally quadrangular (e.g., square), ring-like configuration, and circumvents the land connecting bars 1040 (and hence the die pad 1010). In the leadframe 400, the primary power bar 1052 is integrally connected to each of the land connecting bars 1030 by a plurality of support bars 1053. Those of ordinary skill in the art will recognize that the number support bars 1053 used to facilitate such integral connection of the primary power bar 1052 to the land connecting bars 1030 as shown in FIGS. 12A and 12B is exemplary only, and may be varied without departing from the spirit and scope of the present invention.

In the leadframe 1000, each support bar 1053 is bent to include a downset 1054 therein. As a result of the inclusion of the downsets 1054 in the support bars 1053, the primary power bar 1052 resides on a plane which is elevated above a common plane upon which the die pad 1010, the first leads 1040, and the land connecting bars 1030 reside. Thus, as seen in FIG. 14, the primary power bar 1052 defines a generally planar bottom surface which extends in generally co-planar relation to the generally planar top surfaces of the first leads 1040, and the die pad 1010.

The leadframe 1000 further comprises a dambar 1070 which circumvents the die pad 1010, the land connecting bars 1030, and the primary power bar 1052. The dambar 1070 is provided in the form of a substantially quadrangular (e.g., square) ring. The dambar 1070 defines four peripheral segments which extend in spaced, generally parallel relation to respective ones of the peripheral edge segments of the die pad 1010. Additionally, the dambar 1070 is integrally connected to the primary power bar 1052 by a plurality of tie bars 1060. As seen in FIG. 12A, each of the tie bars 1060 is bent to include a downset 1061 therein. As a result of the inclusion of the downsets 1061 in the tie bars 1060, the dambar 1070 resides on a plane which is elevated above the plane upon which the primary power bar 1052 resides. Thus, in the leadframe 1000, the primary power bar 1052 resides on a second plane which is disposed between and in generally parallel relation to a first plane upon which the die pad 1010, first leads 1040 and land connecting bars 1030 reside, and a third plane upon which the dambar 1070 resides. In the fabrication process for the semiconductor package 1100, the dambar 1070 is singulated or removed from the leadframe 1000 to electrically isolate other structural features of the leadframe 1000 from each other as will be described in more detail below. In FIG. 12A, four tie bars 1060 are shown as integrally connecting the primary power bar 1052 to the dambar 1070. However, those of ordinary skill in the art will recognize that such integral connection may be facilitated by greater or fewer than four tie bars 1060 extending between the dambar 1070 and the primary power bar 1052 in patterns or arrangements differing from that shown in FIG. 12A without departing from the spirit and scope of the present invention. The tie bars 1060 work in conjunction with the support bars 1053 to maintain the flatness of the primary power bar 1052. In the leadframe 1000, the Y-shaped configurations of the support bars 1020a help reduce stress in the leadframe 1000 arising from the bending of the tie bars 1060 as occurs during the formation of the downsets 1061 therein. This stress reduction assists in preventing any undesirable shifting or dislocation of the land connecting bars 1030, and hence the first leads 1040.

The leadframe 1000 further comprises a plurality of second leads 1085 which are integrally connected to the dambar 1070 and, like the first leads 1040, preferably segregated into four sets. In this regard, the second leads 1085 of each set extend generally perpendicularly relative to a respective one of the peripheral edge segments of the dambar 1070 at predetermined lengths, and are arranged at a predetermined pitch. Each of the second leads 1085 define an inner portion 1080 which extends inwardly from a corresponding peripheral segment of the dambar 1070 toward the die pad 1010. The inner portions 1080 each preferably have an angled configuration so as to be disposed closer to a respective one of the peripheral edge segments of the die pad 1010. In addition to the inner portion 1080, each of the second leads 1085 includes an outer portion 1090 which extends outwardly from a corresponding peripheral segment of the dambar 1070 away from the die pad 1010. In the leadframe 1000, the second leads 1085 and the dambar 1070 reside on the common third plane described above, and thus extend in generally co-planar relation to each other. As a result, as seen in FIG. 14, the inner portions 1080 of the second leads 1085 are elevated above the primary power bar 1052. The singulation or removal of the dambar 1070 in the process of fabricating the semiconductor package 1100 facilitates the electrical isolation of the second leads 1085 from each other. Additionally, as seen in FIG. 14, the outer portions 1090 of the second leads 1085 ultimately protrude from respective side surfaces of the package body in the completed semiconductor package 1100, and are each bent to assume a gull-wing configuration.

As best seen in FIG. 12B, the inner portions 1080 of one of the second leads 1085 of each set thereof includes a tie bar portion 1081 which is integrally connected to the primary power bar 1052. Because the second leads 1085 and the primary power bar 1052 reside upon respective ones of a spaced, generally parallel pair of planes, each tie bar portion 1081 is bent to include a downset 1082 therein as is needed to accommodate such spacing. Those of ordinary skill in the art will recognize that more or less than four of the second leads 1085 may be provided with a tie bar portion 1081 integrally connected to the primary power bar 1052 without departing from the spirit and scope of the present invention.

As is apparent from FIG. 12A, the primary power bar 1052 of the leadframe 1000 is disposed between the land connecting bars 1030, and the inner portions 1080 of the second leads 1085. Those of ordinary skill in the art will recognize that the number, shape and arrangement of the second leads 1085 as shown in FIG. 12A is exemplary only, and may be varied without departing from the spirit and scope of the present invention. The primary power bar 1052 is used to provide the same functionality described above in relation to the power bars 150 of the leadframe 100.

The leadframe 1000 further includes a plurality (e.g., eight) secondary power bars 1051 which are segregated into four sets of two secondary power bars 1051 each, the secondary power bars 1051 each extending between an adjacent pair of the support bars 1020a, 1020b. The secondary power bars 1052 are also each disposed between one set of the first leads 1040 and a corresponding peripheral edge segment of the die pad 1010. Additionally, the secondary power bars 1052 are each formed such that the opposed ends thereof are integrally connected to the distal ends of respective ones of two of the first leads 1040 of the corresponding set thereof, as best shown in FIG. 12B. In the leadframe 1000, each of the secondary power bars 1052 is half-etched as indicated by the hatching included in FIGS. 12A and 12B. Thus, each of the secondary power bars 1052 defines a generally planar top surface which extends in generally co-planar relation to the top surfaces of the die pad 110 and first leads 1040, and a generally planar bottom surface which extends in generally co-planar relation to the half-etched portion 1012 of the die pad 1010.

As indicated above, the semiconductor package 1100 as fabricated to include the leadframe 1000 is shown in FIGS. 13 and 14. The semiconductor package 1100 is substantially similar to the above-described semiconductor package 800, with only the distinctions between the semiconductor packages 1100, 800 being described below.

In the semiconductor package 1100, the primary power bar 1052 and the secondary power bars 1051 are completely covered by the package body 1030. Thus, the primary power bar 1052 and secondary power bars 1051 are not exposed to the outside through the package body 630. The conductive wires 620 for power supply are connected to the semiconductor die 610 and are bonded to the top surfaces of the primary and secondary power bars 1052, 1051. The bottom surface of the die pad 1010, the bottom surfaces of the support bars 1020, and the lands defined by the first leads 1040 extend in generally co-planar relation to each other, and to the generally planar bottom surface of the package body 630 as shown in FIG. 13, thus being exposed in the semiconductor package 1100. As indicated above, the outer portions 1090 of the second leads 1085 protrude from respective side surfaces of the package body 630, and are each bent to assume a gull-wing configuration. As will be recognized by those of ordinary skill in the art, the fabrication methodology employed for the semiconductor package 1100 is substantially similar to that previously described in relation to the semiconductor package 600.

Referring now to FIGS. 15A-17B, there is depicted a leadframe 1200 for integration into a semiconductor package 1300 constructed in accordance with a seventh embodiment of the present invention. The semiconductor package 1300 is shown in FIGS. 18A-18D.

Referring now to FIGS. 15A-17B, the leadframe 1200 comprises a generally quadrangular (e.g., square) die pad 1210 which defines opposed, generally planar top and bottom surfaces, and four peripheral edge segments. Integrally connected to the die pad 1210 is a plurality of tie bars 1220. More particularly, the leadframe 1200 includes four tie bars 1220 which extend diagonally from respective ones of the four corner regions defined by the die pad 1210. In the leadframe 1200, each of the tie bars 1220 is bent to include a first downset 1221 and a second downset 1222. The first downset 1221 of each tie bar 1220 is disposed between the second downset 1222 and the die pad 1210. Due to the inclusion of the first and second downsets 1221, 1222 therein, each of the tie bars 1220 includes a first segment which is disposed between the die pad 1210 and the first downset 1221 and extends in generally co-planar relation to the die pad 1210, a second segment which extends between the first and second downsets 1221, 1222 and resides on a plane which is elevated above that of the die pad 1210, and a third segment which extends between the second downset 1222 and a dambar 1230, the third segment and the dambar 1230 each residing on a plane which is elevated above that of the second segment. Thus, the first, second and third segments of each tie bar 1220 reside on respective ones of three spaced, generally parallel planes, with the plane upon which the second segment resides being disposed between those planes on which respective ones of the first and third segments reside.

Figure 15A:
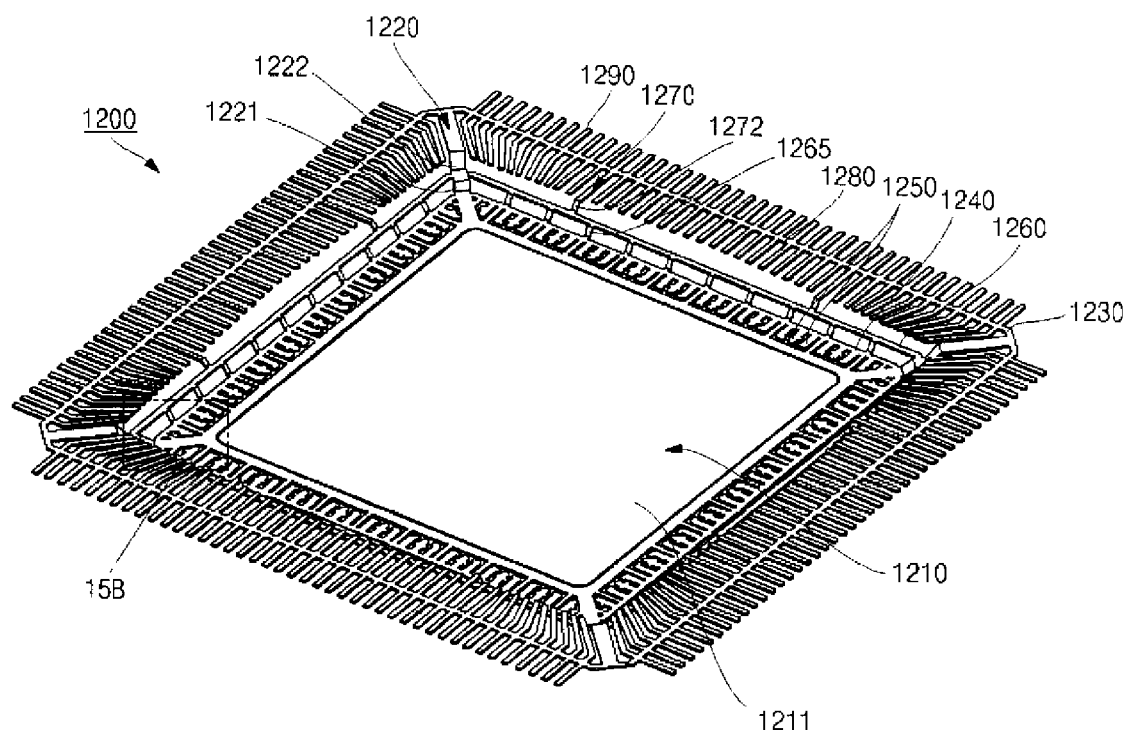
FIG. 15A is a top perspective view of an unsingulated leadframe which is integrated into a semiconductor package constructed in accordance with a seventh embodiment of the present invention.
Figure 15B:
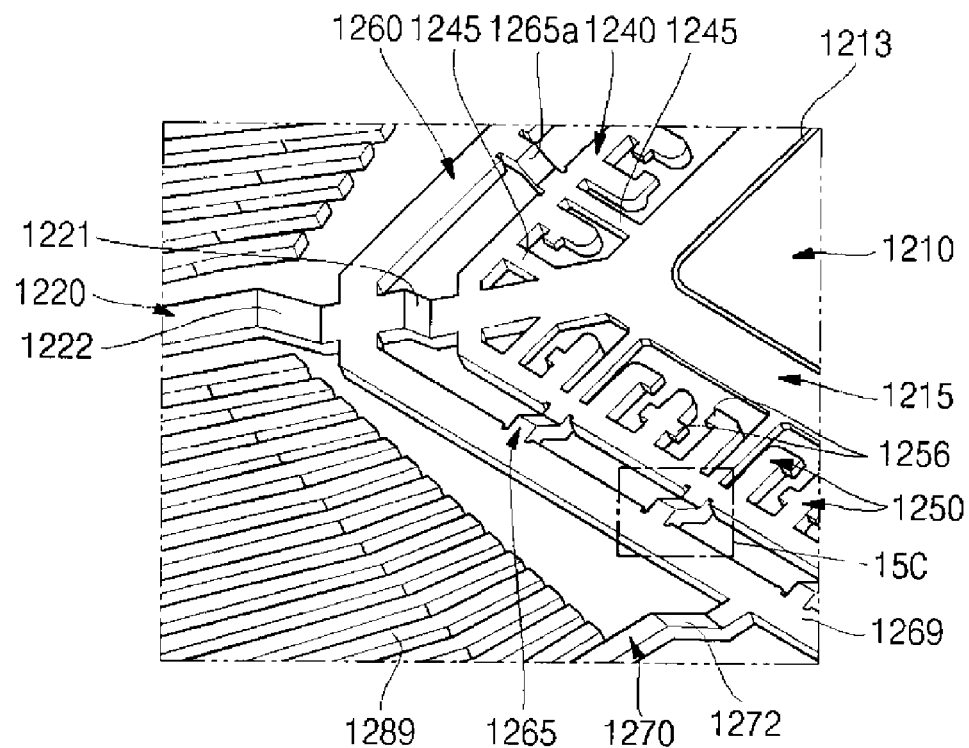
FIG. 15B is an enlargement of the region 15B included in FIG. 15A.
Figure 15C:
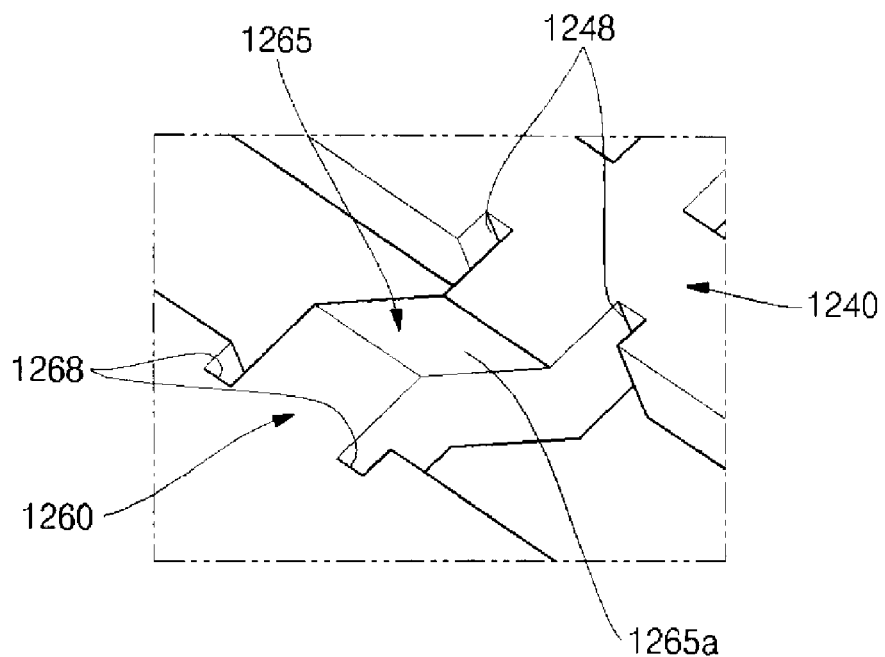
FIG. 15C is an enlargement of the region 15C included in FIG. 15B.
Figure 15D:
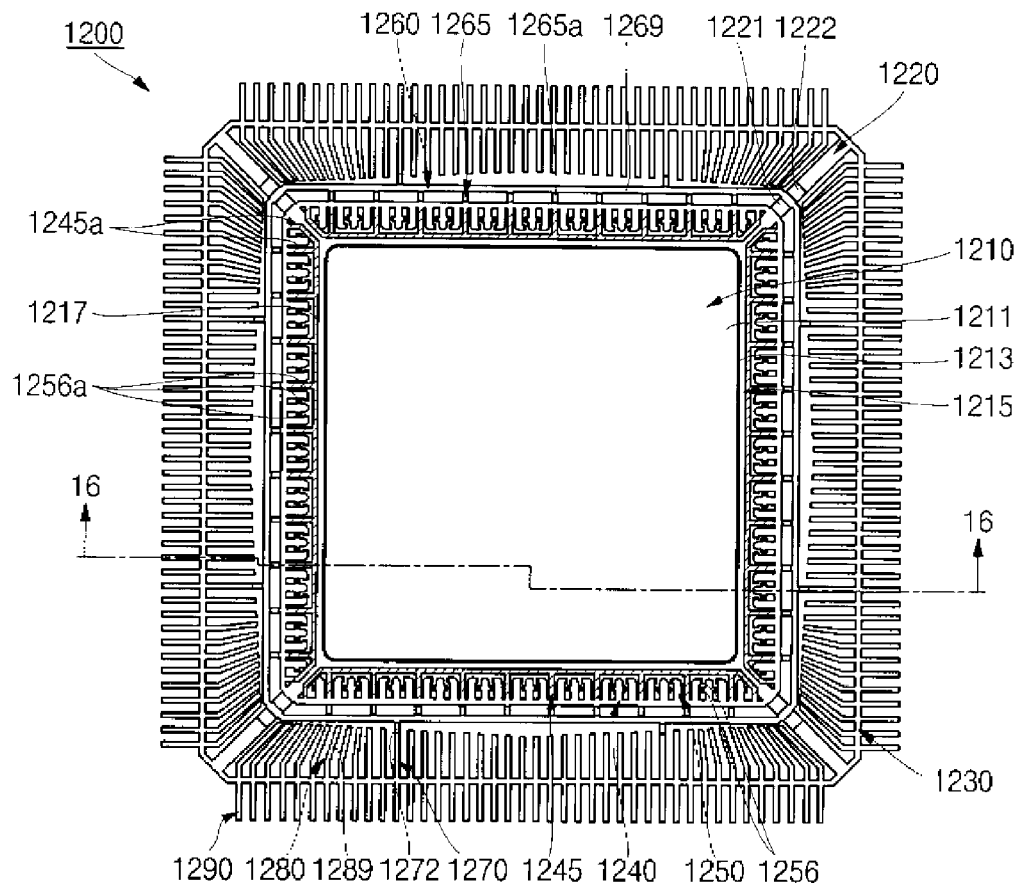
FIG. 15D is a top plan view of the leadframe shown in FIG. 15A.
Figure 16:
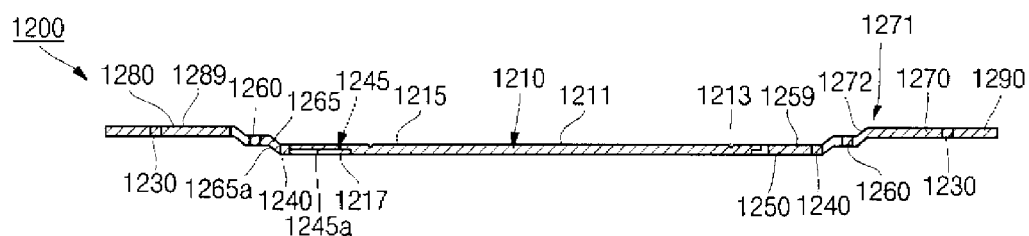
FIG. 16 is a cross-sectional view of the leadframe taken along line 16-16 of FIG. 15D.

As indicated above, the tie bars 1220 are integrally connected to the dambar 1230 which circumvents the die pad 1210. In the leadframe 1200, the dambar 1230 is provided in the form of a substantially quadrangular (e.g., square) ring which interconnects the distal ends of the tie bars 1220, thus resulting in the dambar 1230 extending in generally co-planar relation to the third segments of the tie bars 1220. As best seen in FIG. 15D, the dambar 1230 defines four peripheral segments which extend in spaced, generally parallel relation to respective ones of the peripheral edge segments of the die pad 1210. In a fabrication process for the semiconductor package 1300 which will be described in more detail below, the dambar 1230 is singulated or removed from the leadframe 1200 to electrically isolate other structural features of the leadframe 100 from each other.

The die pad 1210 of the leadframe 1200 is not of uniform thickness. Rather, formed in a peripheral portion of the bottom surface of the die pad 1210 is a half-etched portion 1217. More particularly, the half-etched portion 1217 is segregated into four segments, with each of these segments extending along a respective one of the peripheral edge segments of the die pad 1210 and between a respective pair of the tie bars 1220. Though FIG. 15D is a top plan view of the leadframe 1200, the half-etched portion 1217 of the die pad 110 formed in the bottom surface thereof is indicated by the hatching included in FIG. 15D. As will be discussed in more detail below, in the fabrication process for the semiconductor package 1300 including the leadframe 1200, a semiconductor die is attached to the top surface of the die pad 1210 through the use of an adhesive layer, with an encapsulant material thereafter being applied to the semiconductor die and the leadframe 1200 to form the package body of the semiconductor package 1300. Advantageously, the half-etched portion 1217 formed in the peripheral portion of the bottom surface of the die pad 1210 as indicated above effectively increases the distance along which moisture must travel to reach the semiconductor die mounted to the top surface of the die pad 1210. As a result, such semiconductor die is safely protected against moisture in the completed semiconductor package 1300. Additionally, the flow of encapsulant material over the half-etched portion 1217 during the formation of the package body of the semiconductor package 600 facilitates the creation of a mechanical interlock between the package body and the die pad 1210.

As further seen in FIG. 15D, it is contemplated that the top surface of the die pad 1210 will define a die area 1211 to which the semiconductor will ultimately be attached, such central die area 1211 being circumvented by a peripheral wire bonding area 1215. The die area 1211 and the wire bonding area 1215 are separated from each other by a continuous, generally quadrangular groove 1213 of predetermined depth disposed in the top surface of the die pad 1210. When an adhesive is used to facilitate the attachment of a semiconductor die to the top surface of the die pad 1210 within the die area 1211, the groove 1213 serves to prevent such adhesive from flowing outwardly into the wire bonding area 1215 of the die pad 1210. Along these lines, it is contemplated that such semiconductor die will be smaller than the area circumvented by the groove 1213.

As indicated above, each of the tie bars 1220 is integrally connected to the dambar 1230. In addition, each of the tie bars 1220 is integrally connected to a land connecting bar 1240 which, like the dambar 1230, circumvents the die pad 1210. In this regard, the land connecting bar 1240 includes four peripheral segments which extend in spaced, generally parallel relation to respective ones of the peripheral edge segments of the die pad 1210. Additionally, the land connecting bar 1240 is concentrically positioned between the dambar 1230 and the die pad 1210, and is integrally connected to the tie bars 1220 between the die pad 1210 and the first downsets 1221 of the tie bars 1220. The land connecting bar 1240 is ultimately removed from the completed semiconductor package 1300 to facilitate the electrical isolation of various structural features of the leadframe 1200 from each other in a manufacturing step which will be described in more detail below.

The leadframe 1200 further comprises a plurality of support bars 1245 which are integrally connected to and extend between the die pad 1210 and the land connecting bar 1240. In this regard, the support bars 1245 function to connect the die pad 1210 to and to support the die pad 1210 within the interior of the land connecting bar 1240. The support bars 1245 are segregated into four sets, with each set of the support bars 1245 extending generally perpendicularly between a respective one of the peripheral edge segments of the die pad 1210 and a corresponding peripheral segment of the land connecting bar 1240. Each of the support bars 1245 has a generally planar top surface which extends in generally co-planar relation to the top surface of the die pad 1210. Each of the support bars 1245 is also preferably half-etched as indicated by the hatching shown in FIG. 15D so as to define a bottom surface 1245a which extends in generally co-planar relation to the half-etched portion 1217 of the die pad 1210. As a result, in the process of fabricating the semiconductor package 1300 as will be described in more detail below, the encapsulant material used to form the package body of the semiconductor package 1300 is able to flow over the bottom surfaces 1245a of the support bars 1245, and thus completely covers or encapsulates each support bar 1245. Such encapsulation of the support bars 1245 prevents the support bars 1245 from affecting the connection of the completed semiconductor package 1300 to an external circuit.

The leadframe 1200 of the present invention further comprises a plurality of first leads 1250 which are each integrally connected to the land connecting bar 1240, and protrude inwardly toward the die pad 12110. More particularly, the first leads 1250 are segregated into four sets, with each set of the first leads 1250 protruding inwardly from a respective one of the peripheral segments of the land connecting bar 1240 toward the die pad 1210. The first leads 1250 of each set are arrange at a predetermined pitch and protrude perpendicularly inward at a predetermined length from a respective one of the peripheral segments of the land connecting bar 1240. Each of the first leads 1250 has a generally planar top surface 1259 which extends in generally co-planar relation to the top surface of the die pad 1210, and a generally planar bottom surface which extends in generally co-planar relation to the bottom surface of the die pad 1210 and defines a land as shown in FIG. 18C.

Figure 17A:
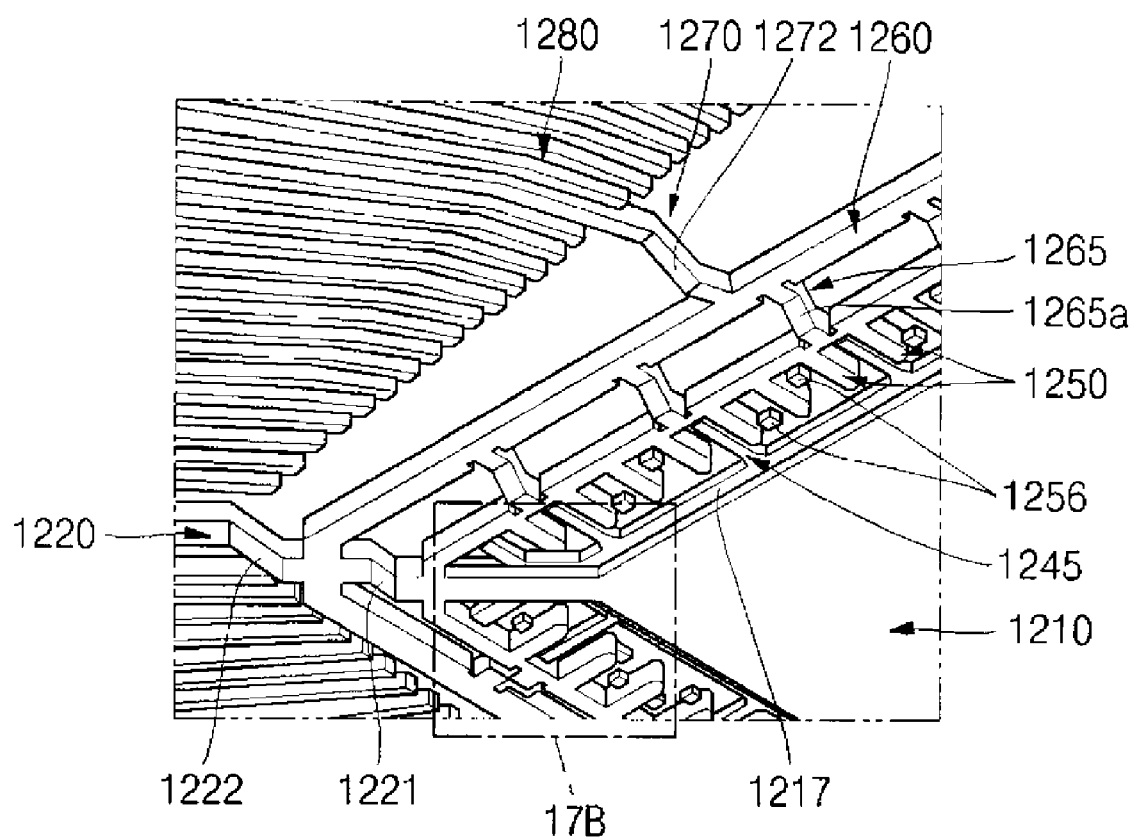
FIG. 17A is a bottom perspective view of a portion of the leadframe shown in FIG. 15A.
Figure 17B:
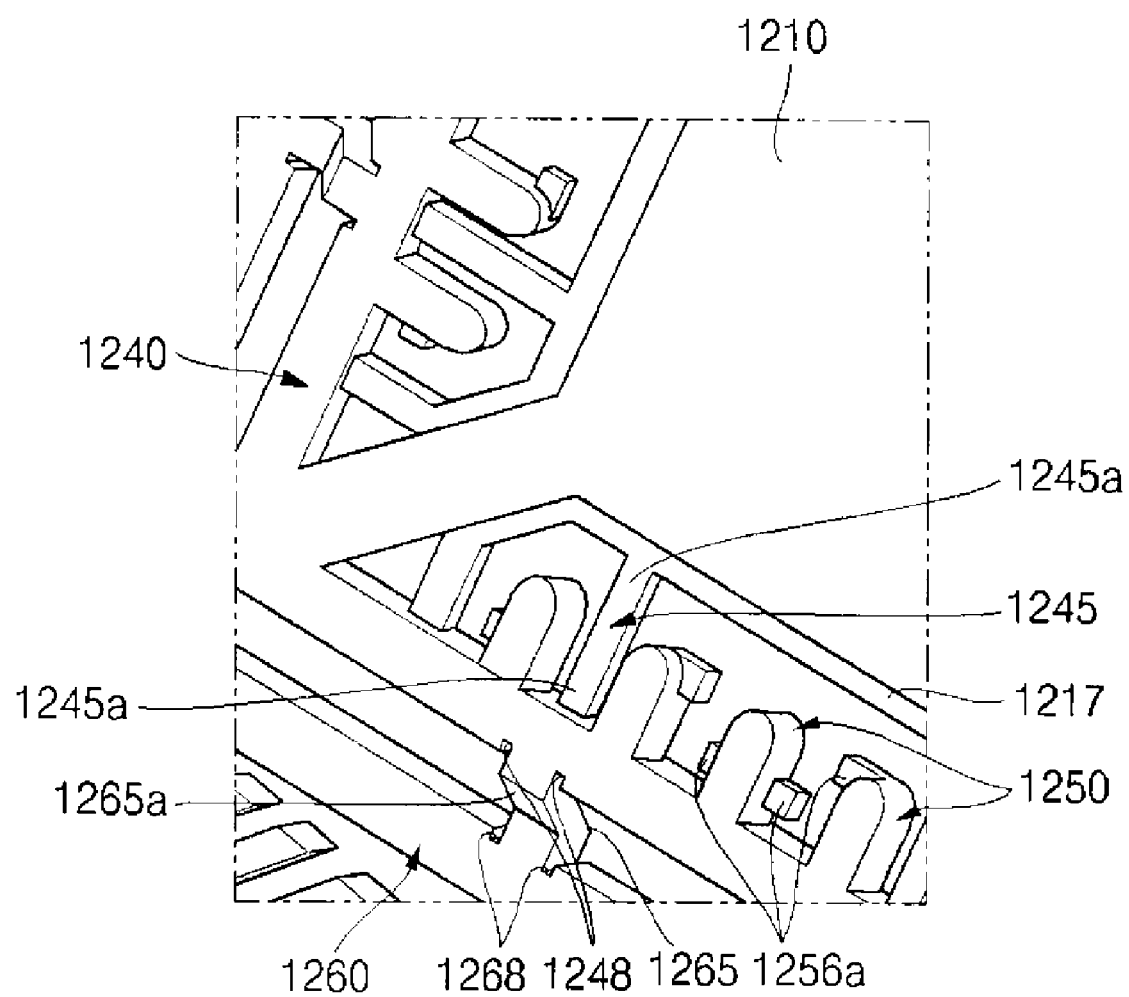
FIG. 17B is an enlargement of the region 17B included in FIG. 17A.

As is further seen in FIGS. 17A and 17B, each of the first leads 1250 may be formed to include one or more integral locking protrusions 1256 which protrude from one or both sides thereof. Each of the locking protrusions 1256 is preferably half-etched such that each locking protrusion 1256 defines a generally planar top surface which extends in generally co-planar relation to the top surface of the corresponding first lead 1250, and a bottom surface 1256a which is recessed relative to the bottom surface of the corresponding first lead 1250. As a result, in the process of fabricating the semiconductor package 1300 as will be described in more detail below, the encapsulant material used to form the package body of the semiconductor package 1300 completely covers or encapsulates each locking protrusion 1256 to effectively form a mechanical interlock between the first leads 1250 and the package body. This mechanical interlock assists in preventing the first leads 1250 from being dislodged from the package body during a subsequent sawing process involved in the fabrication of the semiconductor package 1300, as will also be described in more detail below.

The leadframe 1200 further comprises a power ring or bar 1260 which has a generally quadrangular (e.g., square), ring-like configuration, and circumvents the land connecting bar 1240 (and hence the die pad 1210). In the leadframe 1200, the power bar 1260 is integrally connected to the second segment of each of the tie bars 1220 between the first and second downsets 1221, 1222 thereof. The power bar 1260 is also integrally connected to the land connecting bar 1240 by a plurality of support bars 1265. Those of ordinary skill in the art will recognize that the number support bars 1265 used to facilitate such integral connection of the power bar 1260 to the land connecting bar 1240 as shown in FIG. 15D is exemplary only, and may be varied without departing from the spirit and scope of the present invention.

In the leadframe 1200, each support bar 1265 is bent to include a downset 1265a therein. As a result of the inclusion of the downsets 1265a in the support bars 1265, the power bar 1260 resides on a plane which is elevated above a common plane upon which the die pad 1210, the first leads 1250, and the land connecting bar 1240 reside. Thus, as seen in FIG. 18B, the power bar 1260 defines a generally planar bottom surface which extends in generally co-planar relation to the generally planar top surfaces of the first leads 1250, and the die pad 1210. As best seen in FIGS. 17A and 17B, stress-relieving grooves or notches 1248 are provided at the point of intersection between each support bar 1265 and the land connecting bar 1240. Similarly, stress-relieving grooves or notches 1268 are provided at the point of intersection between each support bar 1265 and the power bar 1260. The notches 1248, 1268 absorb stress arising from the formation of the downsets 1265a within the support bars 1265, thus assisting in maintaining the flatness and uniformity of both the power bars 1260 and the land connecting bar 1240 (and hence the first leads 1250).

The leadframe 1200 constructed in accordance with the present invention further comprises a plurality of second leads 1270 which are integrally to the dambar 1230 and, like the first leads 1250, preferably segregated into four sets, with each set of the second leads 1270 extending between an adjacent pair of the tie bars 1220. The second leads 1170 of each set also extend generally perpendicularly relative to a respective one of the peripheral segments of the dambar 1230 at predetermined lengths, and are arranged at a predetermined pitch. Each of the second leads 1270 defines an inner portion 1280 which has a top surface 1289 and extends inwardly from a corresponding peripheral segment of the dambar 1230 toward the die pad 1210 in spaced relation thereto. The inner portions 1280 each preferably have an angled configuration so as to be disposed closer to a respective one of the peripheral edge segments of the die pad 1210. In addition to the inner portion 1280, each of the second leads 1270 includes an outer portion 1290 which extends outwardly from a corresponding peripheral segment of the dambar 1230 away the die pad 1210. In the leadframe 1200, the second leads 1270, the dambar 1230, and the third segments of the tie bars 1220 all reside on a common plane. In the process of fabricating the semiconductor package 1300 as will be described in more detail below, the dambar 1230 is ultimately singulated or removed in a manner facilitating the electrical isolation of the second leads 1270 from each other. As will also be discussed in more detail below, the outer portions 1290 of the second leads 1270 protrude from respective side surfaces of the package body in the completed semiconductor package 1300.

As best seen in FIG. 15D, the inner portions 1280 of two second leads 1270 of each set thereof each include a tie bar portion 1271 which is integrally connected to the power bar 1260. Because the second leads 1270 and the power bar 1260 reside upon respective ones of a spaced, generally parallel pair of planes, each tie bar portion 1271 is bent to include a downset 1272 therein as is needed to accommodate such spacing. The inner portions 1280 of those second leads 1270 of each set not including the tie bar portions 1271 are separated from the power bar 1260. As indicated above, only two second leads 1270 of each set thereof are shown in FIG. 15D as including a tie bar portion 1271 which is integrally connected to the power bar 1260. However, those of ordinary skill in the art will recognize that more or less than two of the second leads 1270 of each set thereof may be provided with a tie bar portion 1271 without departing from the spirit and scope of the present invention.

As explained above, the power bar 1260 is connected to the land connecting bar 1240 through the use of the support bars 1265, and further to at least some of the second leads 1270 via the tie bar portions 1271. Due to the inclusion of the downsets 1265a in the support bars 1265 and the downsets 1272 in the tie bar portions 1271, the power bar 1260 resides on a plane disposed between and extending in generally parallel relation to respective ones of the two planes upon which the die pad 1210 and the inner portions 1280 of the second leads 1270 reside. As previously indicated, the support bars 1245, the land connecting bar 1240, and the first leads 1250 reside on the same plane as that of the die pad 1210. The power bar 1260 is positioned between the land connecting bar 1240 and the inner portions 1280 of the second leads 1270. Because, prior to the singulation of the leadframe 1200, the power bar 1260 is supported by the die pad 1210 (via the support bars 1245, 1265 and the land connecting bar 1240), the tie bars 1220, and the dambar 1230 (via the second leads 1270 including the tie bar portions 1271), the flatness of the power bar 1260 is maintained during a process of fabricating the semiconductor package 1300 including the leadframe 1200. The flatness of the land connecting bar 1240 in the unsingulated leadframe 1200 is also maintained by virtue of its attachment to the die pad 1210 via the support bars 1245.

As will be discussed in more detail below, electrically conductive wires for power supply may be connected from the semiconductor die of the semiconductor package 1300 to the power bar 1260 in the process of fabricating the semiconductor package 1300. Consequently, the power bar 1260 can be used to supply power to the semiconductor die. The power bar 1260 may also be used for grounding. As will also be discussed in more detail below, the conductive wires, in addition to being extended from the semiconductor die of the semiconductor package 1300 to the top surfaces of the power bar 1260, are also typically extended between the semiconductor die and the top surfaces 1259 of each of the first leads 1250, as well as the top surfaces 1289 of the inner portions 1280 of each of the second leads 1270, such top surfaces 1259, 1289 serving as wiring bonding regions. However, conductive wires are typically not extended to the top surfaces 1289 of the inner portions 1280 of those second leads 1270 including the tie bar portions 1271.

As indicated above, in the completed semiconductor package 1300, both the land connecting bar 1240 and the dambar 1230 are ultimately singulated or removed from the leadframe 1200. The singulation or removal of the land connecting bar 1240 in a fabrication step for the semiconductor package 1300 which will described in more detail below facilitates the electrical isolation of the first leads 1250 from each other, and from the die pad 1210. In addition, each of the first leads 1250 is electrically isolated from the power bar 1260 by virtue of the removal of the land connecting bar 1240. The singulation or removal of the dambar 1230 electrically isolates the second leads 1270 from each other. Additionally, those second leads 1270 not including a tie bar portion 1271 are electrically isolated from the power bar 1260 by virtue of the removal of the dambar 1230. Upon the removal of both the land connecting bar 1240 and the dambar 1260, eight second leads 1270 (i.e., those eight second leads 1270 including a tie bar portion 1271) are still electrically connected to the power bar 1260 by virtue of the tie bar portions 1271 extending therebetween. As also indicated above, in the completed semiconductor package 1300, the outer portions 1290 of the second leads 1270 protrude from respective side surfaces of the package body of the semiconductor package 1300, with the exposed outer portions 1290 transmitting signals from the corresponding inner portions 1280 (which are electrically connected to the semiconductor die via conductive wires as indicated above). The outer portions 1290 of the those second leads 1270 including the tie bar portions 1271 may be used to transmit power since they are electrically connected to the power bar 1260. The electrical isolation of the power bar 1260 and the first leads 1250 in the completed semiconductor package 1300 as described above enables the supply of various power levels to the semiconductor die of the semiconductor package 1300, and thus the design of a high-integration and high-performance semiconductor package 1300.

The leadframe 1200 may be fabricated from a conventional metal material, such as copper, copper alloy, steel plated with copper, or a functional equivalent. However, those of ordinary skill in the art will recognize that the present invention is not limited to any particular material for the leadframe 1200. It is contemplated that for ease of wire bonding, gold or silver may be plated on the top surface of the die pad 1210, the top surfaces 1259 of the first leads 1250, the top surface of the power bar 1260, and the top surfaces 1289 of the inner portions 1280 of the second leads 1270 as well. The leadframe 1200 may also be a pre-plated leadframe (PPF) to provide enhanced wire bonding areas. Additionally, the number of first leads 1250 and second leads 1270 shown in FIG. 15D is for illustrative purposes only, and may be modified according to application field. Along these lines, the first leads 1250, second leads 1270, and power bar 1260 may have designs or configurations varying from those shown in FIG. 15D without departing from the spirit and scope of the present invention. Additionally, though the first leads 1250 and the second leads 1270 are each shown as being segregated into four sets, it will be recognized that fewer sets thereof may be provided, and may be arranged along any combination of two or three of the peripheral sides of the die pad 1210. Moreover, less than four tie bars 1220 may be included in the leadframe 1200, extending to respective corners of the die pad 1210 in any combination. It is further contemplated that the leadframe 1200 may be fabricated through the implementation of a chemical etching process or alternatively a mechanical stamping process.

Figure 18A:
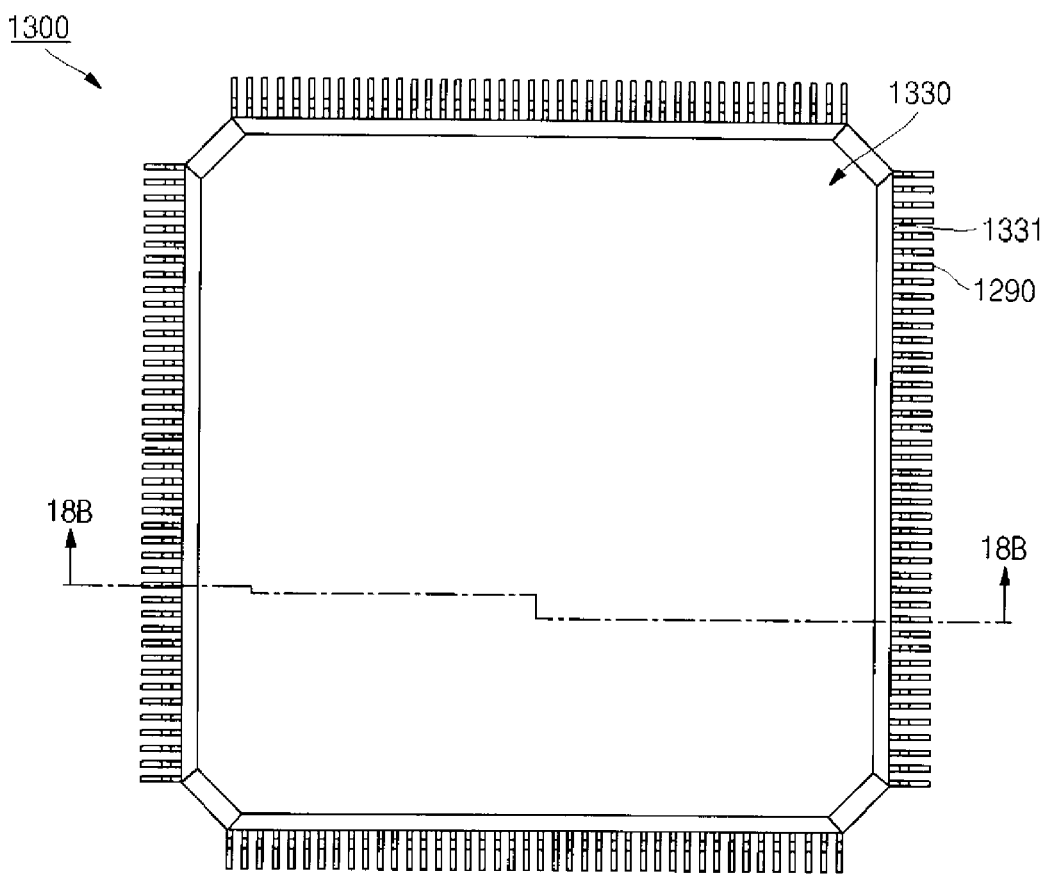
FIG. 18A is a top plan view of a semiconductor package constructed in accordance with the present invention and including the leadframe shown in FIGS. 15A-15D, 16 and 17A-17B subsequent to the singulation thereof.
Figure 18B:
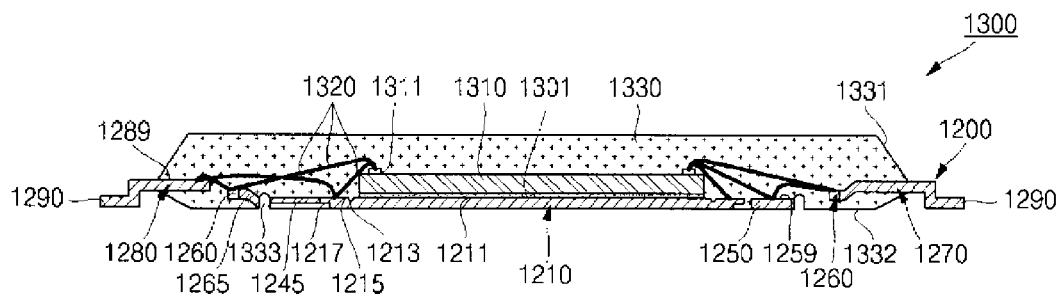
FIG. 18B is a cross-sectional view taken along line 18B-18B of FIG. 18A.
Figure 18C:
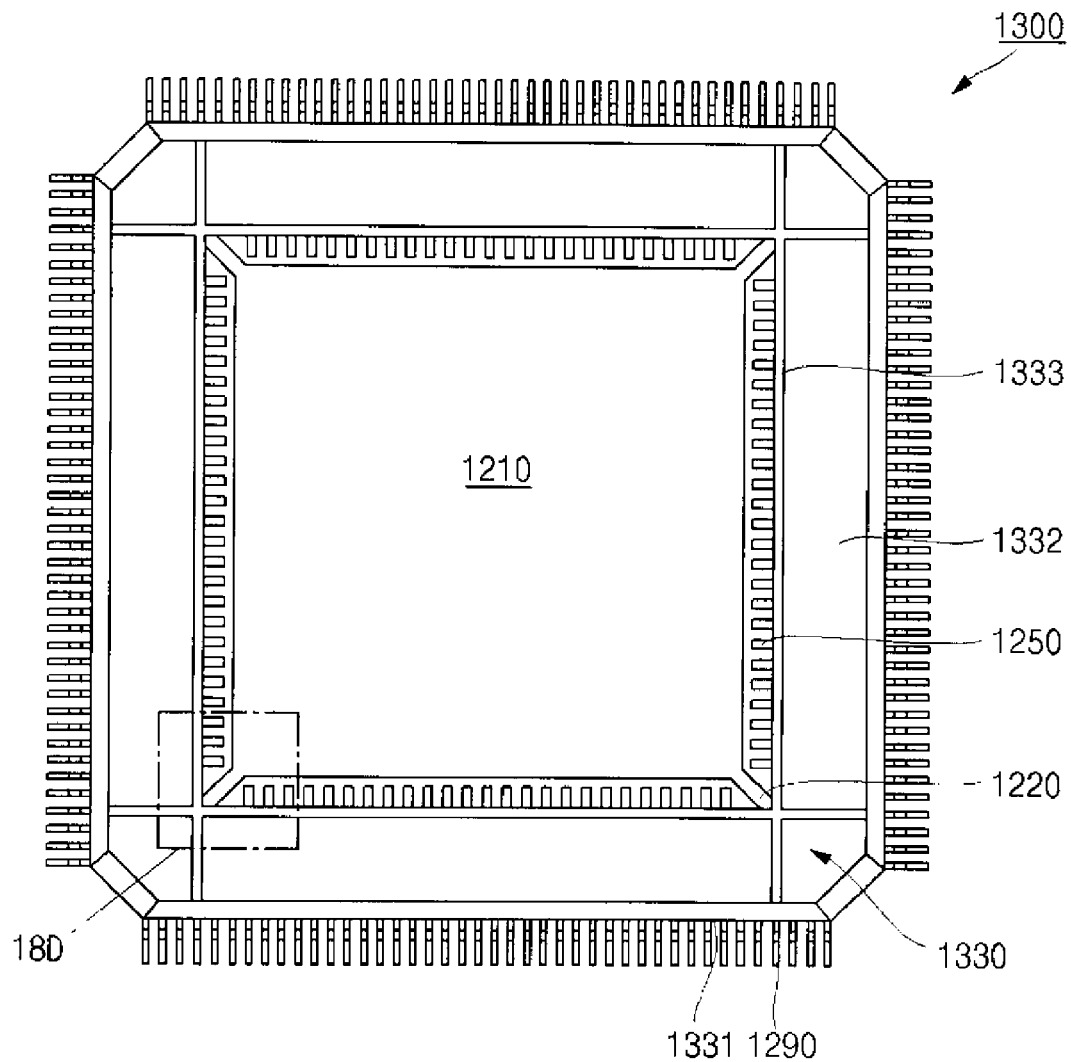
FIG. 18C is a bottom plan view of the semiconductor package shown in FIG. 18A.
Figure 18D:
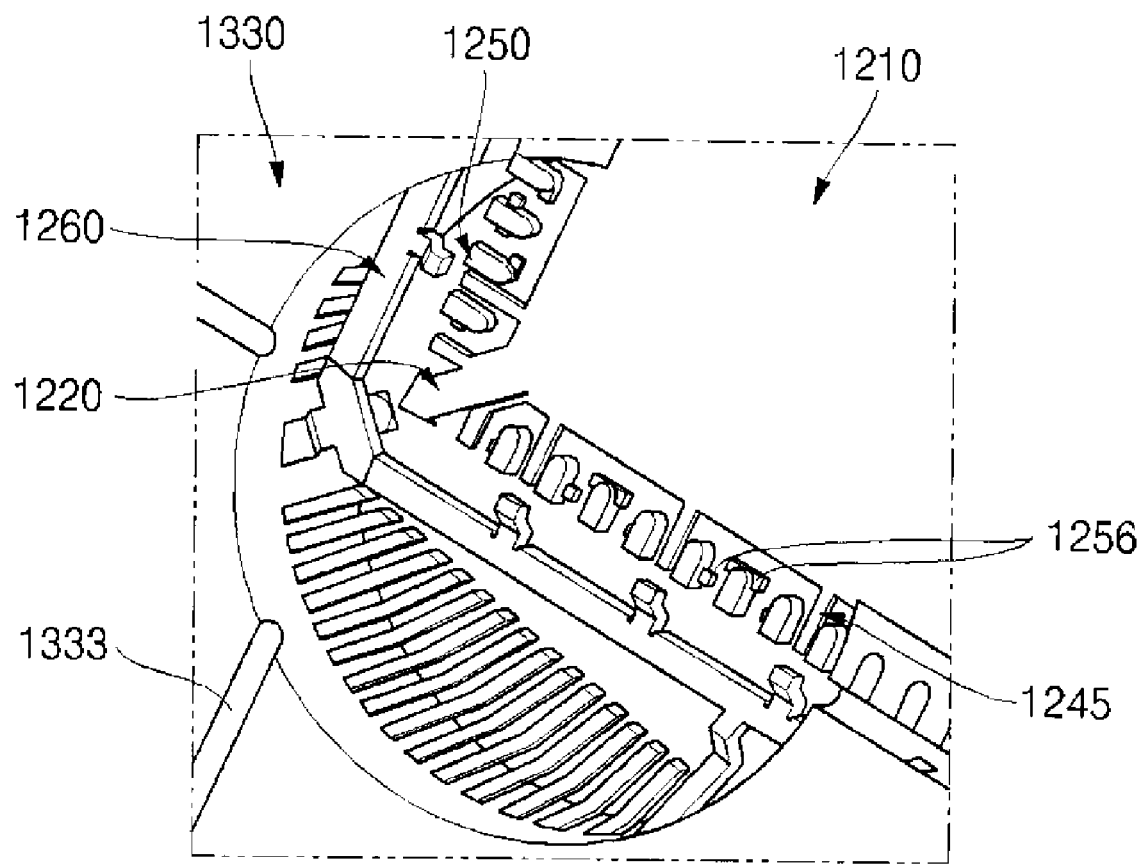
FIG. 18D is an enlargement of the region 18D included in FIG. 18C with the package body of the semiconductor package remove for illustrative purposes.

Referring now to FIGS. 18A-18C, the semiconductor package 1300 as fabricated to include the leadframe 1200 is shown in detail. As will be recognized by those of ordinary skill in the art, in the completed semiconductor package 1300, the dambar 1230 and the land connecting bar 1240 are each singulated or removed from the leadframe 1200 to facilitate the electrical isolation of the various structural features of the leadframe 1200 from each other as previously explained. More particularly, as indicated above, the singulation or removal of the land connecting bar 1240 facilitates the electrical isolation of the first leads 1250 from each other, and from the die pad 1210. In addition, each of the first leads 1250 is electrically isolated from the power bar 1260 by virtue of the removal of the land connecting bar 1240. The singulation or removal of the dambar 1230 electrically isolates the second leads 1270 from each other. Additionally, those second leads 1270 not including a tie bar portion 1271 are electrically isolated from the power bar 1260 by virtue of the removal of the dambar 1230.

In the semiconductor package 1300, a semiconductor die 1310 is attached to the die area 1211 on the top surface of the die pad 1210 through the use of, for example, an adhesive layer 1301. The semiconductor die 1310 includes a plurality of bond pads 1311 which are disposed on the top surface thereof opposite the bottom surface adhered to the top surface of the die pad 1210. The bond pads 1311 are used to deliver and receive electrical signals or power. The semiconductor package 1300 further comprises a plurality of conductive wires 1320 which are used to electrically connect the bond pads 1311 of the semiconductor die 1310 to respective ones of the first and second leads 1250, 1270. The conductive wires 1320 may be fabricated from aluminum, copper, gold, silver, or a functional equivalent. However, those of ordinary skill in the art will recognize that the present invention is not limited to any particular material for the wires 1320. One or more conductive wires 1320 may also be used to electrically connect one or more bond pads 1311 directly to the wire bonding area 1215 of the die pad 1210. In this regard, the peripheral wire bonding area 1215 of the top surface or the entire top surface of the die pad 1210 may be plated as indicated above, and bonded with conductive wires 1311, allowing for the use of the plated die pad 1210 as a ground region.

In the semiconductor package 1300, in electrically connecting the bond pads 1311 to the first leads 1250, it is contemplated that the conductive wires 1320 will be extended from the bond pads 1311 to the top surfaces 1259 of respective ones of the first leads 1250. In electrically connecting the bond pads 1311 to the second leads 1270, it is contemplated that the conductive wires 1320 will be extended from the bond pads 1311 to the top surfaces 1289 of respective ones of the inner portions 1280 of the second leads 1270. In addition, one or more of the bond pads 1311 may be electrically connected to the power bars 1260. In electrically connecting the bond pad(s) 1311 to the power bar 1260, it is contemplated that the conductive wire(s) 1320 will be extended from the bond pad(s) 1311 to the top surface of the power bar 1260. As indicated above, it is contemplated that no conductive wires 1320 will be extended from the bond pads 1311 to any of those second leads 1270 integrally connected to a the power bar 1260 via the tie bar portions 1271.

In the semiconductor package 1300, the die pad 1210, the first and second leads 1250, 1270, the tie bars 1220, the power bar 1260, the semiconductor die 1310 and the conductive wires 1320 are at least partially encapsulated or covered by an encapsulant material which, upon hardening, forms the package body 1330 of the semiconductor package 1300. More particularly, the package body 1330 covers the entirety of the die pad 1210 except for the bottom surface thereof which is circumvented by the half-etched portion 1217. The package body 1330 also covers the entirety of the power bar 1260. The package body 1330 also covers the entirety of each of the first leads 1250 except for the land defined by the bottom surface thereof. The package body 1330 also covers the entirety of the inner portion 1280 of each of the second leads 1270 except for a small portion thereof. The entirety of each of the tie bars 1220 is also covered by the package body 1330, except for the bottom surface of the first segment of each tie bar 1220 which extends in generally co-planar relation to the bottom surface of the die pad 1210 and the lands defined by the first leads 1250, all of which are exposed in a generally planar bottom surface 1332 defined by the package body 1330. The outer portions 1290 of the second leads 1270 are not covered by the package body 1330, but rather protrude or extend outwardly from respective lateral side surfaces 1331 thereof. The dambar 1230 is also not covered by the package body 1330 so that it may be removed from the leadframe 1200.

Though the land connecting bar 1240 is partially covered by the package body 630, the bottom surface of the land connecting bar 1240 is exposed in the bottom surface 1332 of the package body 1330 so that the land connecting bar 1240, like the dambar 1230, may be removed from the completed semiconductor package 1300 as needed to facilitate the electrical isolation of various structural features thereof from each other in the above-described manner. The removal of the land connecting bar 1240 is typically accomplished through the completion of a partial sawing process. The implementation of such sawing process facilitates the formation of a plurality of elongate grooves 1333 within the bottom surface 1332 of the package body 1330, such grooves 1333 extending in generally perpendicular relation to each other, and generally perpendicularly between an opposed pair of the lateral side surfaces 1331 of the package body 1330. The package body 1330 also completely covers or encapsulates each of the support bars 1245, with such encapsulation preventing the support bars 1245 from affecting the connection of the completed semiconductor package 1300 to an external circuit. With regard to the removal of the dambar 1230, it is contemplated that such removal will typically be accomplished through the implementation of a conventionally known debarring process. As indicated above, the removal of the land connecting bar 1240 is facilitated by sawing with a blade, the grooves 1331 being formed as an artifact of such sawing process.

Due to the structural attributes of the fully formed package body 1330, the generally planar bottom surface of the die pad 1210 is exposed in and substantially flush with the generally planar bottom surface 1332 of the package body 1330, as are the generally planar bottom surfaces of the first segments of the tie bars 1220. Similarly, the generally planar lands defined by the first leads 1250 are exposed in and substantially flush with the bottom surface 1332 of the package body 1330. The outer portions 1290 of the second leads 1270 of each set thereof protrude laterally outward from respective side surfaces 1331 of the package body 1330. As seen in FIG. 18B, the exposed outer portions 1290 may be bent to assume a gull-wing configuration to allow the same to be electrically connected to an underlying substrate such as a printed circuit board. In the completed semiconductor package 1300, the exposed outer portions 1290 and the exposed lands defined by the first leads 1250 are capable of being mounted to the surface of an underlying substrate such as a printed circuit board through the use of, for example, a soldering technique. The conductive wires 1320 electrically interconnect the bond pads 1311 of the semiconductor die 1310 to the die pad 1210, the power bar 1260, the first leads 1250 and the second leads 1270 in the manner indicated above. In this regard, by way example, one end of each of the conductive wires 1320 for ground can be bonded to the die pad 1210, with one end of each of the wires 1320 for power supply being bonded to the power bar 1260, and one end of each of the conductive wires 1320 for signaling being bonded to a corresponding one of the first or second leads 1250, 1270. Based on the wire bonding pattern, various power levels can be supplied to the semiconductor die 1310 through the power bar 1260. As indicated above, electrical signals are routed from the semiconductor die 1310 to the outer portions 1290 of the second leads 1270 by the corresponding integrally connected inner portions 1280 and conductive wires 1320. Since the leadframe 1200 of the semiconductor package 1300 is configured to provide both the second leads 1270 and the first leads 1250, the number of I/O's in the leadframe 1200 increases in proportion to the number of first and second leads 1250, 1270.

Figure 19:
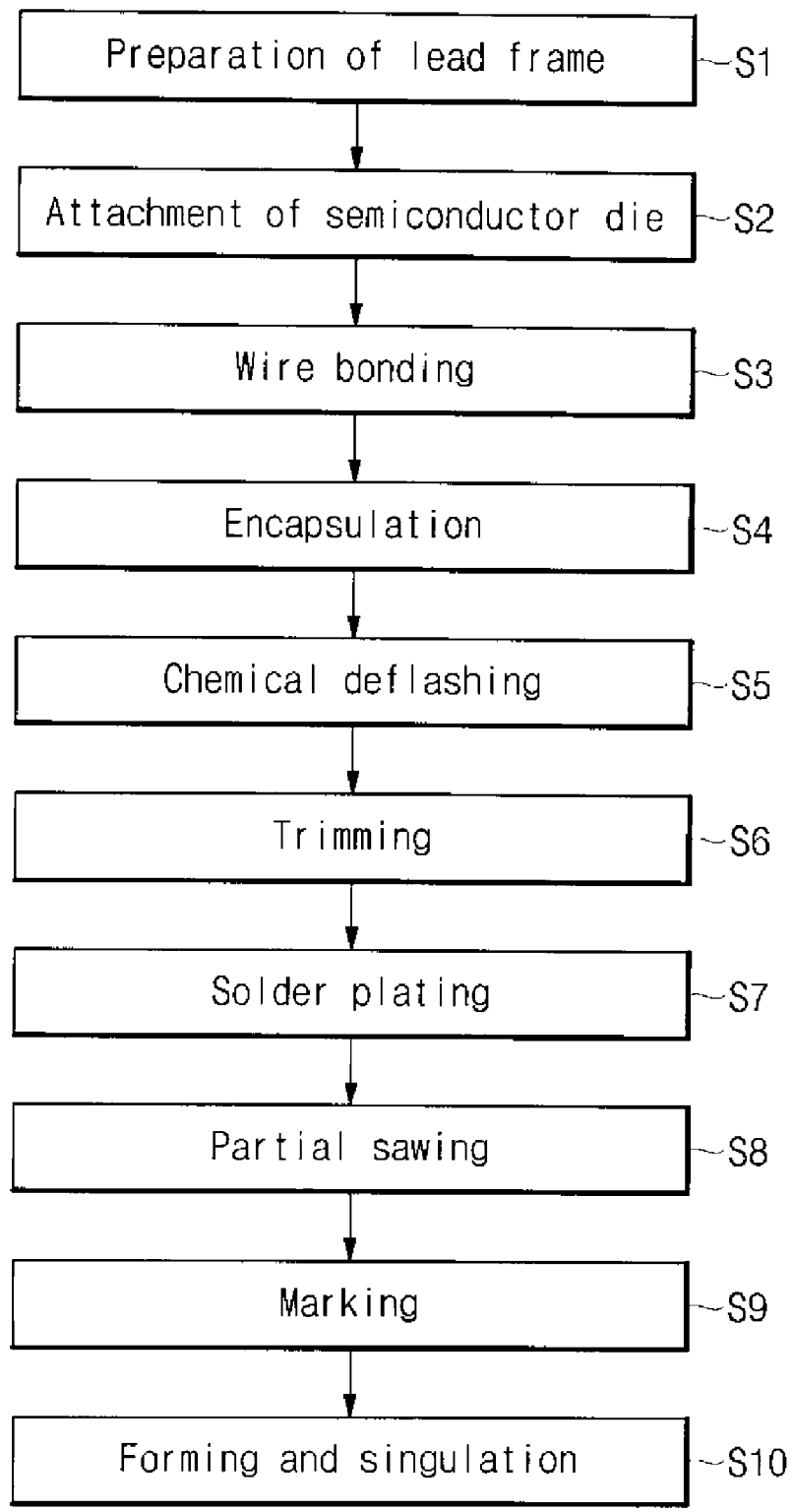
FIG. 19 is a flow chart illustrating an exemplary fabrication method for the semiconductor package shown in FIGS. 18A-18D.

Referring now to FIG. 19, there is provided a flow chart which sets forth an exemplary method for fabricating the semiconductor package 1300 of the present invention. The method comprises the steps of preparing the leadframe (S1), semiconductor die attachment (S2), wire bonding (S3), encapsulation (S4), chemical deflashing (S5), trimming (S6), solder plating (S7), partial sawing (S8), marking (S9), and forming and singulation (S10). FIGS. 20A-20K provide illustrations corresponding to these particular steps, as will be discussed in more detail below.

Figure 20A:
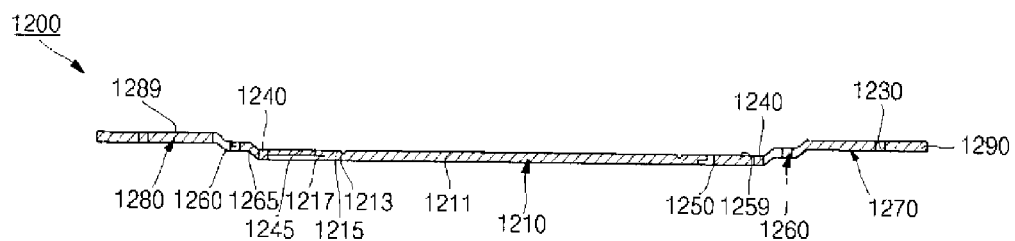
FIGS. 20A-20K are views illustrating an exemplary fabrication method for the semiconductor package shown in FIGS. 18A-18D.
Figure 20B:
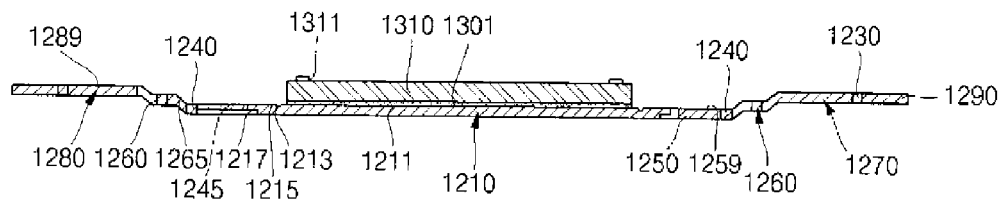

Referring now to FIG. 20A, in the initial step S1 of the fabrication process for the semiconductor package 1300, the leadframe 1200 having the above-described structural attributes is provided. Thereafter, as illustrated in FIG. 20B, step S2 is completed wherein the semiconductor die 1310 having the bond pads 1311 is attached to the die area 1211 on the top surface of the die pad 1210 of the leadframe 1200 through the use of the adhesive layer 1301. The adhesive layer 1301 can be selected from well known liquid epoxy adhesives, adhesive films and adhesive tapes, as well as equivalents thereto.

Figure 20C:
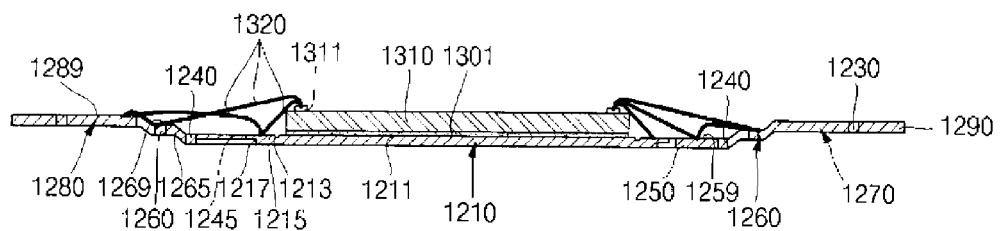
Figure 20D:
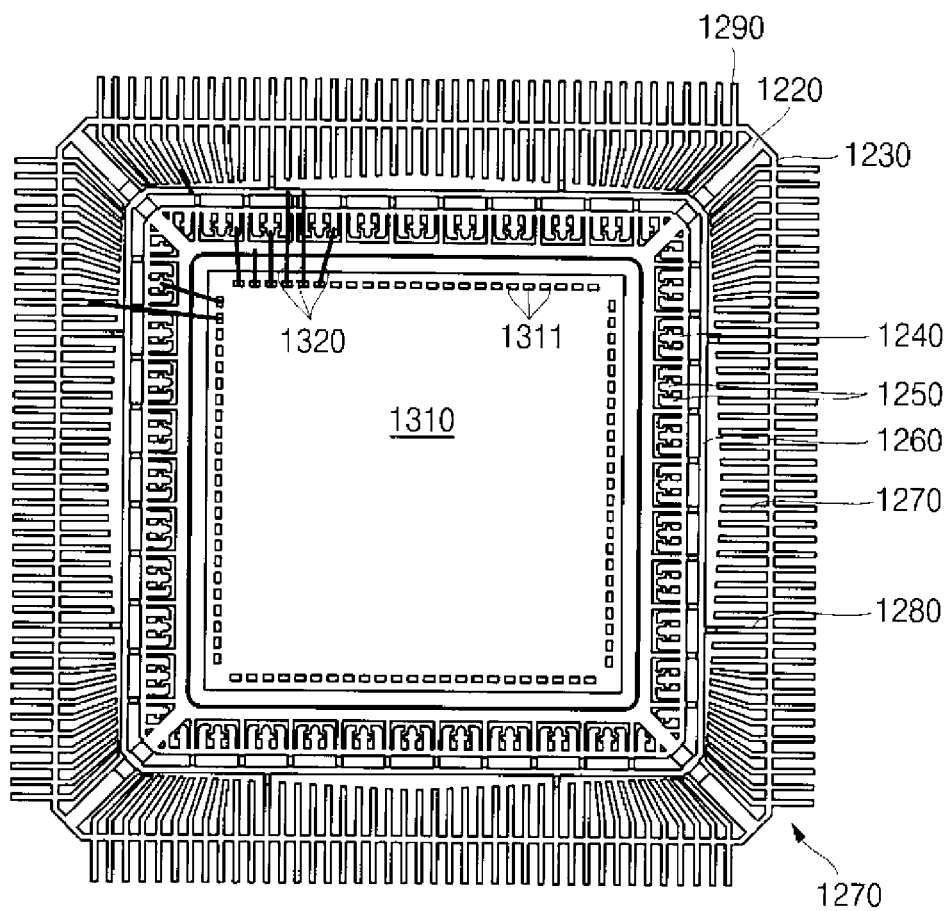

Referring now to FIGS. 20C and 20D, in the next step S3 of the fabrication process, the conductive wires 1320 are used to electrically interconnect the semiconductor die 1310 to the leadframe 1200 in the aforementioned manner. Specifically, the bond pads 1311 of the semiconductor die 1310 are electrically connected to the first and second leads 1250, 1270, and the power bar 1260. One or more conductive wires 1320 is also be used to electrically connect one or more bond pads 1311 of the semiconductor die 1310 directly to the peripheral wire bonding area 1215 of the die pad 1210, allowing for the use of the die pad 1210 as a ground region. In this regard, as also indicated above, the wire bonding area 1215 is be formed on an outer peripheral portion of the top surface of the die pad 110, with the U-shaped or V-shaped groove 1213 being formed between such wire bonding area 1215 and the semiconductor die 1310 so that the adhesive used to facilitate the attachment of the semiconductor die 1310 to the die pad 1210 does not flow into the peripheral wire bonding area 1215.

Figure 20E:
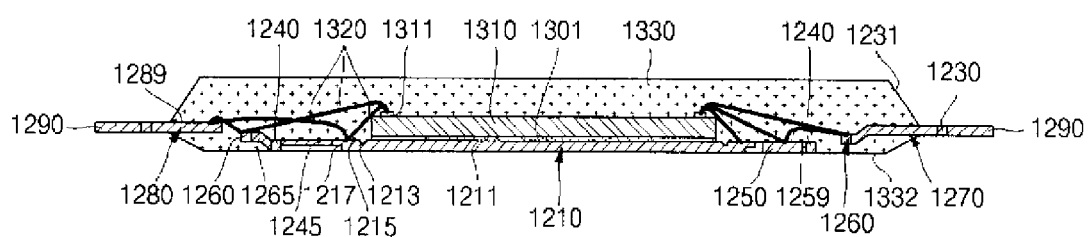
Figure 20F:
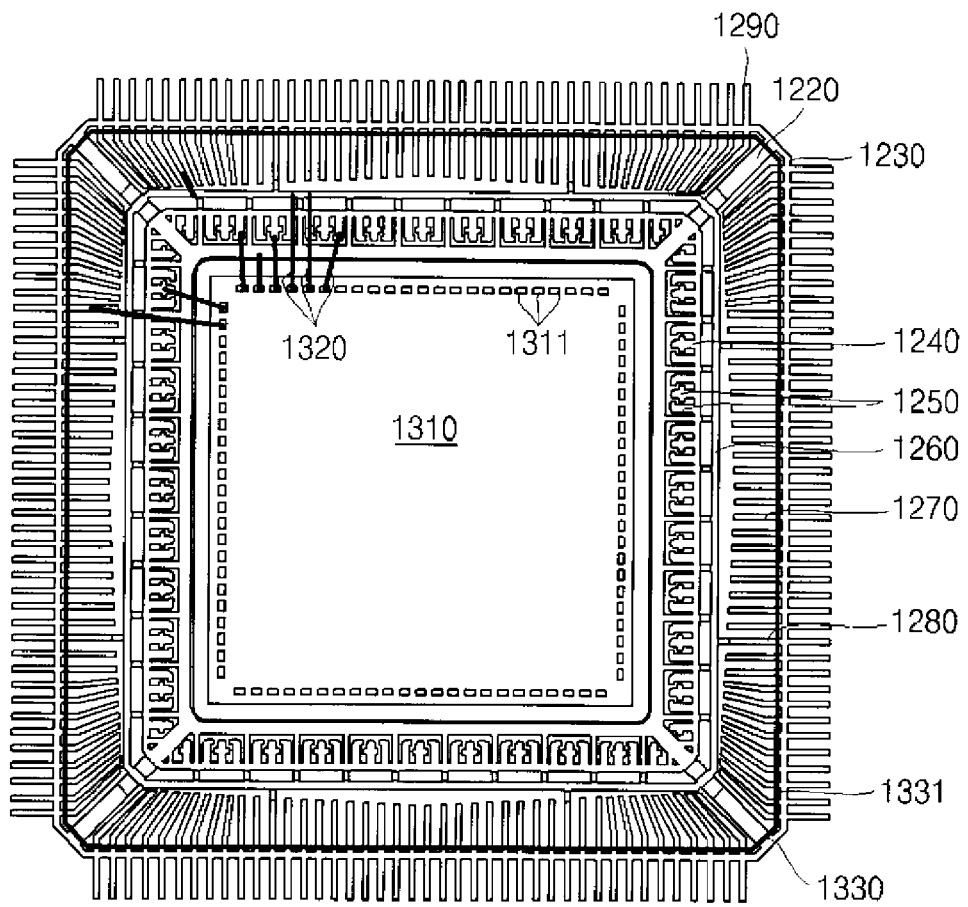

Referring now to FIGS. 20E and 20F, in the next step S4 of the fabrication process for the semiconductor package 1300, portions of the leadframe 1200, the semiconductor die 1310 and the conductive wires 1320 are encapsulated with an encapsulant material which, upon hardening, forms the package body 1330 of the semiconductor package 1300. More particularly, the package body 1330 covers the entirety of the die pad 1210 except for the bottom surface thereof which is circumvented by the half-etched portion 1217. The package body 1330 also covers the entirety of the power bar 1260. The package body 1330 also covers the entirety of each of the first leads 1250 except for the land defined by the bottom surface thereof, as well as the entirety of the inner portion 1280 of each of the second leads 1270 except for a small portion thereof. The entirety of each of the tie bars 1220 is also covered by the package body 1330, except for the bottom surface of the first segment of each tie bar 1220 which extends in generally co-planar relation to the bottom surface of the die pad 1210 and the lands defined by the first leads 1250. The outer portions 1290 of the second leads 1270 of the leadframe 1200 are not covered by the package body 1330. The dambar 1230 is also not covered by the package body 1330 so that it may be removed from the leadframe 1200. Though the land connecting bar 1240 is partially covered by the package body 1330, the bottom surface of the land connecting bar 1240 is exposed in the bottom surface 1332 of the package body 1330 so that the land connecting bar 1240, like the dambar 1230, may be removed from the completed semiconductor package 1300.

Subsequent to the formation of the package body 1330 in step S4, chemical deflashing (step S5) may be performed if films of flash (a resin component of the encapsulant material) are formed on the bottom surface of the die pad 1210 and upon the lands defined by the exposed bottom surfaces of the first leads 1250. If such thin films of flash are present as could impede the ability to mount the semiconductor package 1300 to an underlying substrate, the removal of such flash films by a chemical etching method is required.

Figure 20G:
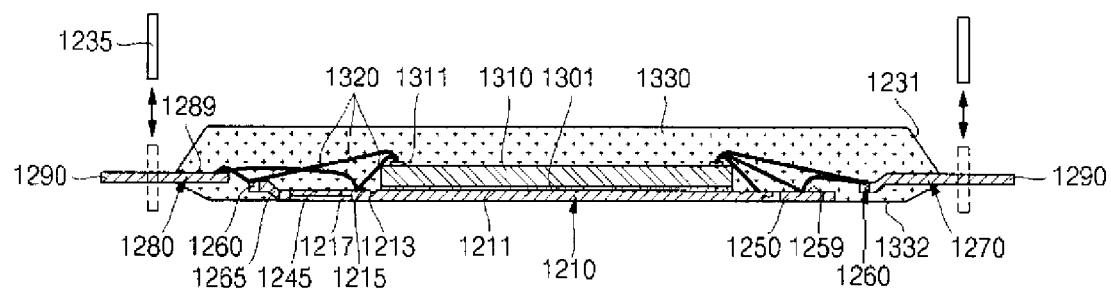
Figure 20H:
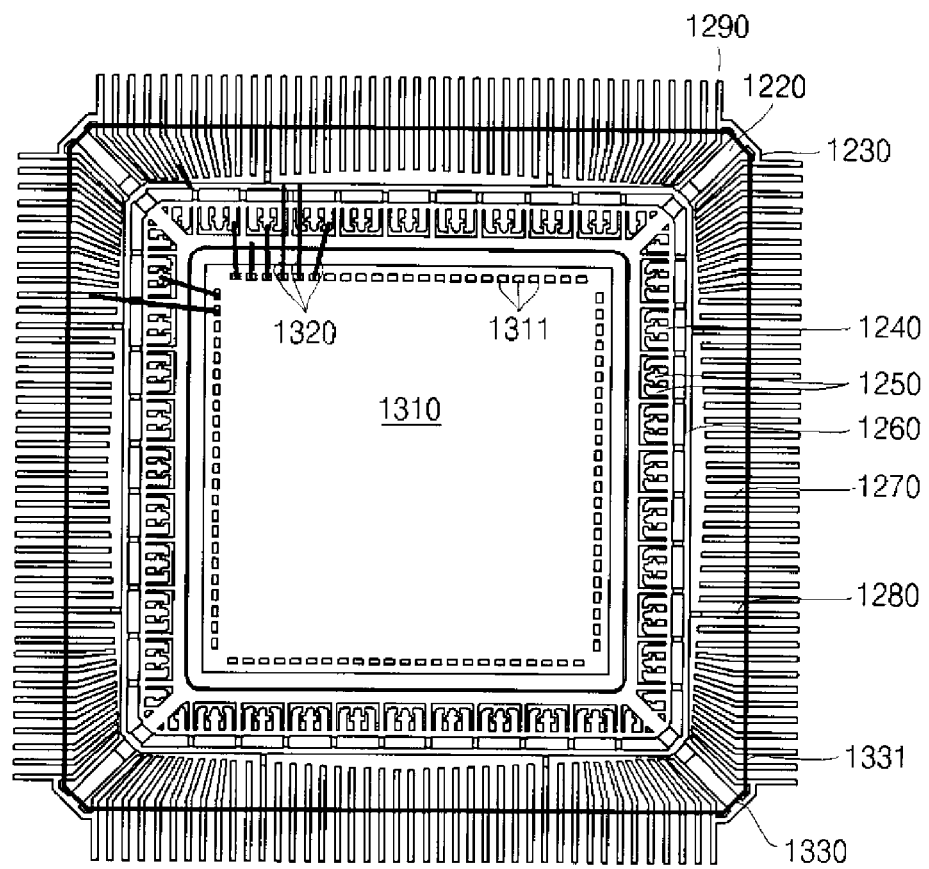

Referring now to FIGS. 20G and 20H, in the next step S6 of the fabrication process for the semiconductor package 1300, the dambar 1230 is trimmed or removed by cutting with a cutting tool 1235 so that the second leads 1270 are electrically isolated from each other and from the power bar 1260 (for those second leads 1270 not including the tie bar portions 1271) in the above described manner. As previously explained, the dambar 1230 is positioned outside of the package body 1330 to allow for the removal thereof from the leadframe 1200, and is removed by cutting the same with the dambar cutting tool 1235. In addition, portions of the tie bars 1220 protruding from the side surfaces 1331 of the package body 1330 are also completely removed during the trimming process.

Upon the completion of step S6, a solder plating step (step S7) may also be performed in the fabrication process for the semiconductor package 1300. More particularly, after the dambar 1230 has been removed using the dambar cutting tool 1235, some metal areas of the leadframe 1200 susceptible to oxidation are exposed to air (e.g., the outer portions 1290 of the second leads 1270 and the lands of the first leads 1250). Since the leadframe 1200 is typically made of copper, the same is susceptible to oxidation. In order to prevent the oxidation of the exposed metal areas of the leadframe 1200, all elements of the leadframe 1200 exposed outside of the package body 1330 may be plated by soldering.

Figure 20I:
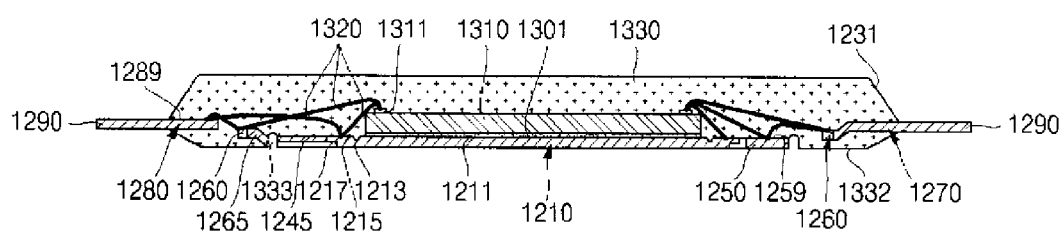
Figure 20J:
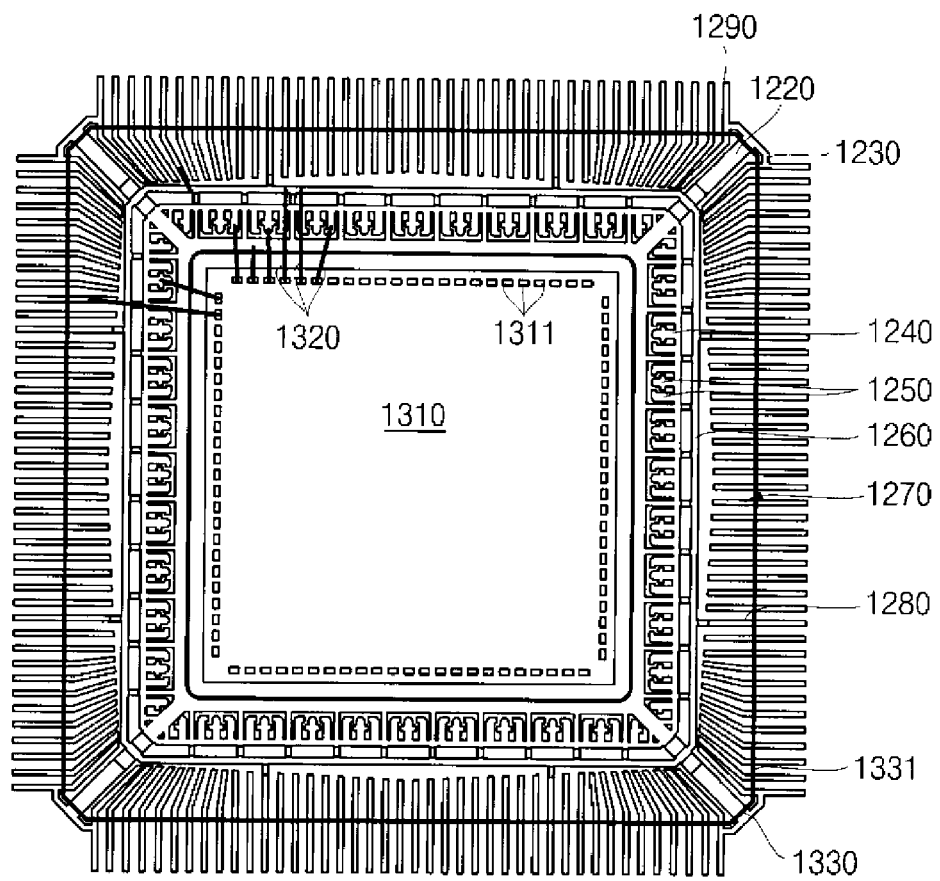

Referring now to FIGS. 20I and 20J, in the next step S8 of the fabrication process for the semiconductor package 1300, the removal of the land connecting bar 1240 is facilitated by sawing with a suitable tool, the grooves 1333 being formed as an artifact of such sawing process. The removal of the land connecting bar 1240 is needed to facilitate the electrical isolation of the first leads 1250 from each other and from the power bar 1260 as described above. The depth of the grooves 1333 slightly exceeds the thickness of the land connecting bar 1240.

Subsequent to the completion of the partial sawing step (step S8), a marking step (step S9) may be performed upon the semiconductor package 1300. More particularly, ink or a laser may be used to mark the product name, the manufacturer of the semiconductor package 1300, etc. on a prescribed surface of the package body 1330.

Figure 20K:
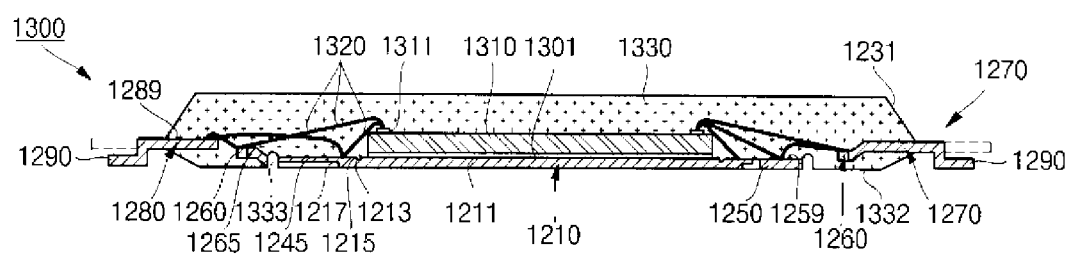

Referring now to FIG. 20K, in the next step S10 of the fabrication process for the semiconductor package 1300, the outer portions 1290 of the second leads 1270 protruding from the package body 1330 are formed in appropriate shapes. Specifically, the exposed outer portions 1290 may be formed into predetermined shapes using a lead forming tool to allow the semiconductor package 1300 to have a shape suitable for mounting to an external unit or an underlying substrate. Although the outer portions 1290 are depicted as being formed outwardly relative to the package body 1330 in FIG. 20K, those of ordinary skill in the art will recognize that the outer portions 1290 can alternatively be formed downwardly and inwardly relative to the package body 1330. Thereafter, portions of the tie bars 1220 protruding outwardly from the package body 630 are cut to separate the semiconductor package 1300 from the leadframe 1200.

Figure 21:
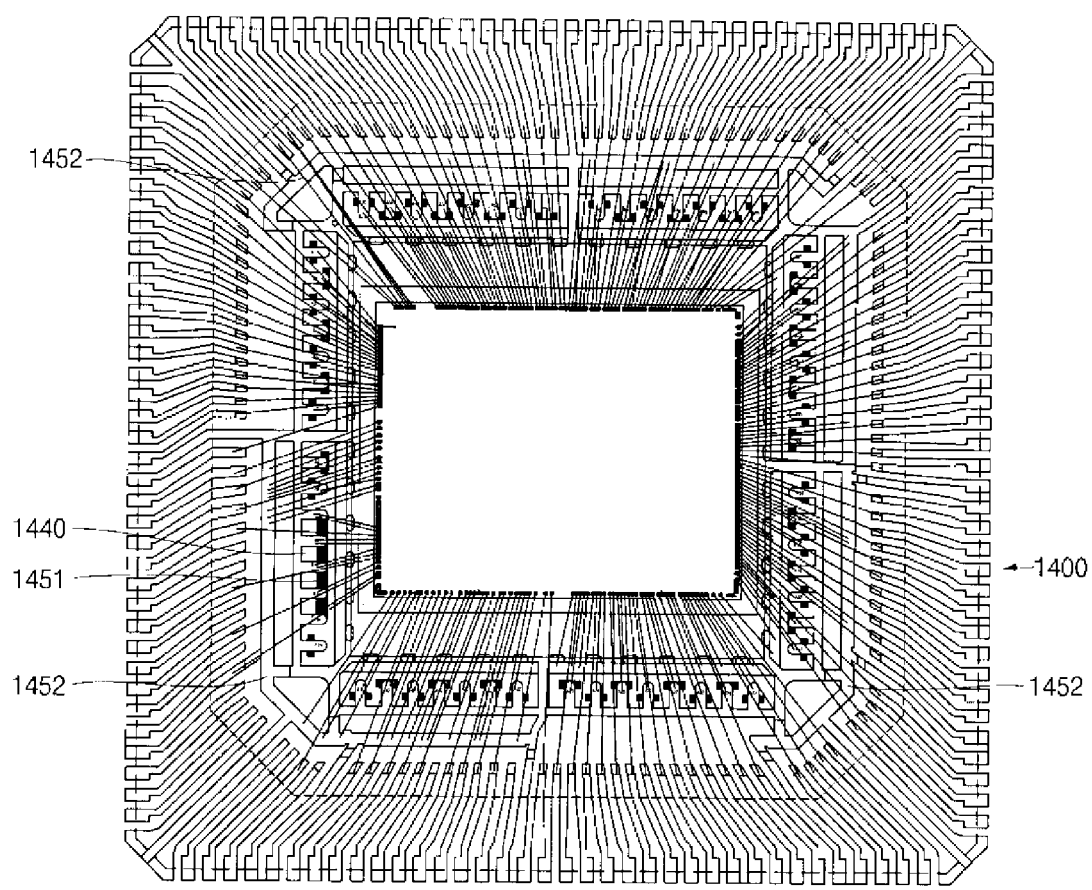
FIG. 21 is a top plan view of an unsingulated leadframe which is integrated into a semiconductor package constructed in accordance with an eighth embodiment of the present invention.

Referring now to FIG. 21, there is depicted a leadframe 1400 for integration into a semiconductor package constructed in accordance with an eighth embodiment of the present invention. The leadframe 1400 bears substantial similarity to the leadframe 1000 described above. Accordingly, only the distinctions between the leadframes 1400, 1000 will be described below.

One of the primary distinctions between the leadframes 1400, 1000 lies in the substitution of the single, ring-like power bar 1052 in the leadframe 1000 with a plurality (e.g., three) separate power bars 1452. Essentially, the three power bars 1452 of the leadframe 1400 mirror the configuration as would result if certain sections or segments of the power bar 1052 extending between adjacent pairs of the tie bars 1060 and second leads 1085 including the tie bar portions 1081 were removed from the power ring 1052.

A further distinction between the leadframes 1400, 1000 lies in the substitution of the eight separate secondary power bars 1051 in the leadframe 1000 with only a single power bar 1451 in the leadframe 1400. As shown in FIG. 21, such power bar 1451 in the leadframe 1400 is not integrally connected solely to the distal ends of only two of the first leads 1440 thereof. Rather, the secondary power bar 1451 is integrally connected to and extends between five of the first leads 440 of one of the four sets thereof included in the leadframe 1400. Those of ordinary skill in the art will recognize that the secondary power bar 1451 may be integrally connected to greater or less than five of the first leads 1440 of any set thereof without departing from the spirit and scope of the present invention. The semiconductor package fabricated to include the leadframe 1400 substantially minors the structural attributes of the semiconductor package 1100 described above and including the leadframe 1000. Additionally, the fabrication method for the semiconductor package including the leadframe 1400 substantially mirrors that implemented in relation to the fabrication of the semiconductor package 1100.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A leadframe for a semiconductor package, comprising:
a generally planar die pad defining multiple peripheral edge segments;
a land connecting bar attached to and at least partially circumventing the die pad;
a dambar attached to and at least partially circumventing the land connecting bar;
a plurality of first leads integrally connected to the land connecting bar and extending inwardly toward the die pad;
a plurality of second leads integrally connected to the dambar, each of the second leads having an inner portion which extends inwardly from the dambar toward the land connecting bar, and an outer portion which extends outwardly from the dambar; and
at least one power bar integrally connected to the land connecting bar and extending between the land connecting bar and the inner portions of at least some of the second leads.

2. The leadframe of claim 1 wherein:
the die pad, the first leads and the connecting bar reside on a first plane;
the power bar resides on a second plane;
the second leads reside on a third plane; and
the first, second and third planes extend in spaced, generally parallel to each other, with the second plane being disposed between the first and third planes.

3. The leadframe of claim 2 wherein:
the die pad has a generally quadrangular configuration;
the first and second leads are segregated into at least four sets which each extend along a respective one of the peripheral edge segments of the die pad; and
a plurality of power bars are integrally connected to the land connecting bar and segregated into at least four sets which each extend along a respective one of the peripheral edge segments of the die pad.

4. The leadframe of claim 3 wherein the power bars are each connected to the land connecting bar by at least one support bar which includes a downset formed therein.

5. The leadframe of claim 4 wherein each of the power bars is integrally connected to at least one of the second leads.

6. The leadframe of claim 5 wherein each of the second leads that is integrally connected to a respective one of the power bars includes a tie bar portion on the inner portion thereof, the tie bar portion being integrally connected to a respective one of the power bars and including a downset formed therein.

7. The leadframe of claim 1 further comprising a plurality a support bars connected to and extending between the die pad and the land connecting bar, each of the support bars being half-etched.

8. A leadframe for a semiconductor package, comprising:
a generally planar die pad defining multiple peripheral edge segments;
a land connecting bar attached to and at least partially circumventing the die pad;
a dambar attached to and at least partially circumventing the land connecting bar;
a plurality of first leads integrally connected to the land connecting bar and extending inwardly toward the die pad;
a plurality of second leads integrally connected to the dambar, each of the second leads having an inner portion which extends inwardly from the dambar toward the land connecting bar, and an outer portion which extends outwardly from the dambar; and
at least one power bar having a first end integrally connected to one of the land connecting bar and one the first leads, and a second end integrally connected to one of the first leads, the power bar extending between the land connecting bar and the die pad.

9. The leadframe of claim 8 wherein:
the die pad has a generally quadrangular configuration;
the first and second leads are segregated into at least four sets which each extend along a respective one of the peripheral edge segments of the die pad; and
a plurality of power bars are included in the leadframe and segregated into at least four sets which each extend along a respective one of the peripheral edge segments of the die pad, the first end of each of the powers bars being integrally connected to one of the land connecting bar and one of the first leads of a corresponding set thereof, with the second end of each of the power bars being integrally connected to one of the first leads of the corresponding set thereof.

10. The leadframe of claim 9 wherein:
the die pad, the first leads, the power bars and the land connecting bar reside on a first plane; and
the second leads reside on a second plane which extends in spaced, generally parallel to the first plane.

11. The leadframe of claim 9 wherein the first end of the power bar is integrally connected to the land connecting bar, and the second end of the power bar is integrally connected to one of the first leads.

12. The leadframe of claim 9 wherein the first end of the power bar is integrally connected to one of the first leads, and the second end of the power bar is integrally connected to one of the first leads.

13. The leadframe of claim 9 further comprising a plurality a support bars connected to and extending between the die pad and the land connecting bar.

14. A leadframe for a semiconductor package, comprising:
a generally planar die pad defining multiple peripheral edge segments;
a plurality of land connecting bars at least partially circumventing the die pad;
a dambar at least partially circumventing the land connecting bars;
a plurality of first leads integrally connected to each of the land connecting bars and extending inwardly toward the die pad;
a plurality of second leads integrally connected to the dambar, each of the second leads having an inner portion which extends inwardly from the dambar toward a respective one of the land connecting bars, and an outer portion which extends outwardly from the dambar; and
at least one primary power bar integrally connected to at least one of the land connecting bars and extending between at least one of the land connecting bars and the inner portions of at least some of the second leads.

15. The leadframe of claim 14 further comprising at least one secondary power bar having a first end integrally connected to one of the first leads, and a second end integrally connected to one of the first leads, the secondary power bar extending between one of the land connecting bars and the die pad.

16. The leadframe of claim 14 further comprising at least one secondary power bar integrally connected to the inner portions of at least some of the second leads, the secondary power bar extending between at least one of the land connecting bars and the inner portions of at least some of the second leads.

17. The leadframe of claim 16 wherein the secondary power bar comprises at least one lead extension portion which extends between an adjacent pair of the inner portions of the second leads.

18. The leadframe of claim 16 wherein the secondary power bar comprises at least a first region which is of a first width, and a second region which is of a second width less than the first width.

19. The leadframe of claim 16 wherein:
the die pad, the first leads and the connecting bars reside on a first plane;
the primary power bar resides on a second plane;
the secondary power bar and the second leads reside on a third plane; and
the first, second and third planes extend in spaced, generally parallel to each other, with the second plane being disposed between the first and third planes.

20. The leadframe of claim 14 wherein:
the die pad has a generally quadrangular configuration;
the first and second leads and the land connecting bars are segregated into at least four sets which each extend along a respective one of the peripheral edge segments of the die pad; and
a plurality of primary power bars are included in the leadframe and each extend along at least one of the land connecting bars.

21. The leadframe of claim 20 further comprising at least one secondary power bar integrally connected to at least two of the first leads, the secondary power bar extending between one of the land connecting bars and the die pad.

* * * * *